US009465298B2

(12) United States Patent
Tsubaki et al.

(10) Patent No.: US 9,465,298 B2
(45) **Date of Patent: *Oct. 11, 2016**

(54) PATTERN FORMING METHOD, RESIST COMPOSITION FOR MULTIPLE DEVELOPMENT USED IN THE PATTERN FORMING METHOD, DEVELOPER FOR NEGATIVE DEVELOPMENT USED IN THE PATTERN FORMING METHOD, AND RINSING SOLUTION FOR NEGATIVE DEVELOPMENT USED IN THE PATTERN FORMING METHOD

(71) Applicant: FUJIFILM Corporation, Minato-ku, Tokyo (JP)

(72) Inventors: Hideaki Tsubaki, Shizuoka (JP); Shinichi Kanna, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/973,097

(22) Filed: Dec. 17, 2015

(65) Prior Publication Data

US 2016/0103395 A1 Apr. 14, 2016

Related U.S. Application Data

(63) Continuation of application No. 14/549,164, filed on Nov. 20, 2014, now Pat. No. 9,291,904, which is a continuation of application No. 13/588,762, filed on Aug. 17, 2012, now Pat. No. 8,951,718, which is a continuation of application No. 13/285,782, filed on Oct. 31, 2011, now abandoned, which is a continuation of application No. 11/964,454, filed on Dec. 26, 2007, now Pat. No. 8,227,183.

(30) Foreign Application Priority Data

| | | |
|---|---|---|
| Dec. 25, 2006 | (JP) | 2006-347560 |
| Apr. 11, 2007 | (JP) | 2007-103901 |
| Apr. 26, 2007 | (JP) | 2007-117158 |
| Dec. 18, 2007 | (JP) | 2007-325915 |

(51) Int. Cl.

| | |
|---|---|
| ***G03F 7/32*** | (2006.01) |
| ***G03F 7/30*** | (2006.01) |
| ***G03F 7/20*** | (2006.01) |
| *G03F 7/039* | (2006.01) |
| *G03F 7/40* | (2006.01) |

(52) U.S. Cl.

CPC ............... *G03F 7/30* (2013.01); *G03F 7/0392* (2013.01); *G03F 7/0397* (2013.01); *G03F 7/2002* (2013.01); *G03F 7/2024* (2013.01); *G03F 7/325* (2013.01); *G03F 7/039* (2013.01); *G03F 7/32* (2013.01); *G03F 7/40* (2013.01); *Y10T 428/24802* (2015.01)

(58) Field of Classification Search

CPC ................................. G03F 7/32; G03F 7/325

USPC ................................................ 430/434, 435

See application file for complete search history.

(56) References Cited

U.S. PATENT DOCUMENTS

| | | | |
|---|---|---|---|
| 4,099,062 | A | 7/1978 | Kitcher |
| 4,212,935 | A | 7/1980 | Canavello et al. |
| 4,267,258 | A | 5/1981 | Yoneda et al. |
| 4,318,976 | A | 3/1982 | Shu et al. |
| 4,491,628 | A | 1/1985 | Ito et al. |
| 4,690,887 | A | 9/1987 | Fukuda et al. |
| 4,743,529 | A | 5/1988 | Farid et al. |
| 4,777,119 | A | 10/1988 | Brault et al. |
| 5,061,607 | A | 10/1991 | Walls |
| 5,250,375 | A | 10/1993 | Sebald et al. |
| 5,268,260 | A | 12/1993 | Bantu et al. |
| 5,326,840 | A | 7/1994 | Przybilla et al. |
| 5,470,693 | A | 11/1995 | Sachdev et al. |
| 5,474,872 | A | 12/1995 | Tomo et al. |
| 5,550,008 | A | 8/1996 | Tomo et al. |
| 5,580,694 | A | 12/1996 | Allen et al. |
| 5,738,975 | A | 4/1998 | Nakano et al. |
| 5,858,620 | A | 1/1999 | Ishibashi et al. |
| 5,866,304 | A | 2/1999 | Nakano et al. |
| 5,994,025 | A | 11/1999 | Iwasa et al. |
| 6,030,541 | A | 2/2000 | Adkisson et al. |
| 6,147,394 | A | 11/2000 | Bruce et al. |

(Continued)

FOREIGN PATENT DOCUMENTS

| | | | |
|---|---|---|---|
| EP | 0 102 450 | A2 | 3/1984 |
| EP | 0 519 297 | A2 | 12/1992 |

(Continued)

OTHER PUBLICATIONS

Machine translation of KR 10-2006-0051532, published on May 19, 2006.*

(Continued)

*Primary Examiner* — Anca Eoff

(74) *Attorney, Agent, or Firm* — Sughrue Mion, PLLC

(57) ABSTRACT

A pattern forming method, including: (A) coating a substrate with a positive resist composition of which solubility in a positive developer increases and solubility in a negative developer decreases upon irradiation with actinic rays or radiation, so as to form a resist film; (B) exposing the resist film; and (D) developing the resist film with a negative developer; a positive resist composition for multiple development used in the method; a developer for use in the method; and a rinsing solution for negative development used in the method.

8 Claims, 6 Drawing Sheets

(56) References Cited

U.S. PATENT DOCUMENTS 6,221,568 B1 4/2001 Angelopoulos et al.
6,337,175 B1 1/2002 Yamaguchi
6,338,934 B1 1/2002 Chen et al.
6,406,829 B1 6/2002 Tachikawa et al.
6,509,134 B2 1/2003 Ito et al.
6,555,607 B1 4/2003 Kanda et al.
6,579,657 B1 6/2003 Ishibashi et al.
6,593,058 B1 7/2003 Feiring et al.
6,660,459 B2 12/2003 Babcock
6,723,486 B2 4/2004 Goodall et al.
6,800,423 B2 10/2004 Yokoyama et al.
6,872,503 B2 3/2005 Wheland et al.
6,878,502 B2 4/2005 Mizutani et al.
6,998,358 B2 2/2006 French et al.
7,016,754 B2 3/2006 Poolla et al.
7,032,209 B2 4/2006 Kobayashi
7,129,199 B2 10/2006 Zhang et al.
7,348,127 B2 3/2008 Hinsber, III
7,354,693 B2 4/2008 Hatakeyama et al.
7,371,510 B2 5/2008 Hirayama et al.
7,396,482 B2 7/2008 Brandl
7,399,577 B2 7/2008 Yamato et al.
7,445,883 B2 11/2008 Baba-Ali et al.
7,455,952 B2 11/2008 Hatakeyama et al.
7,608,386 B2 10/2009 Nozaki et al.
7,670,750 B2 3/2010 Harada et al.
7,678,537 B2 3/2010 Allen et al.
7,700,260 B2 4/2010 Kanna et al.
7,771,914 B2 8/2010 Hatakeyama et al.
7,851,140 B2 12/2010 Tsubaki
7,985,534 B2 7/2011 Tsubaki
7,998,655 B2 8/2011 Tsubaki
8,017,298 B2 9/2011 Tsubaki
8,017,304 B2 9/2011 Tarutani et al.
8,034,547 B2 10/2011 Tsubaki et al.
8,071,272 B2 12/2011 Tsubaki
8,088,557 B2 1/2012 Tsubaki
8,227,183 B2 7/2012 Tsubaki et al.
8,241,840 B2 8/2012 Tsubaki et al.
8,530,148 B2 9/2013 Tsubaki et al.
8,546,063 B2 * 10/2013 Tsubaki et al. ............... 430/296
8,632,942 B2 * 1/2014 Tsubaki ..................... 430/270.1
8,642,253 B2 2/2014 Tsubaki
8,822,129 B2 * 9/2014 Iwato et al. ............... 430/270.1
9,128,376 B2 * 9/2015 Kato et al.
9,170,489 B2 * 10/2015 Takizawa et al.
9,213,237 B2 * 12/2015 Ito et al.
2002/0045122 A1 4/2002 Iwasa et al.
2002/0132184 A1 9/2002 Babcock
2003/0022095 A1 1/2003 Kai et al.
2003/0054286 A1 3/2003 Sato et al.
2003/0073027 A1 4/2003 Namiki et al.
2003/0091936 A1 5/2003 Rottstegge et al.
2003/0143483 A1 7/2003 Takechi
2003/0198894 A1 10/2003 Mizutani et al.
2004/0023150 A1 2/2004 Feiring et al.
2004/0023152 A1 2/2004 Feiring et al.
2004/0096780 A1 5/2004 Nozaki et al.
2004/0106063 A1 6/2004 Hatakeyama et al.
2004/0137736 A1 7/2004 Daviot et al.
2004/0229157 A1 11/2004 Rhodes et al.
2004/0242798 A1 12/2004 Sounik et al.
2005/0058931 A1 3/2005 Cao et al.
2005/0095532 A1 5/2005 Kodama et al.
2005/0186506 A1 8/2005 Sasaki et al.
2005/0203262 A1 9/2005 Feiring et al.
2005/0224923 A1 10/2005 Daley et al.
2006/0008736 A1 1/2006 Kanda et al.
2006/0040203 A1 2/2006 Kodama et al.
2006/0073420 A1 4/2006 Nozaki et al.
2006/0105267 A1 5/2006 Khojasteh et al.
2006/0147836 A1 7/2006 Hatakeyama et al.
2006/0189138 A1 8/2006 Nishimura et al.
2006/0204890 A1 9/2006 Kodama
2006/0210919 A1 9/2006 Mizutani et al.
2006/0216635 A1 9/2006 Hirano et al.
2006/0257781 A1 11/2006 Benoit et al.
2006/0275697 A1 12/2006 Hata et al.
2007/0003878 A1 1/2007 Paxton et al.
2007/0054217 A1 3/2007 Kodama et al.
2007/0081782 A1 4/2007 Maeda et al.
2007/0087288 A1 4/2007 Nishiyama et al.
2007/0105045 A1 5/2007 Iwato et al.
2007/0190449 A1 8/2007 Momose et al.
2007/0254237 A1 11/2007 Allen et al.
2008/0063984 A1 3/2008 Zhang et al.
2008/0113300 A2 5/2008 Choi et al.
2008/0131820 A1 6/2008 Van Steenwinckel et al.
2008/0187860 A1 8/2008 Tsubaki et al.
2008/0261150 A1 10/2008 Tsubaki et al.
2008/0311530 A1 12/2008 Allen et al.
2008/0318171 A1 12/2008 Tsubaki
2009/0011366 A1 1/2009 Tsubaki et al.
2009/0042147 A1 2/2009 Tsubaki
2009/0183390 A1 7/2009 Miller et al.
2010/0040971 A1 2/2010 Tarutani et al.
2010/0040972 A1 2/2010 Tarutani et al.
2010/0167201 A1 7/2010 Tsubaki
2010/0190106 A1 7/2010 Tsubaki
2010/0239984 A1 9/2010 Tsubaki
2010/0323305 A1 12/2010 Tsubaki et al.
2010/0330507 A1 12/2010 Tsubaki et al.
2011/0020755 A1 1/2011 Tsubaki et al.
2011/0045413 A1 2/2011 Tsubaki
2011/0229832 A1 9/2011 Kamimura et al.
2011/0250543 A1 10/2011 Tsubaki
2011/0300485 A1 12/2011 Tsubaki et al.
2011/0305992 A1 12/2011 Tarutani et al.
2011/0311914 A1 12/2011 Kamimura et al.
2012/0088194 A1 4/2012 Tsubaki
2012/0135355 A1 5/2012 Tsubaki
2012/0315449 A1 12/2012 Tsubaki et al.
2014/0087310 A1 * 3/2014 Kato et al. ................. 430/283.1
2014/0212811 A1 * 7/2014 Inoue et al. ............... 430/285.1
2015/0086912 A1 * 3/2015 Kawabata et al. .............. 430/18
2015/0118628 A1 * 4/2015 Kawabata et al. ............ 430/325
2015/0132687 A1 * 5/2015 Hirano et al. .................. 430/18
2015/0140484 A1 * 5/2015 Takizawa et al. .............. 430/18
2015/0147688 A1 * 5/2015 Yokokawa et al. ............. 430/18
2015/0147699 A1 * 5/2015 Kamimura et al. ....... 430/285.1
2015/0168834 A1 * 6/2015 Takizawa et al.
2015/0185610 A1 * 7/2015 Hirano et al.
2015/0185612 A1 * 7/2015 Kawabata et al.

FOREIGN PATENT DOCUMENTS

EP 1 338 921 A2 8/2003
EP 1 500 977 A1 1/2005
EP 1 612 604 A2 1/2006
EP 1 720 072 A1 11/2006
EP 1 764 652 A2 3/2007
EP 1 980 911 A2 10/2008
EP 2 138 898 A1 12/2009
JP 57-153433 A 9/1982
JP 59-045439 A 3/1984
JP 02-161436 A 6/1990
JP 04-039665 A 2/1992
JP 05-241348 A 9/1993
JP 05-265212 A 10/1993
JP 635195 A 2/1994
JP 06-138666 A 5/1994
JP 06-194847 A 7/1994
JP 07-049568 A 2/1995
JP 07-181677 A 7/1995
JP 7-199467 A 8/1995
JP 7-220990 A 8/1995
JP 7-261392 A 10/1995
JP 9-244247 A 9/1997
JP 2715881 B2 11/1997
JP 10-073927 A 3/1998
JP 1149806 A 2/1999
JP 11-145036 A 5/1999
JP 2000-199953 A 7/2000
JP 2000-315647 A 11/2000

(56) References Cited

FOREIGN PATENT DOCUMENTS

| | | | |
|---|---|---|---|
| JP | 2000-321789 | A | 11/2000 |
| JP | 2001-019860 | A | 1/2001 |
| JP | 2001-109154 | A | 4/2001 |
| JP | 2001-215731 | A | 8/2001 |
| JP | 2002-525683 | A | 8/2002 |
| JP | 2002-260991 | A | 9/2002 |
| JP | 2003-076019 | A | 3/2003 |
| JP | 2003-122024 | A | 4/2003 |
| JP | 2003-195502 | A | 7/2003 |
| JP | 2003-249437 | A | 9/2003 |
| JP | 2003-270789 | A | 9/2003 |
| JP | 2004-004557 | A | 1/2004 |
| JP | 2004-061668 | A | 2/2004 |
| JP | 2004-514952 | A | 5/2004 |
| JP | 2004-527113 | A | 9/2004 |
| JP | 2004-310082 | A | 11/2004 |
| JP | 2004-347985 | A | 12/2004 |
| JP | 2005-109146 | A | 4/2005 |
| JP | 2005-266801 | A | 9/2005 |
| JP | 2005-533907 | A | 11/2005 |
| JP | 2006-503972 | A | 2/2006 |
| JP | 2006072326 | A | 3/2006 |
| JP | 2006-156422 | A | 6/2006 |
| JP | 2006-227174 | A | 8/2006 |
| JP | 2006-518779 | A | 8/2006 |
| JP | 10-2006-0102515 | A | 9/2006 |
| JP | 2006-259136 | A | 9/2006 |
| JP | 2006-276688 | A | 10/2006 |
| JP | 2006276444 | A | 10/2006 |
| JP | 2006-303504 | A | 11/2006 |
| JP | 2006-309245 | A | 11/2006 |
| JP | 2006-336017 | A | 12/2006 |
| JP | 2007-025240 | A | 2/2007 |
| JP | 2007-065024 | A | 3/2007 |
| JP | 2007-071978 | A | 3/2007 |
| JP | 2007-108581 | A | 4/2007 |
| JP | 2007-140188 | A | 6/2007 |
| JP | 2007-156450 | A | 6/2007 |
| JP | 2008-522206 | A | 6/2008 |
| JP | 2008-292975 | A | 12/2008 |
| JP | 2008-310314 | A | 12/2008 |
| KR | 10-0138126 | A | 6/1998 |
| KR | 100270352 | B1 | 3/2001 |
| KR | 20040104934 | A | 12/2004 |
| KR | 10-2005-0121888 | A | 12/2005 |
| KR | 10-2006-0051532 | A | 5/2006 |
| KR | 1020080059516 | A | 6/2008 |
| TW | 583511 | B | 4/2004 |
| WO | 99-14635 | A1 | 3/1999 |
| WO | 00/17712 | A1 | 3/2000 |
| WO | 02/44845 | A2 | 6/2002 |
| WO | 2004/037962 | A2 | 5/2004 |
| WO | 2004/068242 | A1 | 8/2004 |
| WO | 2004/074937 | A1 | 9/2004 |
| WO | 2004/076495 | A2 | 9/2004 |
| WO | 2004/077158 | A1 | 9/2004 |
| WO | 2005/019937 | A1 | 3/2005 |
| WO | 2005/043239 | A1 | 5/2005 |
| WO | 2006/056905 | A2 | 6/2006 |
| WO | 2007/037213 | A1 | 4/2007 |
| WO | 2008129964 | A1 | 10/2008 |
| WO | 2008140119 | A1 | 11/2008 |

OTHER PUBLICATIONS

Non-Final Office Action issued in U.S. Appl. No. 12/145,151, dated Mar. 26, 2010.
Non-Final Office Action issued in U.S. Appl. No. 12/145,151, dated Jul. 6, 2009.
Notification of Reasons for Refusal in Japanese Application No. 2007-325915, dated Mar. 30, 2010.
Extended European Search Report in European Application No. 08007245.7, dated May 28, 2009.
Submission of Publication dated Jun. 11, 2010, in Japanese Application No. 2007-325915.
Correspondence Record prepared Jul. 13, 2010, in Japanese Application No. 2007-325915.
European Search Report dated Sep. 20, 2010 issued in EP Application No. 07025004.8.
M. Maenhoudt, et al.; "Double Patterning scheme for sub-0.25 k1 single damascene structures at Na=0.75, λ=193nm"; Optical Microlithography XVIII; SPIE vol. 5754; pp. 1508-1518.
Steven R. J. Brueck, et al.; "Extension of 193-nm immersion optical lithography to the 22-nm half-pitch node"; Optical Microlithography VXII, SPIE vol. 5377; pp. 1315-1322.
Sungkoo Lee, et al.; "Double exposure technology using silicon containing materials"; Advances in Resist Technology and Processing XXII, SPIE col. 6153; pp. 61531K-1 to 61531 K-7.
Non-Final Office Action issued in U.S. Appl. No. 12/145,270; dated Nov. 2, 2010.
International Search Report dated Apr. 13, 2007.
Shinji Tarutani, et al.; "Development of Materials and Processes for Double Patterning toward 32 nm Node ArF Immersion Lithography"; Journal of Photopolymer Science and Tech; 2008, vol. 21 No. 5; pp. 685-690.
Office Action dated Nov. 30, 2010 in U.S. Appl. No. 12/578,520.
Written Opinion (PCT/ISA/237) issued for PCT/JP2008/060800, dated Jul. 22, 2008.
International Search Report (PCT/ISA/210) issued for PCT/JP2008/060800, dated Jul. 22, 2008.
Office Action in Korean Application No. 10-2008-0055449, dated Dec. 18, 2010.
Notification of Reasons for Refusal dated Jul. 13, 2010, in Japanese Application No. 2007-155323.
Office Action dated Nov. 16, 2010, issued in Taiwanese Application No. 097121644.
Office Action issued in U.S. Appl. No. 12/895,516, dated Feb. 25, 2011.
Written Opinion (PCT/ISA/237) issued for PCT/JP2008/058976, dated Jun. 17, 2008.
B.J. Lin, "Semiconductor Foundry, Lithography, and Partners", Emerging Lithographic of SPIE, 2002, pp. 11-24, vol. 4688, SPIE.
English Translation of JP 2000-199953.
Karen E. Petrillo, et al.; "Effect of photo acid generator concentration on the process latitude of a chemically amplified resist"; American Vacuum Society; Journal of Vacuum Science Technology B; vol. 12 No. 6; Nov./Dec. 1994; pp. 3863-3867.
Notification of Reason for Refusal dated Jul. 13, 2010, issued in Japanese Application No. 2007-155322.
Extended European Search Report issued in EP Application No. 08010596.6, dated Apr. 27, 2009.
Office Action in U.S. Appl. No. 12/137,371; dated Sep. 2, 2010.
Office Action in U.S. Appl. No. 12/959,147 on Feb. 3, 2011.
Office Action issued Oct. 28, 2010, in U.S. Appl. No. 12/600,038.
Office Action in Japanese Application No. 2008-128797, dated Apr. 6, 2010.
"Microdevices", Apr. 2004, pp. 76-87, Nikkei Microdevices.
David Van Steenwinckel, et al.; "Resist effects at small pitches"; American Vacuum Society, Journal Vacuum Science Technology B vol. 24 No. 1; Jan./Feb. 2006; pp. 316-320.
Office Action in European Application No. 08007245.7, dated Dec. 21, 2010.
Office Action in European Application No. 08010600.8, dated Dec. 17, 2010.
Office Action in European Application No. 08010596.8, dated Dec. 17, 2010.
J. A. Hoffnagle et al., "Liquid Immersion Deep-Ultraviolet Interferometric Lithography", J. Vac. Sci. Tehcnol. B, Nov./Dec. 1999, pp. 3306-3309, vol. 17, American Vacuum Society.
Extended European Search Report dated Jan. 14, 2011 in EP Application No. 07025004.8.
Extended European Search Report issued in EP Application No. 08010600.8, dated Apr. 27, 2009.
Written Opinion (PCT/ISA/237) issued in PCT/JP2008/057187 on May 20, 2008.
Office Action in U.S. Appl. No. 12/137,232; dated Sep. 3, 2010.

(56) References Cited

OTHER PUBLICATIONS

International Search Report (PCT/ISA /210) for PCT/JP2008/058976, dated Jun. 17, 2008.
Office Action in Korean Application No. 10-2008-0055461, dated Dec. 3, 2010.
Office Action U.S. Appl. No. 12/145,270 on May 3, 2011.
Office Action, dated Jul. 26, 2011, in Japanese Application No. 2007-197838.
Extended European Search Report, dated Jan. 6, 2012, issued by the European Patent Office in European Application No. 11186306.4.
Extended European Search Report, dated Jan. 9, 2012, issued by the European Patent Office in European Application No. 11186305.6.
Office Action dated Feb. 20, 2012 issued by the European Patent Office in European Patent Application No. 07025004.8.
Office Action issued Jan. 23, 2012 in U.S. Appl. No. 12/145,270.
Advisory Action dated Apr. 6, 2012 in U.S. Appl. No. 12/145,270.
Office Action dated Aug. 14, 2012 in Japanese Application No. 2010-123584.
Office Action dated Aug. 23, 2012 in U.S. Appl. No. 12/145,270.
Office Action dated Aug. 24, 2012 in U.S. Appl. No. 12/871,969.
Office Action dated Dec. 13, 2010 in U.S. Appl. No. 11/964,454.
Extended European Search Report, dated Oct. 26, 2012, issued in European Patent Application No. 12183679.5.
Office Action, dated Oct. 1, 2012, issued by the European Patent Office in European Patent Application No. 11186305.6.
Office Action, dated Sep. 4, 2012, issued by the Japanese Patent Office in Japanese Patent Application No. 2010-123583.
Office Action dated Dec. 25, 2012 issued by the Japanese Patent Office in Japanese Application No. 2010-123583.
Office Action dated Dec. 26, 2012 issued by the Korean Intellectual Property Office in Korean Application No. 10-2010-0079004.
Machine Translation of the reference with registration No. KR 10-0270352 and the publication No. KR 2000-0019945, published on Apr. 15, 2000.
Office Action dated Feb. 16, 2012 issued in U.S. Appl. No. 12/871,969.
Office Action dated Mar. 5, 2013, issued by the European Patent Office in European Application No. 11 186 305.6.
Communication (Third Party Information) dated Mar. 15, 2013 issued by the Japanese Patent Office in Japanese Application No. 2010-123583.
Notification for the Opinion of Examination, dated May 21, 2013, submitted by Taiwanese Patent Office in Taiwanese Application No. 099135204.
Communication dated Jul. 19, 2013 from the Korean Intellectual Property Office in Korean Application No. 10-2010-0079004.
Office Action dated Oct. 9, 2013, issued by the Intellectual Property Office of Taiwan in Taiwanese Application No. 100139552.
Office Action dated Oct. 22, 2013, issued by the Japan Patent Office in Japanese Application No. 2012-243033.
Extended European Search Report dated Oct. 15, 2013, issued by the European Patent Office in European Application No. 13170835.6.
Extended European Search Report dated Oct. 21, 2013, issued by the European Patent Office in European Application No. 13170833.1.
Office Action dated Nov. 29, 2013, issued by the Korean Intellectual Property Office in Korean Application No. 10-2011-0111912.
Office Action dated Nov. 29, 2013, issued by the Korean Intellectual Property Office in Korean Application No. 10-2012-0149583.
Taiwanese Decision of Examination dated Feb. 20, 2014 issued in Taiwanese Application No. 099135204.
Office Action, dated Apr. 15, 2014, issued by the Japanese Patent Office in Japanese Patent Application No. 2013-032157.
Office Action dated May 15, 2014, issued by the Taiwanese Patent Office in Taiwanese Application No. 101147423.
Office Action dated Jun. 23, 2014 issued by the Korean Intellectual Property Office in Korean Patent Application No. 10-2012-0149583.
Office Action dated Sep. 13, 2010 in U.S. Appl. No. 11/964,454.
Office Action dated Jun. 20, 2011 in U.S. Appl. No. 11/964,454.
Office Action dated Sep. 22, 2011 in U.S. Appl. No. 12/825,088.
Office Action dated Sep. 26, 2011 in U.S. Appl. No. 12/145,270.
International Search Report (PCT/SA/210) issued May 20, 2008 in PCT/JP2008/057187.
Office Action dated Apr. 21, 2014 in Korean Patent Application No. 10-2014-0023962.
Office Action dated Jul. 18, 2014 issued by the Taiwanese Intellectual Property Office in Taiwanese Patent Application No. 100139552.
Machine translation of JP 07-261392, published on Oct. 13, 1995.
Notice of Final Rejection dated Nov. 28, 2014 issued by the Korean Intellectual Property Office in Korean Patent Application No. 10-2014-0023962.
Notice of Final Rejection dated Dec. 3, 2014 issued by the Korean Intellectual Property Office in Korean Patent Application No. 10-2012-0149583.
Office Action issued Feb. 13, 2015, by the Taiwanese Patent Office in corresponding Taiwanese Application No. 101147423.
Merriam Webster's Collegiate Dictionary, Tenth Edition, 1997, p. 1104.
Communication issued on May 24, 2015 by the Korean Intellectual Property Office in Korean Application No. 10-2015-0038787.
Office Action issued Aug. 25, 2015, issued by the Japanese Patent Office in Japanese Patent Application No. 2014-240467.
Office Action dated Sep. 9, 2015 issued by the European Patent Office in European Patent Application No. 13 170 835.6.
Office Action issued Jan. 19, 2016, issued by the Japanese Patent Office in corresponding Japanese Patent Application No. 2014-240467.
Yamaoka, T. "Handbook of Resist Materials for Semiconductor Integrated Circuit," Jul. 31, 1996, p. 209 and 2016 (13 pgs. total with translation).
Korean Office Action issued by the Korean Intellectual Property Office in Application No. 10-2016-0061409 issued Aug. 11, 2016.

* cited by examiner

PATTERN FORMING METHOD, RESIST COMPOSITION FOR MULTIPLE DEVELOPMENT USED IN THE PATTERN FORMING METHOD, DEVELOPER FOR NEGATIVE DEVELOPMENT USED IN THE PATTERN FORMING METHOD, AND RINSING SOLUTION FOR NEGATIVE DEVELOPMENT USED IN THE PATTERN FORMING METHOD

This is a continuation of U.S. application Ser. No. 14/549,164, filed Nov. 20, 2014, which is a continuation of U.S. application Ser. No. 13/588,762, filed Aug. 17, 2012 (now U.S. Pat. No. 8,951,718), which is a continuation of U.S. application Ser. No. 13/285,782, filed Oct. 31, 2011 (now abandoned), which is a continuation of U.S. application Ser. No. 11/964,454, filed Dec. 26, 2007 (now U.S. Pat. No. 8,227,183), which claims priority from JP 2006-347560, filed Dec. 25, 2006, JP 2007-103901 filed Apr. 11, 2007, JP 2007-117158, filed Apr. 26, 2007 and JP 2007-325915, filed Dec. 18, 2007, the contents of all of which are hereby incorporated by reference in their entirety.

BACKGROUND OF THE INVENTION

1. Field of the Invention

The present invention relates to a pattern forming method for use in the process of producing a semiconductor such as IC, in the production of a circuit board for liquid crystal, thermal head and the like, and in the lithography process of other photo applications; a positive resist composition for multiple development used in the pattern forming method; a developer for negative development used in the pattern forming method; and a rinsing solution for negative development used in the pattern forming method. More specifically, the present invention relates to a pattern forming method suitable for exposure with an ArF exposure apparatus using a light source that emits far ultraviolet light at a wavelength of 300 nm or less or with an immersion-type projection exposure apparatus; a positive resist composition for multiple development used in the pattern forming method; a developer for negative development used in the pattern forming method; and a rinsing solution for negative development used in the pattern forming method.

2. Description of the Related Art

Since the advent of a resist for KrF excimer laser (248 nm), an image forming method called chemical amplification is used as a resist image forming method so as to compensate for sensitivity reduction incurred from light absorption. For example, the image forming method by positive chemical amplification is an image forming method of decomposing an acid generator in the exposed area by exposure to generate an acid, converting an alkali-insoluble group into an alkali-soluble group by using the generated acid as a reaction catalyst in the post-exposure baking (PEB), and removing the exposed area by alkali development.

Along with the finer fabrication of a semiconductor device, there is becoming shorter the wavelength of the exposure light source and higher the numerical aperture (high NA) of the projection lens, and an exposure machine using an ArF excimer laser having a wavelength of 193 nm as a light source has been so far developed. As commonly well known, these features can be expressed by the following formulae:

$$(\text{Resolving power})=k_1\cdot(\lambda/\text{NA})$$

$$(\text{Focal depth})=\pm k_2\cdot\lambda/\text{NA}^2$$

wherein λ is the wavelength of the exposure light source, NA is the numerical aperture of the projection lens, and $k_1$ and $k_2$ are coefficients related to the process.

A so-called immersion method of filling a high refractive-index liquid (hereinafter sometimes referred to as an "immersion liquid") between the projection lens and the sample has been conventionally advocated as a technique of increasing the resolving power.

As for the "effect of immersion", assuming that $NA_0=\sin\theta$, the above-described resolving power and focal depth in the immersion can be expressed by the following formulae:

$$(\text{Resolving power})=k_1\cdot(\lambda_0/n)\text{NA}_0$$

$$(\text{Focal depth})=\pm k_2\cdot(\lambda_0/n)/\text{NA}_0^2$$

wherein $\lambda_0$ is the wavelength of exposure light in air, n is the refractive index of the immersion liquid based on air, and θ is the convergence half-angle of beam.

That is, the effect of immersion is equal to use of an exposure wavelength of 1/n. In other words, in the case of a projection optical system with the same NA, the focal depth can be made n times larger by the immersion. This is effective for all pattern profiles and can be combined with a super-resolution technique under study at present, such as phase-shift method and modified illumination method.

A double exposure technology or a double patterning technology is being advocated as a technique for more enhancing the resolving power. This is to make small $k_1$ in the above-described formula of resolving power and is positioned as a resolving power-increasing technique.

In conventional pattern formation of an electronic device such as semiconductor device, a mask or reticle pattern in a size of 4 to 5 times larger than the pattern intended to form is reduced and transferred on an exposure target such as wafer by using a reduction projection exposure apparatus.

With the progress to finer dimension, the conventional exposure system comes to encounter a problem that lights irradiated on adjacent patterns interfere each other to decrease the optical contrast. Therefore, in these techniques, a process of dividing the exposure mask design into two or more parts and synthesizing an image by independently exposing these masks is being employed. In these double exposure systems, it is necessary to divide the exposure mask design and again synthesize an image of the design on an exposure target (wafer), and division of the mask design needs to be devised so that the pattern on the reticle can be faithfully reproduced on the exposure target.

Studies of applying the effect of these double exposure systems to the transfer of a fine image pattern of a semiconductor device are introduced, for example, in JP-A-2006-156422 (the term "JP-A" as used herein means an "unexamined published Japanese patent application").

Also, the recent progress of double exposure technology is reported in SPIE Proc 5754, 1508 (2005), SPIE Proc 5377, 1315 (2004), SPIE Proc 61531K-1 (2006) and the like.

However, in these double exposure systems, the pattern formation needs to be performed in the vicinity of resolution limit of the resist and therefore, if the pattern formation is performed by merely applying the conventional resist composition to the conventional resist process, there arises a problem that sufficient exposure margin or focal depth cannot be obtained.

In other words, when the pattern forming process of coating a positive resist composition on a substrate and subjecting the resist film to exposure and development with an alkali developer described, for example, in JP-A-2001-109154 or the pattern forming process of coating a negative resist composition on a substrate and subjecting the resist film to exposure and development with an alkali developer described, for example, in JP-A-2003-76019 is applied to a double exposure process, a sufficiently high resolving performance cannot be obtained.

As regards the developer for g-line, I-line, KrF, ArF, EB or EUV lithography, an aqueous alkali developer of 2.38 mass % TMAH (tetramethylammonium hydroxide) is being used at present as a positive resist developer and a negative resist developer.

Other than the above-described developer, for example, JP-A-2001-215731 describes a positive resist developer containing an aliphatic linear ether-based solvent or aromatic ether-based solvent and a ketone-based solvent having a carbon number of 5 or more, which is used for developing a resist material containing a copolymer of a styrene-based monomer and an acryl-based monomer. Also, JP-A-2006-227174 describes a positive resist developer having at least two or more acetic acid groups, ketone groups, ether groups or phenyl groups and having a molecular weight of 150 or more, which is used for a resist material capable of dissolving in a solvent as a result of reduction in the molecular weight due to breakage of the polymer chain upon irradiation with radiation. JP-A-6-194847 describes a negative photoresist developer, where an aromatic compound having a carbon number of 6 to 12 or a mixed solvent containing 50 mass % or more of an aromatic compound having a carbon number of 6 to 12 is used as the developer for developing a negative photoresist mainly comprising a photosensitive polyhydroxy ether resin obtained by the reaction of a polyhydroxy ether resin and a diglycidyl(meth)acrylate.

Furthermore, JP-T-2002-525683 (the term "JP-T" as used herein means a "published Japanese translation of a PCT patent application") describes a positive resist developer for developing a resist composition containing a specific fluorine-containing resin, where the positive resist developer contains an organic solvent, particularly, a halogenated organic solvent, and JP-T-2006-518779 describes a negative resist developer for developing a negative photoresist composition containing a specific polycyclic olefin polymer, where the negative resist developer contains one or more solvents selected from the group consisting of propylene glycol methyl ether acetate, cyclohexanone, butyrolactate and ethyl lactate.

JP-A-2000-199953 discloses a method to improve the resolution double with an ordinary positive resist.

However, the above-described combinations of a resist compositions and a developer merely provide a system of performing pattern formation by combining a specific resist composition with either a positive developer or a negative developer.

That is, as shown in FIG. 1, in the case of a positive system (a combination of a resist composition and a positive developer), a material system of performing pattern formation by selectively dissolving and removing the region having a strong light irradiation intensity out of the optical aerial image (light intensity distribution) is merely provided. On the other hand, as for the combination of a negative system (a resist composition and a negative developer), a material system of performing pattern formation by selectively dissolving and removing the region having a weak light irradiation intensity is merely provided.

SUMMARY OF THE INVENTION

An object of the present invention is to solve those problems and provide a method for stably forming a high-precision fine pattern to produce a highly integrated electronic device with high precision.

The present invention has the following constructions, and the object of the present invention has been attained by these constructions.

(1) A pattern forming method, comprising:

(A) coating a substrate with a positive resist composition of which solubility in a positive developer increases and solubility in a negative developer decreases upon irradiation with actinic rays or radiation, so as to form a resist film;

(B) exposing the resist film; and (D) developing the resist film with a negative developer.

(2) The pattern forming method as described in (1) above, which further comprises:

(C) developing the resist film with a positive developer.

(3) A pattern forming method, comprising in the following order: (

A) coating a substrate with a positive resist composition of which solubility in a positive developer increases and solubility in a negative developer decreases upon irradiation with actinic rays or radiation, so as to form a resist film;

(B) exposing the resist film;

(D) developing the resist film with a negative developer; and (C) developing the resist film with a positive developer.

(4) The pattern forming method as described in any of (1) to (3) above, which further comprises:

(E) heating (baking, also called PEB (post exposure bake)) the resist film after (B) exposing the resist film.

(5) The pattern forming method as described in any of (1) to (4) above, comprising:

(B) exposing the resist film a plurality of times.

(6) The pattern forming method as described in (4) or (5) above, comprising:

(E) heating (baking, also called PEB (post exposure bake)) the resist film a plurality of times.

(7) A pattern forming method, comprising in the following order:

(A) coating a substrate with a positive resist composition for multiple development of which solubility in a positive developer increases and solubility in a negative developer decreases upon irradiation with actinic rays or radiation, so as to form a resist film;

(B-1) exposing the resist film;

(E-1) heating (baking, also called PEB (post exposure bake)) the resist film;

(C) developing the resist film with a positive developer, so as to form a patterned resist film;

(B-2) exposing the patterned resist film;

(E-2) heating (baking, also called PEB (post exposure bake)) the patterned resist film; and (D) developing the patterned resist film with a negative developer.

(8) A pattern forming method, comprising in the following order:

(A) coating a substrate with a positive resist composition for multiple development of which solubility in a positive developer increases and solubility in a negative developer decreases upon irradiation with actinic rays or radiation, so as to form a resist film;

(B-1) exposing the resist film;

(E-1) heating (baking, also called PEB (post exposure bake)) the resist film;

(D) developing the resist film with a negative developer, so as to form a patterned resist film;

(B-2) exposing the patterned resist film;

(E-2) heating (baking, also called PEB (post exposure bake)) the patterned resist film; and (C) developing the patterned resist film with a positive developer.

(9) The pattern forming method as described in (7) or (8) above, wherein the positive resist composition for multiple development comprises a resin having an alicyclic hydrocarbon structure and being capable of increasing solubility in an alkali developer and decreasing solubility in an organic solvent under an action of an acid.

(10) The pattern forming method as described in any of (1) to (9) above, wherein (D) developing the resist film with a negative developer is performing development with a developer containing at least one kind of a solvent selected from the group consisting of a ketone-based solvent, an ester-based solvent, an alcohol-based solvent, an amide-based solvent and an ether-based solvent.

(11) The pattern forming method as described in any of (1) to (10) above, wherein (D) developing the resist film with a negative developer is performing development with a developer containing a solvent represented by formula (1):

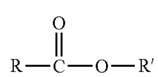

(1)

wherein R and R' each independently represents a hydrogen atom, an alkyl group, a cycloalkyl group, an alkoxyl group, an alkoxycarbonyl group, a carboxyl group, a hydroxyl group, a cyano group or a halogen atom, and R and R may combine with each other to form a ring.

(12) The pattern forming method as described in any of (1) to (11) above, wherein (D) developing the resist film with a negative developer is performing development with a developer containing a solvent represented by formula (2):

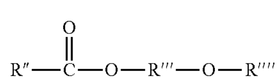

(2)

wherein R" and R"" each independently represents a hydrogen atom, an alkyl group, a cycloalkyl group, an alkoxyl group, an alkoxycarbonyl group, a carboxyl group, a hydroxyl group, a cyano group or a halogen atom, and R" and R"" may combine with each other to form a ring; and R"' represents an alkylene group or a cycloalkylene group.

(13) The pattern forming method as described in any of (1) to (11) above, wherein (D) developing the resist film with a negative developer is performing development with a developer containing butyl acetate.

(14) The pattern forming method as described in any of (2) to (13) above, wherein (C) developing the resist film with a positive developer is selectively dissolving and removing a film, an exposure dose of which is not less than a threshold value (a), and (D) developing the resist film with a negative developer is selectively dissolving and removing a film, an exposure dose of which is not more than a threshold value (b).

(15) The pattern forming method as described in any of (1) to (14) above, which further comprises:

(F) washing the resist with a rinsing solution containing an organic solvent after (D) developing the resist film with a negative developer.

(16) A positive resist composition for multiple development, comprising:

(a) a resin capable of increasing solubility in an alkali developer and decreasing solubility in an organic solvent by decomposition of a side chain;

(b) a photoacid generator; and (c) a solvent.

(17) A developer for negative development, which is used for a positive resist composition, the developer comprising:

at least one kind of a solvent selected from the group consisting of a ketone-based solvent, an ester-based solvent, an alcohol-based solvent, an amide-based solvent and an ether-based solvent.

(18) A rinsing solution for negative development, which is used for a positive resist composition, the rinsing solution comprising:

at least one kind of an organic solvent selected from the group consisting of a hydrocarbon-based solvent, a ketone-based solvent, an ester-based solvent, an alcohol-based solvent, an amide-based solvent and an ether-based solvent.

Preferred embodiments of the present invention are further set forth below.

(19) The pattern forming method as described in (14) above, wherein the threshold value (a)>the threshold value (h).

(20) The pattern forming method as described in (7) or (8) above, wherein an exposure dose (Eo1 [mJ/cm$^2$]) in (B-1) exposing the resist film and an exposure dose (Eo2 [mJ/cm$^2$]) in (B-2) exposing the patterned resist film satisfy the following formula:

$$Eo1 < Eo2 - 5.$$

(21) The pattern forming method as described in (15) above, wherein the rinsing solution contains at least one kind of an organic solvent selected from the group consisting of a hydrocarbon-based solvent, a ketone-based solvent, an ester-based solvent, an alcohol-based solvent, an amide-based solvent and an ether-based solvent.

(22) The pattern forming method as described in any of (1) to (15) and (19) to (21) above, wherein the positive resist composition comprises:

(A) a resin of which solubility in an alkali developer increases under an action of an acid;

(B) a compound capable of generating an acid upon irradiation with actinic rays or radiation; and (C) a solvent.

(23) The pattern forming method as described in (22) above, wherein the resin of the component (A) of the positive resist composition has an alicyclic hydrocarbon structure.

(24) The pattern forming method as described in (22) or (23) above, wherein the resin of the component (A) of the positive composition has a weight average molecular weight of 1,000 to 100,000.

(25) The pattern forming method as described in any of (22) to (24) above, wherein the resin of the component (A) of the positive resist composition is a (meth)acrylic resin having a lactone structure.

(26) The pattern forming method as described in any of (22) to (25) above, wherein the positive resist composition further comprises a basic compound.

(27) The pattern forming method as described in any of (22) to (26) above, wherein the positive resist composition further comprises at least one of a fluorine-containing surfactant and a silicon-containing surfactant.

(28) The pattern forming method as described in any of (22) to (27) above, wherein the positive resist composition further comprises a resin having at least one of a fluorine atom and a silicon atom.

(29) The pattern forming method as described in (15) or (21) above, wherein the rinsing solution containing an organic solvent contains at least one kind of an organic solvent selected from the group consisting of a hydrocarbon-based solvent, a ketone-based solvent, an ester-based solvent, an alcohol-based solvent and an amide-based solvent.

(30) The pattern forming method as described in (15), (21) or (29) above, wherein the rinsing solution containing an organic solvent contains at least one kind of an organic solvent selected from the group consisting of an alcohol-based solvent and an ester-based solvent.

(31) The pattern forming method as described in any of (15), (21), (29) and (30) above, wherein the rinsing solution containing an organic solvent contains a monohydric alcohol having a carbon number of 1 to 8.

(32) A pattern forming method, comprising in the following order:

(A) coating a substrate with a positive resist composition for multiple development of which solubility in a positive developer increases and solubility in a negative developer decreases upon irradiation with actinic rays or radiation, so as to form a resist film;

(B-1) exposing the resist film;

(E-1) heating (baking, also called PEB (post exposure bake)) the resist film;

(C) developing the resist film with a positive developer, so as to form a patterned resist film;

(B-2) exposing the patterned resist film;

(E-2) heating (baking, also called PEB (post exposure bake)) the patterned resist film;

(D) developing the patterned resist film with a negative developer; and (F) washing the patterned resist film with a rinsing solution containing an organic solvent.

(33) A pattern forming method, comprising in the following order:

(A) coating a substrate with a positive resist composition for multiple development of which solubility in a positive developer increases and solubility in a negative developer decreases upon irradiation with actinic rays or radiation, so as to form a resist film;

(B-1) exposing the resist film;

(E-1) heating (baking, also called PEB (post exposure bake)) the resist film;

(D) developing the resist film with a negative developer;

(F) washing the resist film with a rinsing solution containing an organic solvent, so as to form a patterned resist film;

(B-2) exposing the patterned resist film;

(E-2) heating (baking, also called PEB (post exposure bake)) the patterned resist film; and (C) developing the patterned resist film with a positive developer.

(34) The pattern forming method as described in any of (1) to (15) and (19) to (33) above, wherein the exposure is performed using a wavelength of 200 nm or less.

(35) The pattern forming method as described in any of (1) to (15) and (19) to (34) above, wherein the exposure is performed at a wavelength of 193 nm.

(36) The pattern forming method as described in any of (1) to (5) and (19) to (35) above, wherein immersion exposure is performed at a wavelength of 193 nm.

(37) The pattern forming method as described in any of (2) to (15) and (19) to (36) above, wherein developing the resist film with a positive developer is performing development with an alkali developer.

(38) The pattern forming method as described in (7) or (8) above, wherein a temperature in (E-1) heating (baking, also called PEB (post exposure bake)) the resist film is higher than a temperature in (E-2) heating (baking, also called PEB (post exposure bake)) the patterned resist film.

(39) The positive resist composition as described in (16) above, wherein the resin of the component (a) is a resin having an alicyclic hydrocarbon structure.

(40) The positive resist composition as described in (16) or (39) above, wherein the resin of the component (a) is at least one of an acrylic resin and a methacrylic resin each having an alicyclic hydrocarbon structure.

(41) The positive resist composition for multiple development as described in any of (16), (39) and (40) above, wherein the resin of the component (a) has a weight average molecular weight of from 1,000 to 100,000.

(42) The positive resist composition for multiple development as described in any of (16) and (39) to (41) above, wherein the resin of the component (a) is a (meth)acrylic resin having a lactone structure.

(43) The positive resist composition for multiple development as described in any of (16) and (39) to (42) above, which further comprises a basic compound.

(44) The positive resist composition for multiple development as described in any of (16) and (39) to (43) above, which further comprises at least one of a fluorine-containing surfactant and a silicon-containing surfactant.

(45) The positive resist composition for multiple development as described in any of (16) and (39) to (44) above, which further comprises a resin having at least one of a fluorine atom and a silicon atom.

(46) The developer as described in (17) above, which comprises a solvent represented by formula (1):

(1)

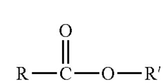

wherein R and R' each independently represents a hydrogen atom, an alkyl group, a cycloalkyl group, an alkoxyl group, an alkoxycarbonyl group, a carboxyl group, a hydroxyl group, a cyano group or a halogen atom, and R and R' may combine with each other to form a ring.

(47) The developer as described in (17) or (46) above, which comprises a solvent represented by formula (2):

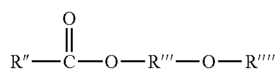

(2)

wherein R" and R"" each independently represents a hydrogen atom, an alkyl group, a cycloalkyl group, an alkoxyl group, an alkoxycarbonyl group, a carboxyl group, a hydroxyl group, a cyano group or a halogen atom, and R" and R"" may combine with each other to form a ring; and R''' represents an alkylene group or a cycloalkylene group.

(48) The developer as described in (17) or (46) above, which comprises butyl acetate.

(49) The developer for negative development as described in any of (17) and (46) to (48) above, which comprises two or more kinds of solvents.

(50) The rinsing solution as described in (18) above, which comprises at least one kind of an organic solvent selected from the group consisting of a hydrocarbon-based solvent, a ketone-based solvent, an ester-based solvent, an alcohol-based solvent and an amide-based solvent.

(51) The rinsing solution as described in (17) or (50) above, which comprises an alcohol-based solvent or an ester-based solvent.

(52) The rinsing solution as described in any of (17), (50) and (51) above, which comprises a monohydric alcohol having a carbon number of 6 to 8.

(53) The rinsing solution for negative development as described in any of (17) and (50) to (52) above, which comprises two or more kinds of solvents.

(54) The rinsing solution for negative development as described in any of (17) and (50) to (53) above, which comprises at least one developer component used in performing negative development.

DETAILED DESCRIPTION OF THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The present invention provides, as a technique for enhancing the resolving power, a new pattern forming method using a combination of a developer (negative developer) capable of selectively dissolving and removing an exposed area not more than a predetermined threshold value (b), and a positive resist composition capable of forming a film of which solubility in a negative developer (preferably an organic developer) decreases upon irradiation with actinic ray or radiation.

The present invention provides, as a technique for enhancing the resolving power, a new pattern forming method using preferably a combination of a developer (positive developer) capable of selectively dissolving and removing an exposed area not less than predetermined threshold value (a), a developer (negative developer) capable of selectively dissolving and removing an exposed area not more than a predetermined threshold value (b), and a positive resist composition capable of forming a film of which solubility in a positive developer (preferably an alkali developer) increases and solubility in a negative developer (preferably an organic developer) decreases upon irradiation with actinic ray or radiation.

Figure 1:
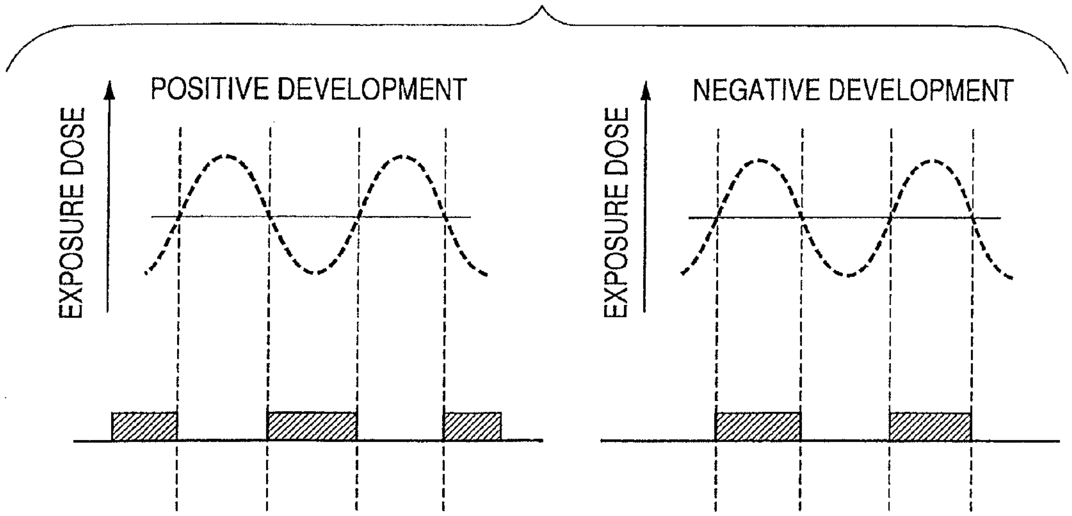
FIG. 1 represents a schematic view showing the relationship among positive development, negative development and exposure dose in a conventional method.
Figure 2:
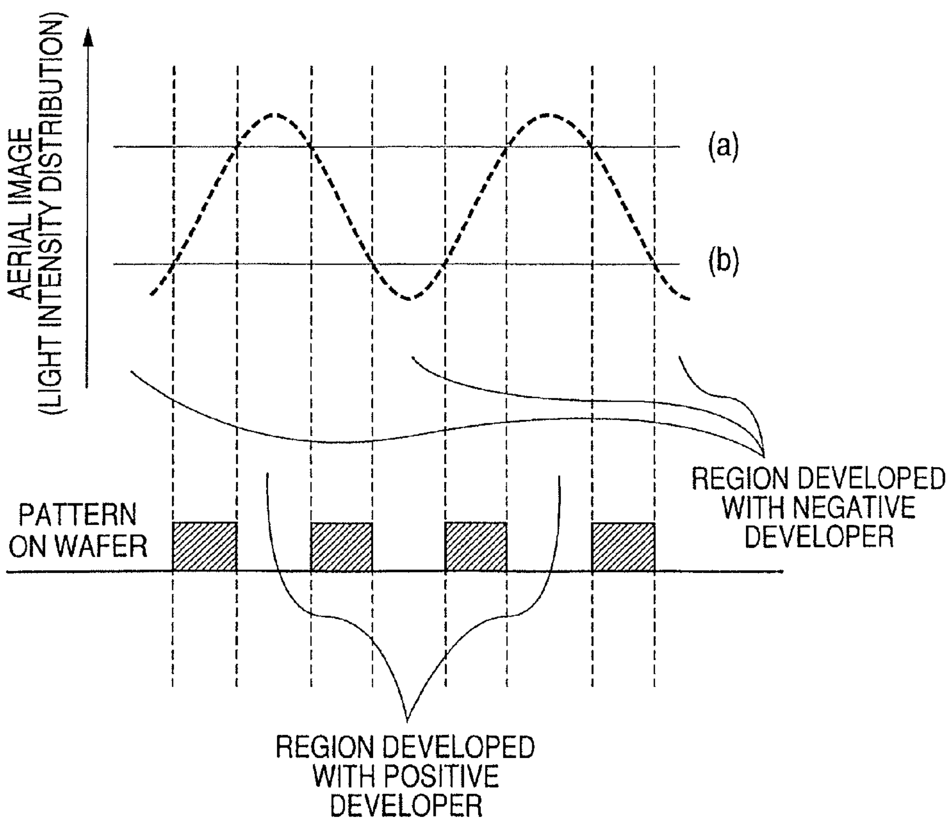
FIG. 2 represents a schematic view showing the relationship among positive development, negative development and exposure dose in the method of the present invention.

That is, as shown in FIG. 2, when a pattern element on an exposure mask is projected on a wafer by light irradiation, the region having a strong light irradiation intensity (exposed area not less than a predetermined threshold value (a)) is dissolved and removed using a positive developer and the region having a weak light irradiation intensity (exposed area not more than a predetermined threshold value (b)) is dissolved and removed using a negative developer, whereby a pattern with resolution as high as 2 times the frequency of the optical aerial image (light intensity distribution) can be obtained. Also, in the method of the present invention, the design of the exposure mask need not he divided.

The pattern forming process necessary for practicing the present invention comprises the following steps:

(A) a step of coating a substrate with a positive resist composition of which solubility in a positive developer increases and solubility in a negative developer decreases upon irradiation with actinic rays or radiation, (B) an exposure step, and (D) a step of developing the resist film with a negative developer.

The pattern forming method of the present invention preferably further comprises (C) a step of developing the resist film with a positive developer.

The pattern forming method of the present invention preferably further comprises (F) a step of washing the resist film with a rinsing solution containing an organic solvent, after the step (D) of developing the resist film with a negative developer.

The pattern forming method of the present invention preferably comprises (E) a heating (baking, also called PEB (post exposure bake)) step, after the exposure step (B).

In the pattern forming method of the present invention, the exposure step (B) may be performed a plurality of times.

In the pattern forming method of the present invention, the heating (baking, also called PEB (post exposure bake)) step (E) may be performed a plurality of times.

In practicing the present invention, (a) a positive resist composition of which solubility in a positive developer increases and solubility in a negative developer decreases upon irradiation with actinic rays or radiation, and (b) a negative developer (preferably an organic developer) are necessary.

In practicing the present invention, (c) a positive developer (preferably an alkali developer) is preferably further used.

In practicing the present invention, (d) a rinsing solution containing an organic solvent is preferably further used.

The pattern forming system includes a positive type and a negative type and although both types utilize a phenomenon that the solubility of the resist film in a developer is varied through a chemical reaction triggered by light irradiation, a resist causing the light-irradiated part to dissolve in a developer is called a positive system, and a resist causing the non-light-irradiated part to dissolve in a developer is called a negative system. The positive resist utilizes a chemical reaction such as polarity conversion for enhancing the solubility in a developer, and the negative resist utilizes bond formation between molecules, such as cross-linking reaction or polymerization reaction.

Since the advent of a resist for KrF excimer lasers (248 nm), an image forming method called chemical amplification is used as an image forming method for a resist so as to compensate for sensitivity reduction caused by light absorption. The image forming method, for example, using positive chemical amplification is an image forming method where an acid generator in the exposed area decomposes upon exposure to generate an acid, the acid generated is used as a reaction catalyst in the baking after exposure (PEB: post exposure bake) to convert the alkali-insoluble group into an alkali-soluble group, and the exposed area is removed by alkali development.

In the present invention, one positive resist composition (a) acts as a positive resist for a positive developer and as a negative resist for a negative developer.

In the present invention, an alkali developer (aqueous) can be used as the positive developer, and an organic developer containing an organic solvent can be used as the negative developer.

Also, the positive resist composition (a) is a "resin composition capable of forming a film of which solubility in an alkali developer increases and solubility in an organic solvent-containing developer decreases as a result of a chemical reaction triggered by exposure to irradiation".

In conventionally employed negative image-forming systems (negative resist+negative developer), a material system utilizing a mechanism of increasing the molecular weight exclusively by the bonding between molecules and decreasing the solubility in a developer has been proposed. However, it has been difficult for the image forming mechanism utilizing a change in the molecular weight to establish a system such that one resist material system acts as a positive resist for one developer and as a negative resist for another developer.

In the present invention, the positive resist composition (a) not only decreases in the solubility in a negative developer as a result of a polarity conversion reaction of the polymer side chain but also brings about both increase in the solubility in an alkali developer and decrease in the solubility in an organic developer particularly by virtue of a specific chemical reaction (a polarity conversion reaction of the polymer side chain).

In the present invention, by the combination of a positive resist composition and a negative developer or the combination of a positive resist composition, a negative developer and a positive developer, a fine pattern can be formed without generating a resist residue.

In another preferred embodiment of the present invention, first development using a negative developer (preferably an organic developer) is performed, and second development using a positive developer (preferably an alkali developer) is then performed, whereby chipping of the resist pattern can be more suppressed. When chipping of the resist pattern is suppressed, failure of the circuit pattern transferred on a substrate can be reduced.

As disclosed, for example, in Macromolecules, Vol. 38, 1882-1898 (2005) and J. Photopolymer Science and Technology, Vol. 12, 545-551 (1999), it is important for obtaining a pattern with good resolution performance to cause smooth penetration of the developer into the resist film in the development step. The reason why chipping of the resist pattern can be suppressed by performing, in the development step, first development using a negative developer and then performing second development using a positive developer is not clearly known, but the combination of the positive resist composition, the positive developer and the negative developer of the present invention is considered to play an important role. More specifically, it is considered that when development is performed twice by using a negative developer and a positive developer and these two development processes are performed in the above-described order, the developer (positive developer) in the second development step more smoothly penetrates into the resist film, as a result, the uniformity of development is enhanced and a pattern can be formed without causing chipping of the resist pattern.

In the present invention, the matter of importance is to control the "threshold value" of exposure dose (in the light irradiation region, the exposure dose with which the film is solubilized or insolubilized in the developer). The "threshold value" is the minimum exposure dose to make the film soluble in a positive developer and the minimum exposure dose to make the film insoluble in a negative developer at the pattern formation for obtaining a desired line width.

The "threshold value" can be determined as follows.

That is, the "threshold value" is the minimum exposure dose to make the film soluble in a positive developer and the minimum exposure dose to make the film insoluble in a negative developer at the pattern formation for obtaining a desired line width.

Figure 3:
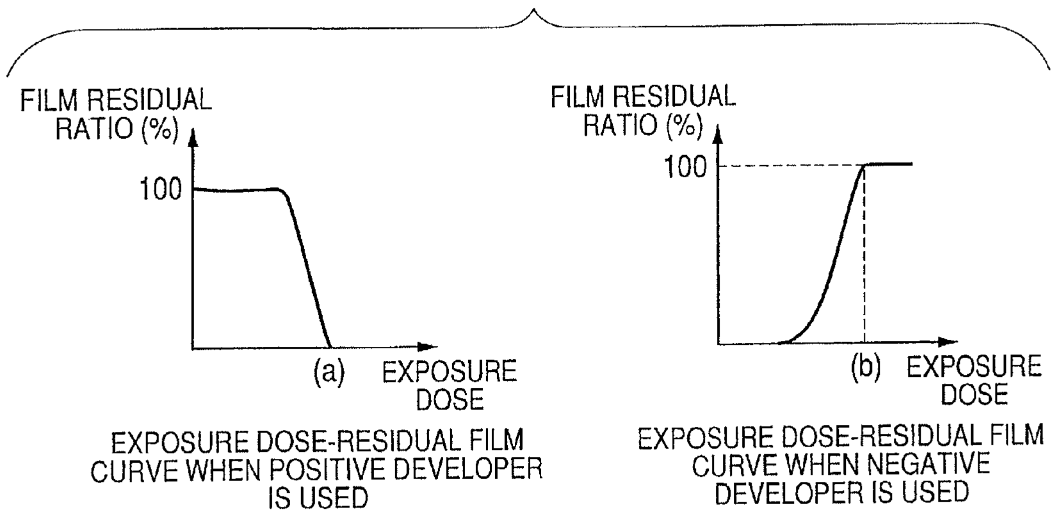
FIG. 3 represents a graph showing the relationship between exposure dose and residual film curve when a positive developer or a negative developer is used.

The residual film ratio of the resist film to the exposure dose is measured and at this time, as shown in FIG. 3, the exposure dose giving a residual film ratio of 0% for the negative developer is designated as a threshold value (a) and the exposure dose giving a residual film ratio of 100% for the negative developer is designated as a threshold value (b).

Figure 4:
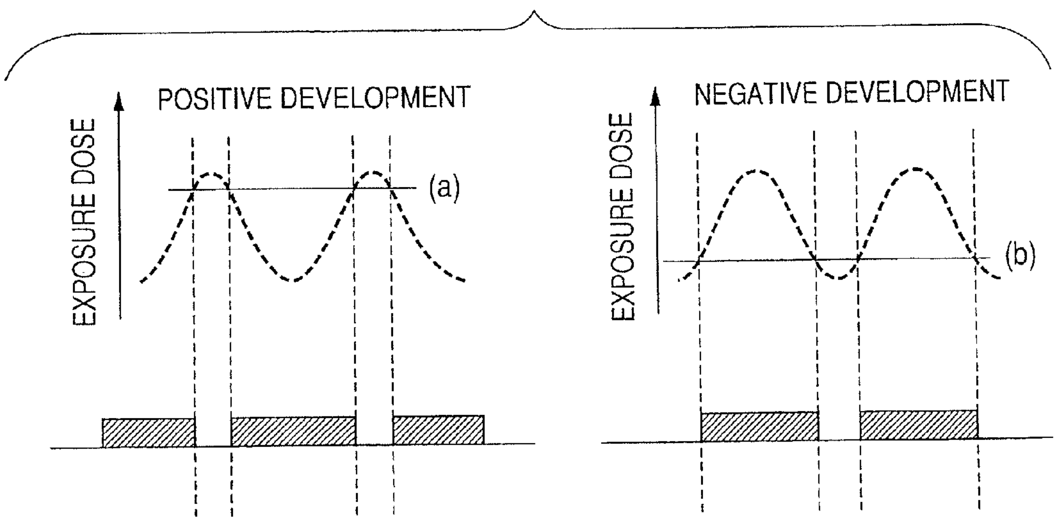
FIG. 4 represents a schematic view showing the relationship among positive development, negative development and exposure dose in the method of the present invention.
Figure 5:
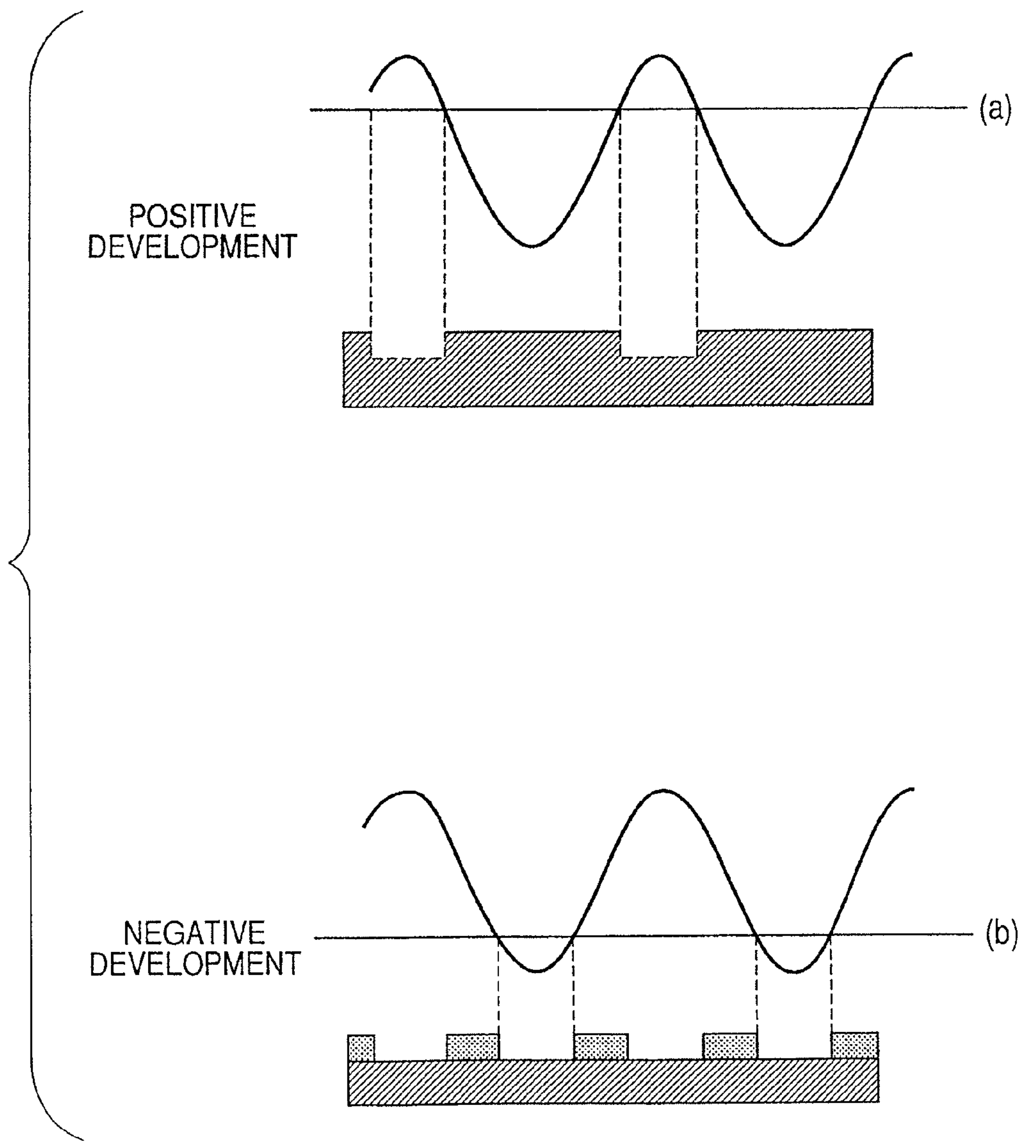
FIG. 5 represents a schematic view showing the relationship among positive development, negative development and exposure dose in the method of the present invention.

For example, as shown in FIG. 4, the threshold value (a) of the minimum exposure dose to make the film soluble in the positive developer is set to be higher than the threshold value (b) of the minimum exposure dose to make the film insoluble in a negative developer, whereby the pattern formation can be achieved by one exposure process.

The method for controlling the threshold value includes a method of controlling the material-related parameters of the positive resist composition (a) and the developer or controlling the parameters related to the process.

As for the material-related parameter, control of various physical values related to solubility of the positive resist composition (a) in the developer and the organic solvent, such as SP value (solubility parameter) and Log P value, is effective. Specific examples thereof for the positive resist composition (a) include the average molecular weight of polymer contained, the molecular weight dispersity, the monomer compositional ratio, the polarity of monomer, the monomer sequence, the polymer blend and the addition of low molecular additive, and specific examples for the developer include the concentration of developer, the addition of low molecular additive and the addition of surfactant.

Also, specific examples of the process-related parameter include the film formation temperature, the film formation time, the temperature and time of post-heating after exposure, the temperature at development, the development time, the nozzle system (puddle method) of developing apparatus, and the rinsing method after development.

In the pattern forming process using two kinds of developers, that is, a positive developer and a negative developer, one exposure process may be performed as described above or two or more exposure processes may be performed in the following manner. That is, development using a positive developer or a negative developer is performed after first exposure, and negative or positive development using a developer different from that in the first development is performed after second exposure.

A pattern forming method comprising, in order:

(A) a step of coating a substrate with a positive resist composition for multiple development, of which solubility in a positive developer increases and solubility in a negative developer decreases upon irradiation with actinic rays or radiation, (B-1) a first exposure step, (E-1) a first heating (baking, also called PEB (post exposure bake)) step, (C) a step of developing the resist film with a positive developer, (B-2) a second exposure step, (E-2) a second heating (baking, also called PEB (post exposure bake)) step, and (D) a step of developing the resist film with a negative developer.

Figure 6:
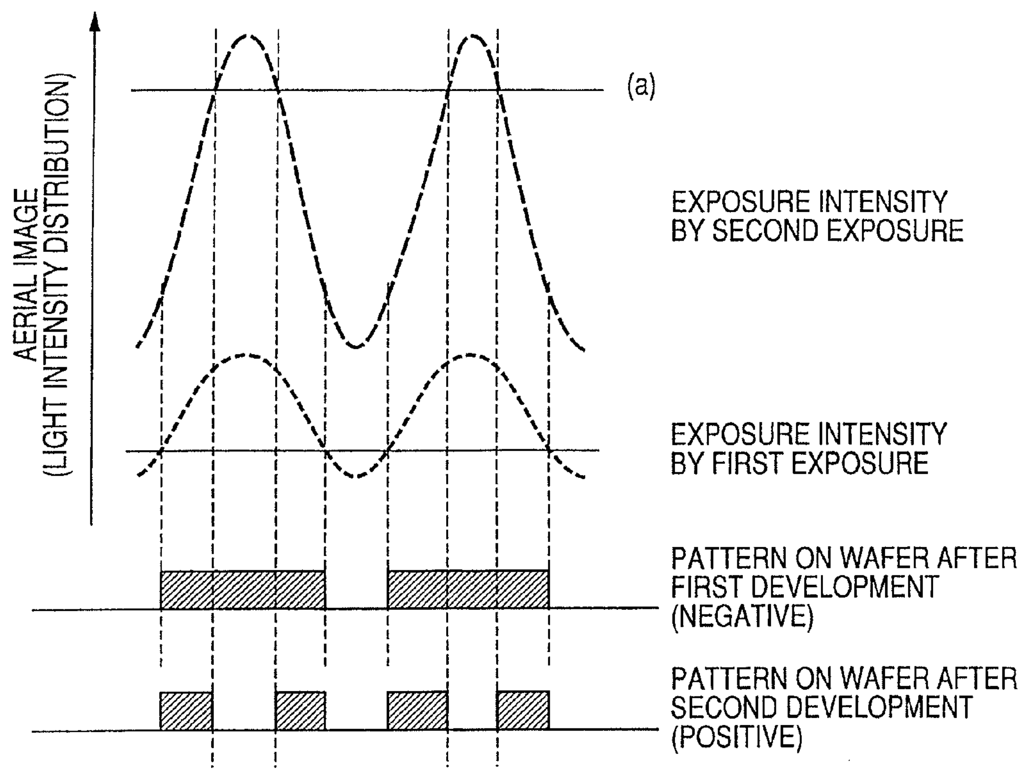
FIG. 6 represents a schematic view showing the relationship among positive development, negative development and exposure dose in the method of the present invention.

A pattern forming method shown in FIG. 6, comprising, in order:

(A) a step of coating a substrate with a positive resist composition fir multiple development, of which solubility in a positive developer increases and solubility in a negative developer decreases upon irradiation with actinic rays or radiation, (B-1) a first exposure step, (E-1) a first heating (baking, also called PEB (post exposure bake)) step, (D) a step of developing the resist film with a negative developer, (B-2) a second exposure step, (E-2) a second heating (baking, also called PEB (post exposure bake)) step, and (C) a step of developing the resist film with a positive developer.

As regards the positive resist composition for multiple development, the positive resist composition described later can be used.

When exposure is performed twice or more, this is advantageous in that the latitude in the control of the threshold value in the development after first exposure and the control of the threshold value in the development after second exposure increases. In the case of performing the exposure twice or more, the second exposure close is preferably set to be larger than the first exposure dose. Because, in the second development, the threshold value is determined based on the amount to which the history of first and second exposure doses is added, and when the second exposure dose is sufficiently larger than the first exposure dose, the first exposure dose is reduced in its effect and depending on the case, can be neglected.

The exposure dose (Eo1 [mJ/cm$^2$]) in the step of performing first exposure is preferably 5 [mJ/cm$^2$] or more smaller than the exposure dose (Eo2 [mJ/cm$^2$]) in the step of performing second exposure. In this case, the history of first exposure can be made to less affect the process of performing the pattern formation by second exposure.

In the case of performing the exposure twice, the first development is not limited to positive development, and development using a negative developer may be performed first.

For changing the first exposure dose and the second exposure dose, a method of adjusting the above-described various parameters related to the material and process is effective. In particular, control of the temperature in the first heating (baking, also called PEB (post exposure bake)) step and the temperature in the second heating (baking, also called PEB (post exposure bake)) step is effective. That is, in order to make the first exposure dose to be smaller than the second exposure dose, it is effective to set the temperature in the first heating step to be higher than the temperature in the second heating step.

The threshold value (a) in the positive development is as follows in the actual lithography process.

A film comprising a positive resist composition of which solubility in a positive developer increases and solubility in a negative developer decreases upon irradiation with actinic rays or radiation is formed on a substrate, and the resist film is exposed through a photomask in a desired pattern size under desired illumination conditions. At this time, the exposure is performed by fluctuating the exposure focus in 0.05 [μm] steps and the exposure dose in 0.5 [mJ/cm$^2$] steps. After the exposure, the resist film is heated (baking, also called PEB (post exposure bake)) at a desired temperature for a desired time and then developed with an alkali developer in a desired concentration for a desired time. After the development, the line width of the pattern is measured using CD-SEM, and the exposure dose A [mJ/cm$^2$] and focus position for forming a desired line width are determined. Subsequently, the intensity distribution of an optical image when the above-described photomask is irradiated with a specific exposure dose A [mJ/cm$^2$] and a specific focus position is calculated. The calculation can be performed using a simulation software (Prolith, ver. 9.2.0.15, produced by KLA). Details of the calculation method are described in Chris. A. Mack, Inside PROLITH, Chapter 2, "Aerial Image Formation", FINLE Technologies, Inc.

Figure 7:
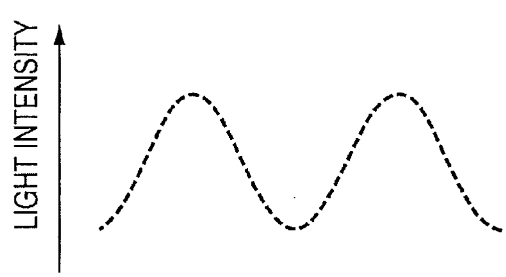
FIG. 7 represents a view showing the spatial intensity distribution of an optical image.

As a result of calculation, for example, the spatial intensity distribution shown in FIG. 7 of an optical image is obtained.

Figure 8:
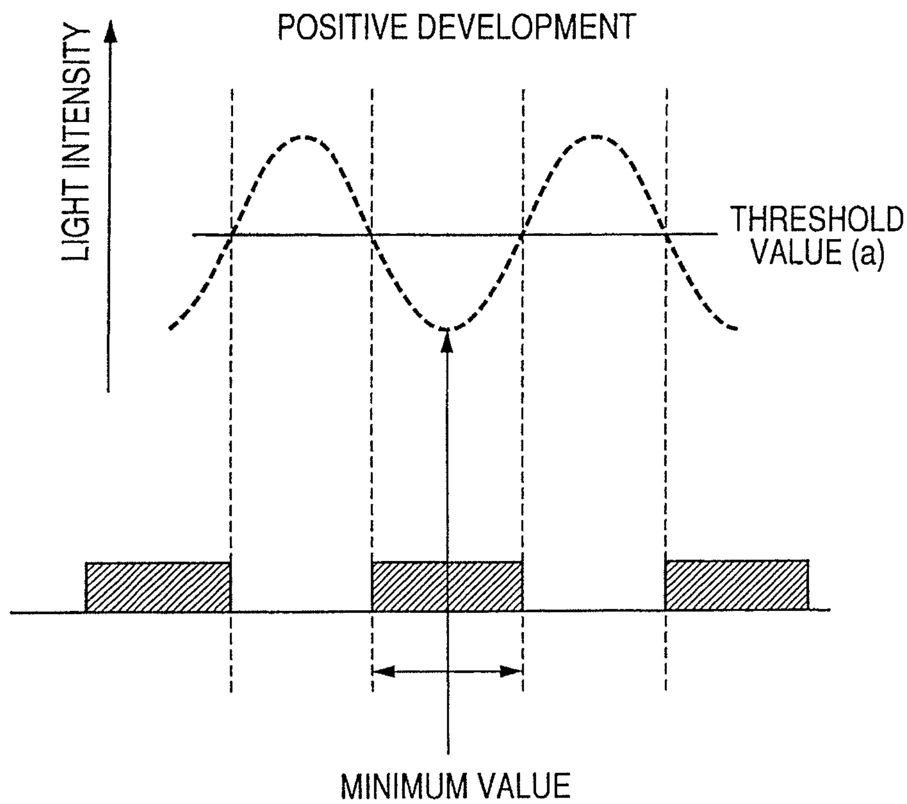
FIG. 8 represents a schematic view showing the relationship among positive development, threshold value (a) and light intensity.

Here, as shown in FIG. 8, the light intensity at a position when the spatial position is shifted by ½ of the obtained pattern line width from the minimum value in the spatial intensity distribution of an optical image corresponds to the threshold value (a).

The threshold value (b) in the negative development is as follows in the actual lithography process.

A film comprising a positive resist composition of which solubility in a positive developer increases and solubility in a negative developer decreases upon irradiation with actinic rays or radiation is formed on a substrate, and the resist film is exposed through a photomask in a desired pattern size under desired illumination conditions. At this time, the exposure is performed by fluctuating the exposure focus in 0.05 [μm] steps and the exposure dose in 0.5 [mJ/cm$^2$] steps. After the exposure, the resist film is heated (baking, also called PEB (post exposure bake)) at a desired temperature for a desired time and then developed with an organic developer in a desired concentration for a desired time. After the development, the line width of the pattern is measured using CD-SEM, and the exposure dose A [mJ/cm$^2$] and focus position for forming a desired line width are determined. Subsequently, the intensity distribution of an optical image when the above-described photomask is irradiated with a specific exposure dose A [mJ/cm$^2$] and a specific focus position is calculated. The calculation is performed using a simulation software (Prolith, produced by KLA.).

Figure 9:
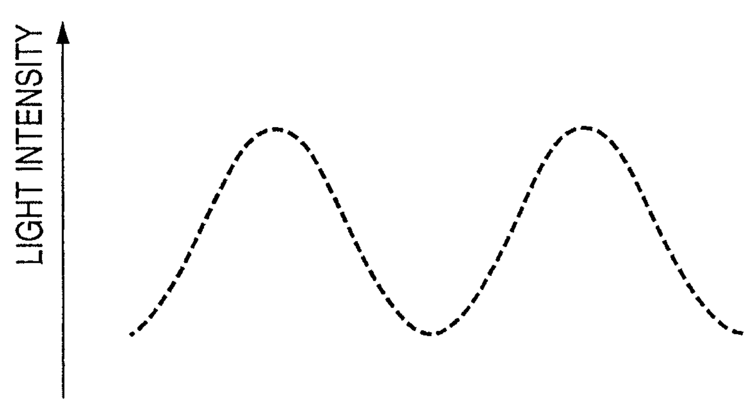
FIG. 9 represents a schematic view showing the spatial intensity distribution of an optical image.

For example, a spatial intensity distribution shown in FIG. 9 of an optical image is obtained.

Figure 10:
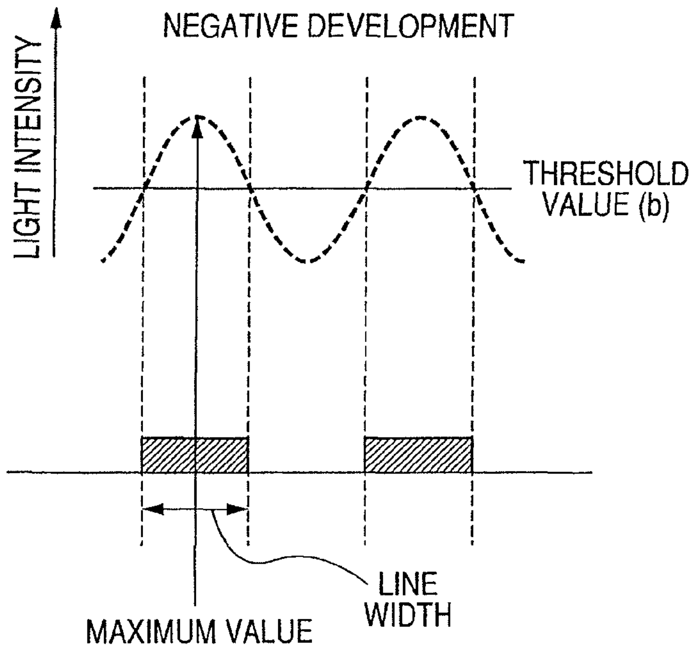
FIG. 10 represents a schematic view showing the relationship among negative development, threshold value (b) and light intensity.

Here, as shown in FIG. 10, the light intensity at a position when the spatial position is shifted by ½ of the obtained pattern line width from the maximum value in the spatial intensity distribution of an optical image is defined as the threshold value (b).

The threshold value (a) is preferably from 0.1 to 100 [mJ/cm$^2$], more preferably from 0.5 to 50 [mJ/cm$^2$], still more preferably from 1 to 30 [mJ/cm$^2$]. The threshold value (b) is preferably from 0.1 to 100 [mJ/cm$^2$], more preferably from 0.5 to 50 [mJ/cm$^2$], still more preferably from 1 to 30 [mJ/cm$^2$]. The difference between threshold values (a) and (b) is preferably from 0.1 to 80 [mJ/cm$^2$], more preferably from 0.5 to 50 [mJ/cm$^2$], still more preferably from 1 to 30 [mJ/cm$^2$].

In the present invention, the film formed on a substrate is a film comprising a positive resist composition of which solubility in a positive developer increases and solubility in a negative developer decreases upon irradiation with actinic rays or radiation.

The positive resist composition which can be used in the present invention is described below.

(A) Resin of which Solubility in an Alkali Developer Increases and Solubility in an Organic Solvent Decreases under the Action of an Acid The resin of which solubility in an alkali developer increases and solubility in an organic solvent decreases under the action of an acid is a resin having a group capable of decomposing under the action of an acid to produce an alkali-soluble group (hereinafter sometimes referred to as an "acid-decomposable group") on either one or both of the main chain and the side chain of the resin (sometimes referred to as an "acid-decomposable resin", an "acid-decomposable resin (A)" or a "resin (A)) and is preferably a resin having a monocyclic or polycyclic alicyclic hydrocarbon structure and being capable of increasing the solubility in an alkali developer and decreasing the solubility in an organic solvent under the action of an acid, because the polarity of the resin is greatly changed between before and after irradiation of actinic rays or radiation and when the resist film is developed using a positive developer (preferably an alkali developer) and a negative developer (preferably an organic solvent), the dissolution contrast is enhanced. Furthermore, the resin having a monocyclic or polycyclic alicyclic hydrocarbon structure generally has high hydrophobicity and favors a high development rate at the time of developing the resist film in a region of weak light irradiation intensity with a negative developer (preferably an organic developer), and the developability on use of a negative developer is enhanced.

Examples of the alkali-soluble group include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl)methylene group or a tris(alkylsulfonyl)methylene group.

Among these alkali-soluble groups, a carboxylic acid group, a fluorinated alcohol group (preferably hexafluoroisopropanol) and a sulfonic acid group are preferred.

As for the group capable of decomposing under the action of an acid (acid-decomposable groups), a group obtained by substituting the hydrogen atom of the above-described alkali-soluble group with a group capable of desorbing under the action of an acid is preferred.

Examples of the acid capable of desorbing under the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, $R_{36}$ to $R_{39}$ each independently represents an alkyl group, a cycloalkyl group, an aryl group, an aralkyl group or an alkenyl group. $R_{36}$ and $R_{37}$ may be bonded with each other to form a ring.

$R_{01}$ and $R_{02}$ each independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The positive resist composition of the present invention containing a resin having a monocyclic or polycyclic alicyclic hydrocarbon structure and being capable of increasing the solubility in an alkali developer and decreasing the solubility in an organic solvent under the action of an acid can be suitably used when ArF excimer laser light is irradiated.

The resin having a monocyclic or polycyclic alicyclic hydrocarbon structure and being capable of increasing the solubility in an alkali developer and decreasing the solubility in an organic solvent under the action of an acid (hereinafter sometimes referred to as an "alicyclic hydrocarbon-based acid-decomposable resin") is preferably a resin containing at least one member selected from the group consisting of a repeating unit having a alicyclic hydrocarbon-containing partial structure represented by any one of the following formulae (pI) to (pV) and a repeating unit represented by the following formula (II-AB).

(pI)

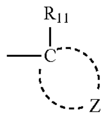

(pII)

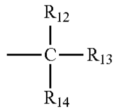

(pIII)

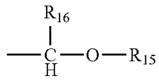

(pIV)

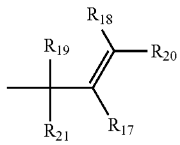

(pV)

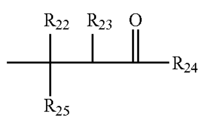

In formulae (pI) to (pV), $R_{11}$ represents a methyl group, an ethyl group, an n-propyl group, an isopropyl group, an n-butyl group, an isobutyl group or a sec-butyl group.

Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

(II-AB)

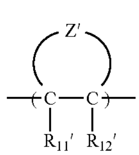

In formula (II-AB), $R_{11}'$ and $R_{12}'$ each independently represents a hydrogen atom, a cyano group, a halogen atom or an alkyl group.

Z' represents an atomic group for forming an alicyclic structure containing two bonded carbon atoms (C—C).

Formula (II-AB) is preferably the following formula (II-AB1) or (II-2):

(II-AB1)

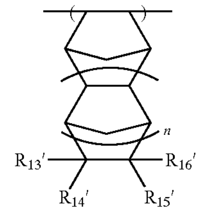

(II-AB2)

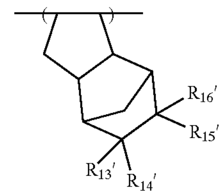

In formulae (II-AB1) and (II-AB2), $R_{13}'$ to $R_{16}'$ each independently represents a hydrogen atom, a halogen atom, a cyano group, —COOH, —$COOR_5$, a group capable of decomposing under the action of an acid, —C(═O)—X-A'-$R_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —$NHSO_2$— or —$NHSO_2NH$—.

A' represents a single bond or a divalent linking group.

$R_{17}'$ represents —COOH, —$COOR_5$, —CN, a hydroxyl group, an alkoxy group, —CO—NH—$R_6$, —CO—NH—$SO_2$—$R_6$ or a group having a lactone structure.

$R_6$ represents an alkyl group or a cycloalkyl group.

n represents 0 or 1.

in formulae (pI) to (W), the alkyl group of $R_{12}$ to $R_{25}$ is a linear or branched alkyl group having a carbon number of 1 to 4.

The cycloalkyl group of $R_{11}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure or the like. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which the alkyl group and cycloalkyl group each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like each may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pV). Among these, preferred is a structure where the hydrogen atom of a carboxylic acid group or a sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

(pA)

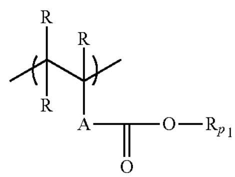

In the formula, R represents a hydrogen atom, a halogen atom or a linear or branched alkyl group having a carbon number of 1 to 4, and the plurality of R's may be the same or different.

A represents a single bond, or a sole group or a combination of two or more groups selected from the group consisting of an alkylene group, an ether group, a thioether group, a carbonyl group, an ester group, an amido group, a sulfonamido group, a urethane group and a urea group. A is preferably a single bond.

$Rp_1$ represents a group represented by any one of formulae (pI) to (pV).

The repeating unit represented by formula (pA) is more preferably a repeating unit comprising a 2-alkyl-2-adamantyl(meth)acrylate or a dialkyl(1-adamantyl)methyl(meth) acrylate.

Specific examples of the repeating unit represented by formula (pA) are set forth below, but the present invention is not limited thereto.

(In the formulae, Rx represents H, $CH_3$ or $CH_2OH$, and Rxa and Rxb each independently represents an alkyl group having a carbon number of 1 to 4.)

1

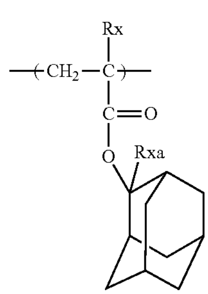

-continued

2

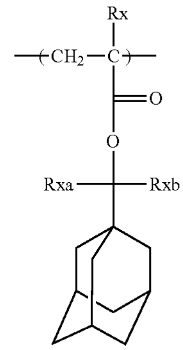

3

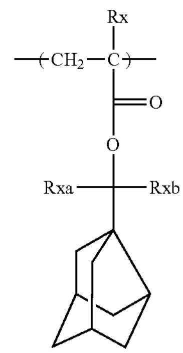

4

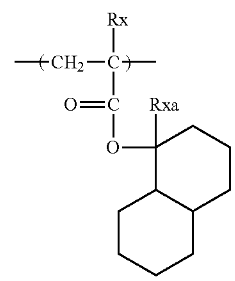

5

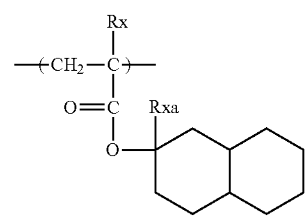

6

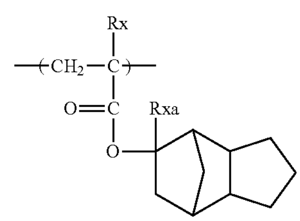

7

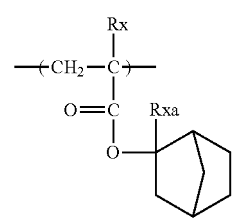

-continued
8
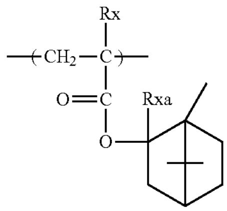
9
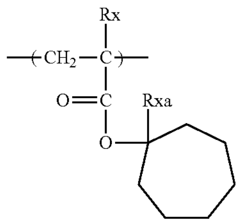
10
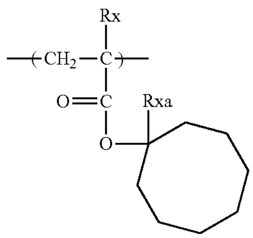
11
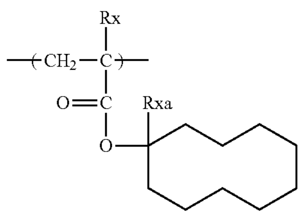
12
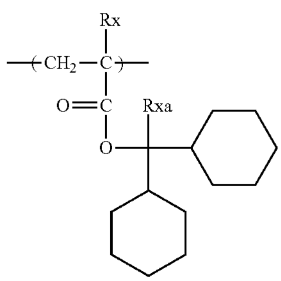
13
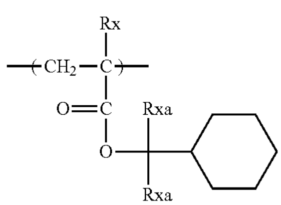
14
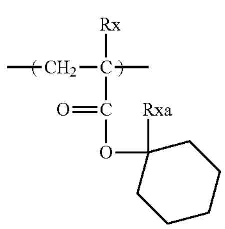
-continued
15
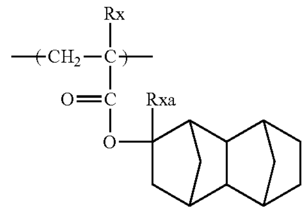
16
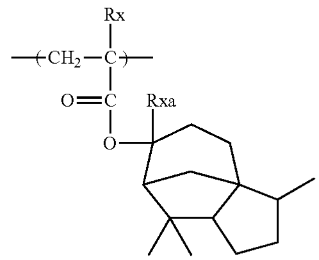
17
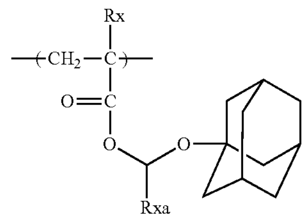
18
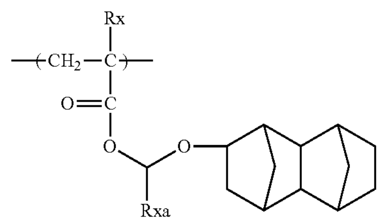
19
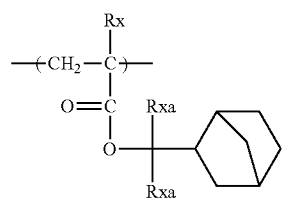
20
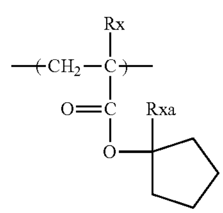
21
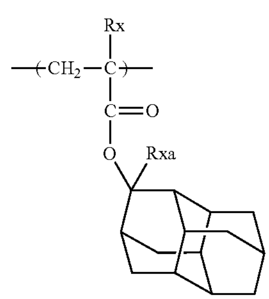

-continued

22

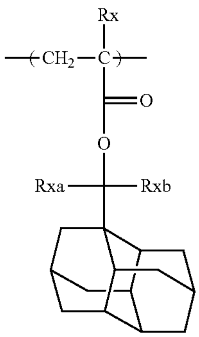

23

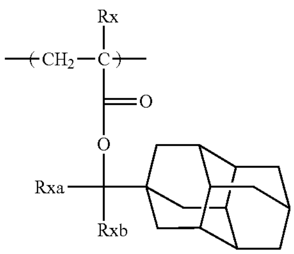

24

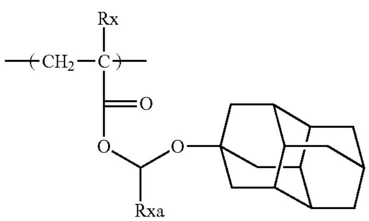

25

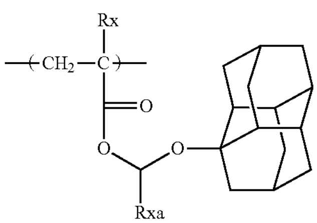

26

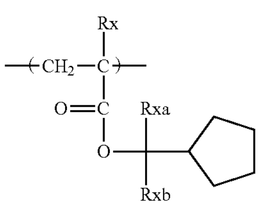

27

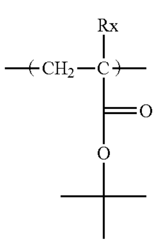

-continued

28

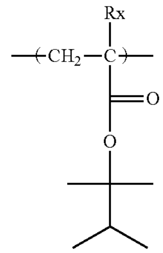

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of Z' for forming an alicyclic structure is an atomic group for forming a repeating unit comprising an alicyclic hydrocarbon which may have a substituent, in the resin. Above all, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{12}$ to $R_{25}$ in formulae (pI) to (pV).

The skeleton of the alicyclic hydrocarbon may have a substituent, and examples of the substituent include $R_{13}'$ to $R_{16}'$ in formulae (II-AB1) and (II-AB2).

In the alicyclic hydrocarbon-based acid-decomposable resin for use in the present invention, the group capable of decomposing under the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later. The group capable of decomposing under the action of an acid is preferably contained in the repeating unit having an alicylcic hydrocarbon-containing partial structure represented by any one of formulae (pI) to (pV).

Various substituents $R_{13}'$ to $R_{16}'$ in formulae (II-AB1) and (II-AB2) may become substituents of the atomic group for forming an alicyclic hydrocarbon structure in formula (II-AB) or the atomic group Z for forming a crosslinked alicyclic hydrocarbon structure.

Specific examples of the repeating units represented by formulae (II-AB1) and (II-AB2) are set forth below, but the present invention is not limited to these specific examples.

[II-1]

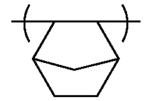

[II-2]

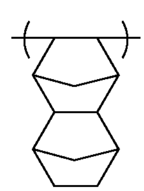

-continued
[II-3]
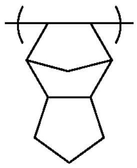
[II-4]
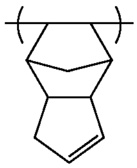
[II-5]
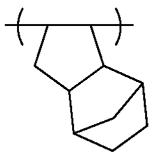
[II-6]
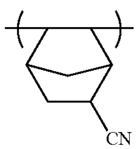
[II-7]
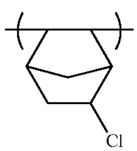
[II-8]
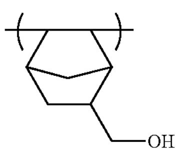
[II-9]
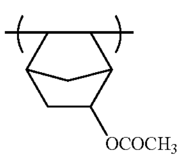
[II-10]
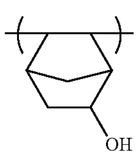
[II-11]
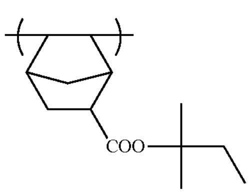
-continued
[II-12]
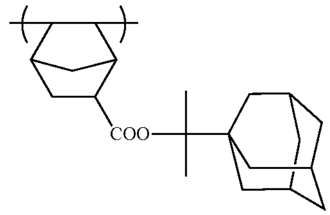
[II-13]
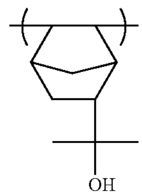
[II-14]
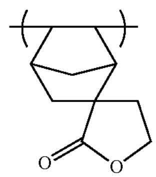
[II-15]
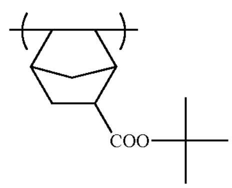
[II-16]
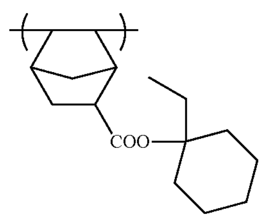
[II-17]
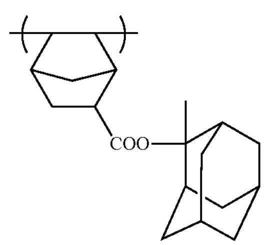
[II-18]
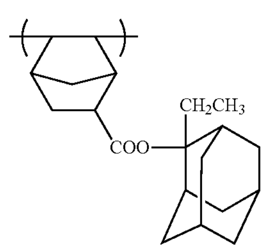

-continued
[II-19]
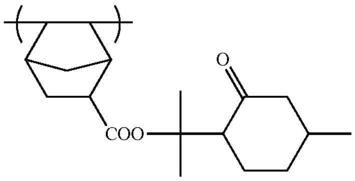
[II-20]
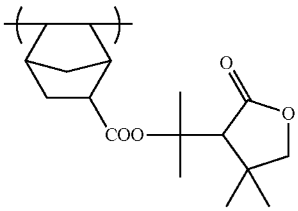
[II-21]
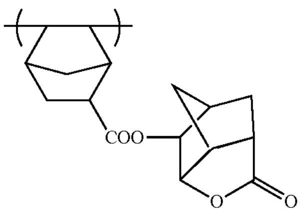
[II-22]
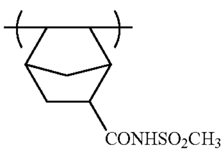
[II-23]
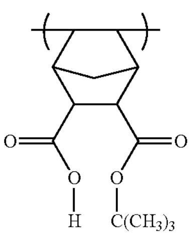
[II-24]
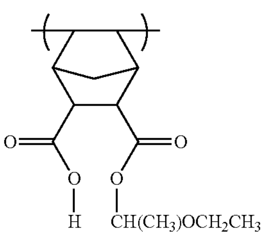
[II-25]
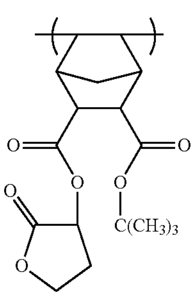
-continued
[II-26]
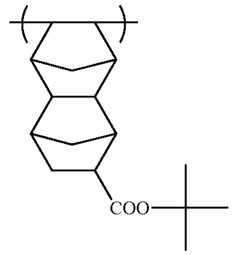
[II-27]
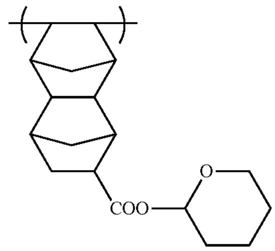
[II-28]
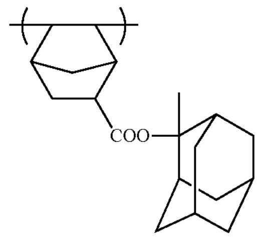
[II-29]
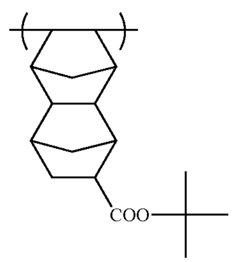
[II-30]
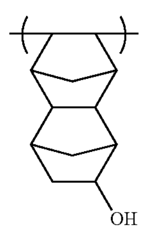
[II-31]
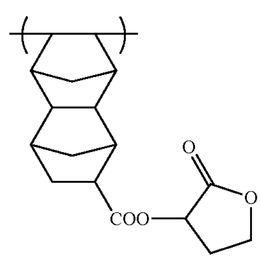

-continued

[II-32]

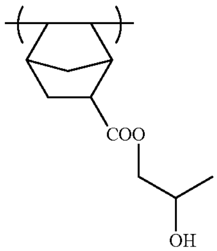

The alicyclic hydrocarbon-based acid-decomposable resin for use in the present invention preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. The resin more preferably contains a repeating unit containing a group having a lactone structure represented by any one of the following formulae (LC1-1) to (LC1-16). The group having a lactone structure may be bonded directly to the main chain. Among these lactone structures, preferred are groups represented by formulae (LC1-1), (LC1-4), (LC1-5), (LC1-6), (LC1-13) and (LC1-14). By virtue of using a specific lactone structure, the line edge roughness and development defect are improved.

LC1-1

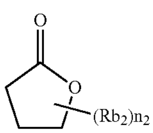

LC1-2

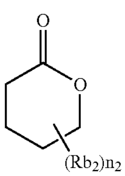

LC1-3

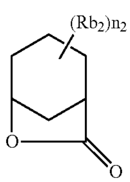

LC1-4

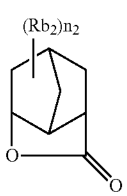

LC1-5

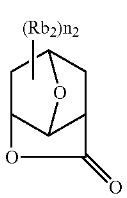

-continued

LC1-6

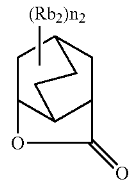

LC1-7

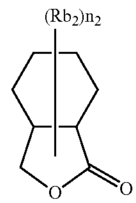

LC1-8

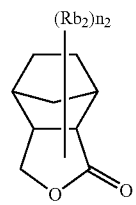

LC1-9

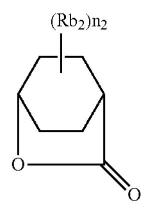

LC1-10

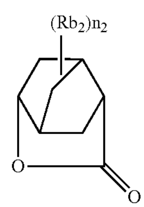

LC1-11

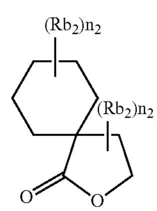

LC1-12

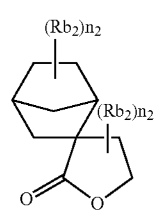

-continued

LC1-13

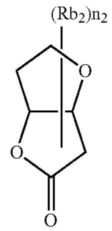

LC1-14

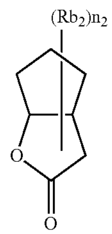

LC1-15

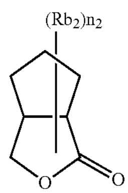

LC1-16

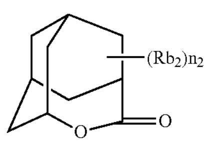

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of substituents ($Rb_2$) may be the same or different and also, the plurality of substituents ($Rb_2$) may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

(AI)

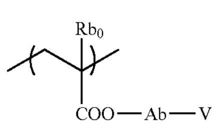

In formula (AI), $Rb_0$ represents a hydrogen atom, a halogen atom or an alkyl group having a carbon number of 1 to 4.

Preferred examples of the substituent which the alkyl group of $Rb_0$ may have include a hydroxyl group and a halogen atom.

The halogen atom of $Rb_0$ includes a fluorine atom, a chlorine atom, a bromine atom and an iodine atom.

$Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group comprising a combination thereof, and is preferably a single bond or a linking group represented by $-Ab_1-CO_2-$. $Ab_1$ represents a linear or branched alkylene group or a monocyclic or polycyclic cycloalkylene group arid is preferably a methylene group, an ethylene group, a cyclohexylene group, an adamantyl group or a norbornyl group.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit having a lactone structure are set forth below, but the present invention is not limited thereto.

(In the formulae, Rx is H, $CH_3$, $CH_2OH$ or $CF_3$.)

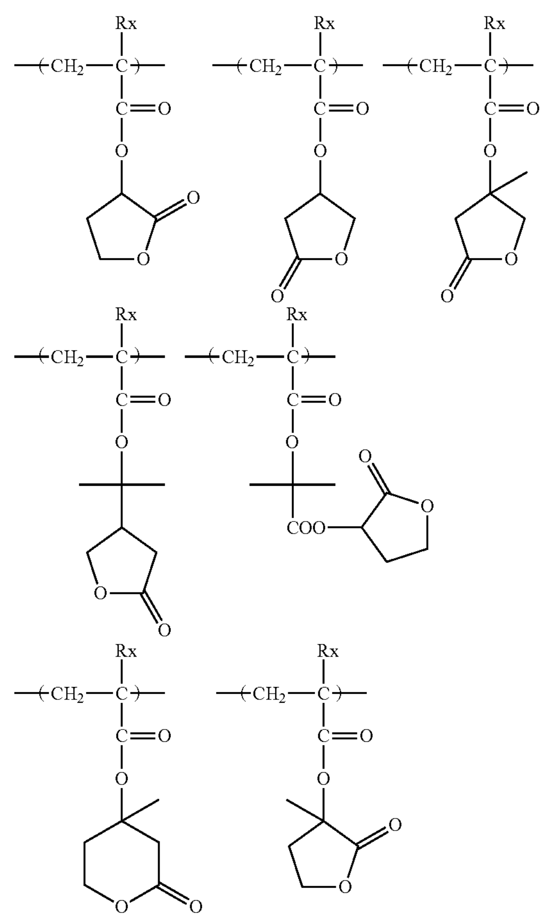

-continued
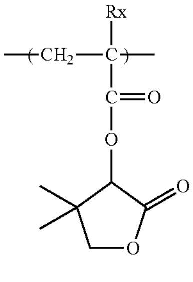
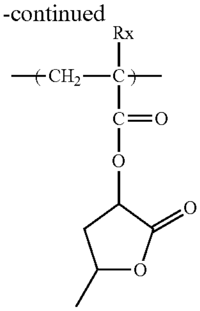
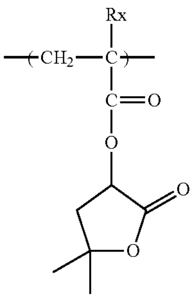
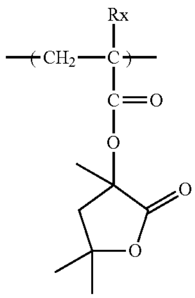
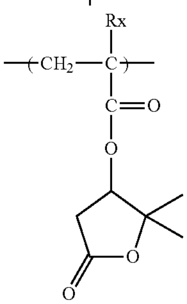
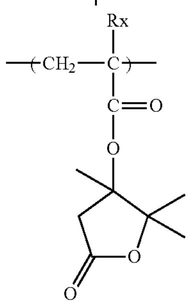
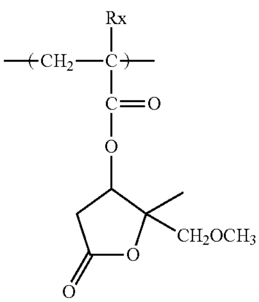
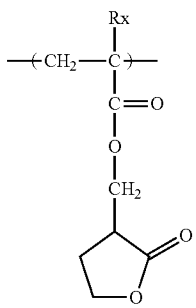
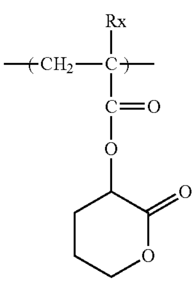
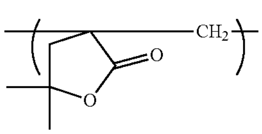
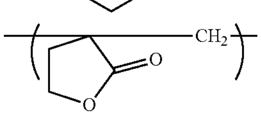
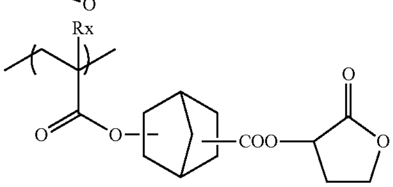
-continued
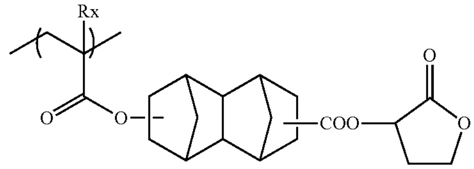
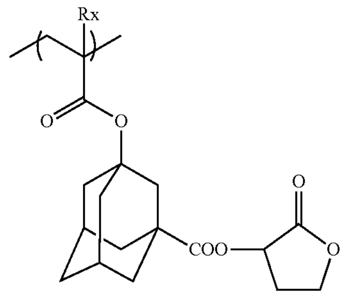
(In the formulae, Rx is $CH_3$, $CH_2OH$ or $CF_3$.)
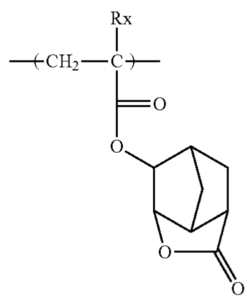
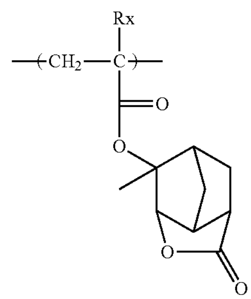
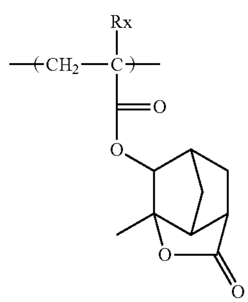
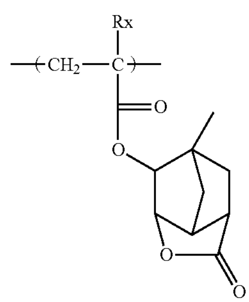
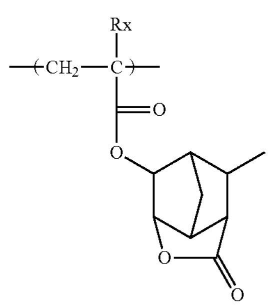
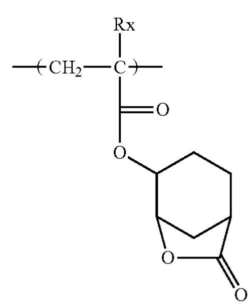

-continued
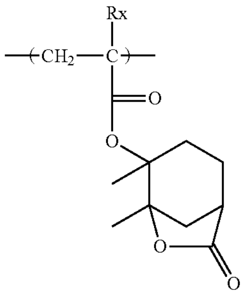
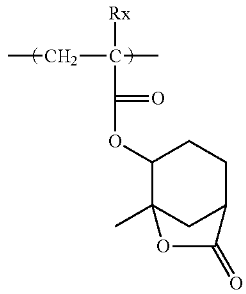
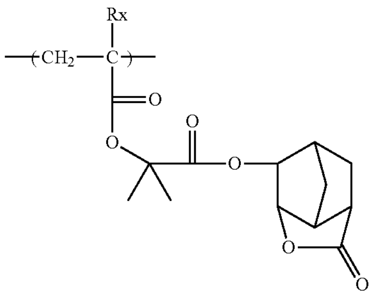
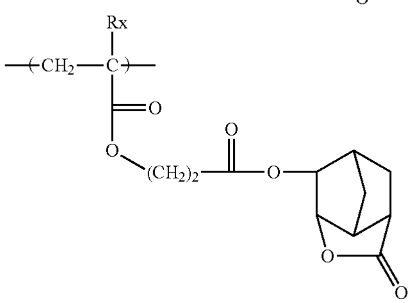
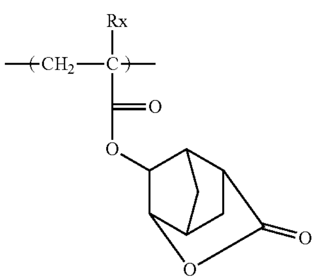
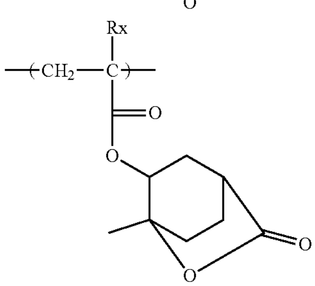
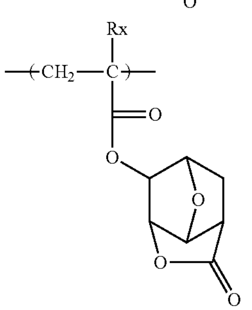
-continued
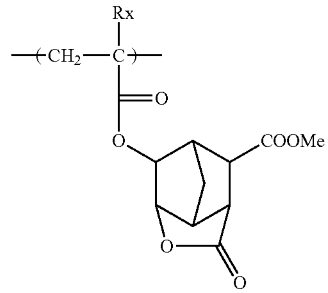
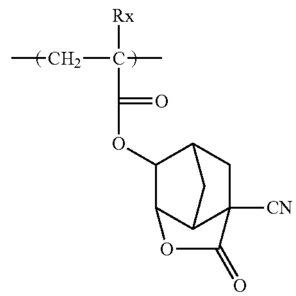
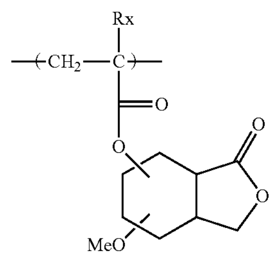
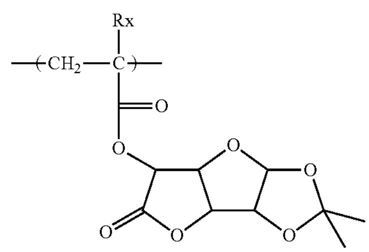
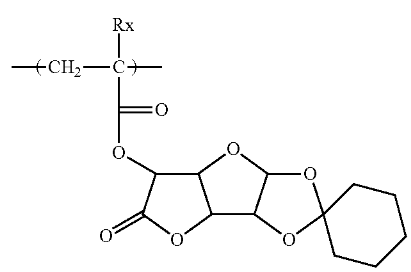
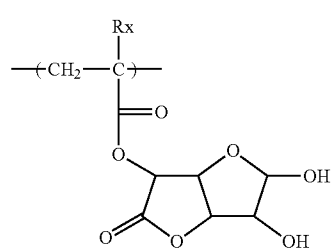

-continued
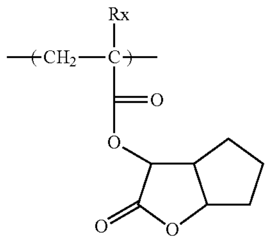
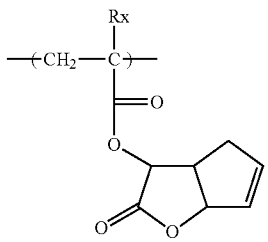
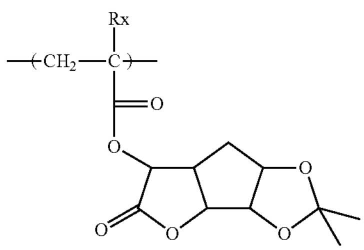
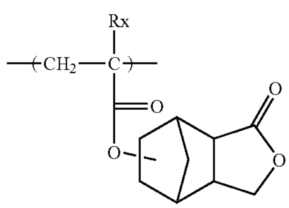
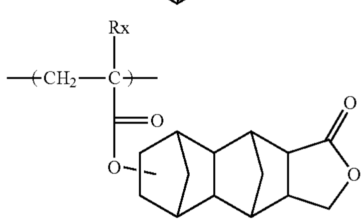
(In the formulae, Rx is H, $CH_3$, $CH_2OH$ or $CF_3$.)
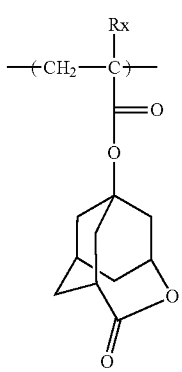
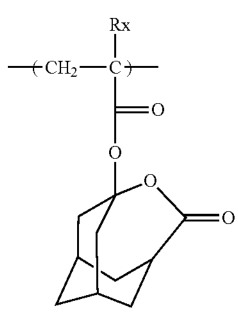
-continued
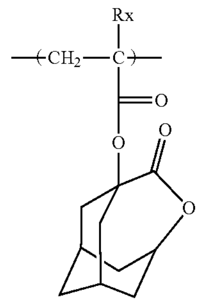
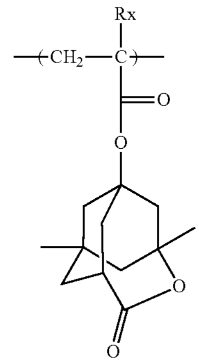
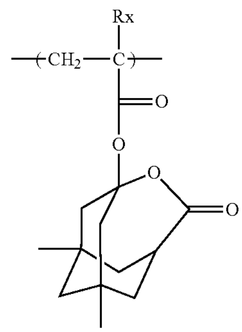
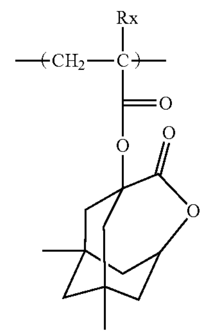
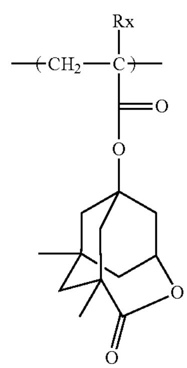
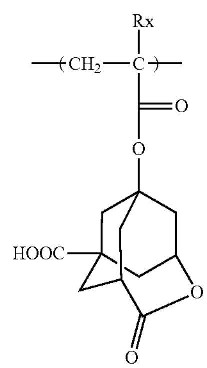
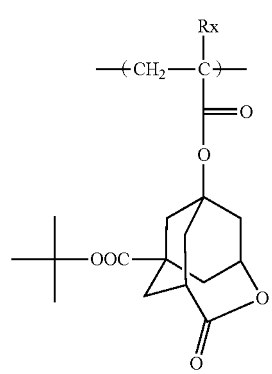
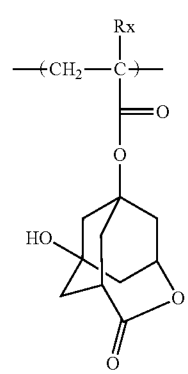

-continued

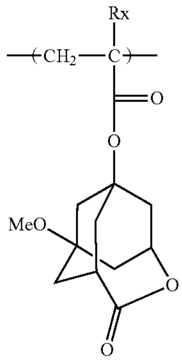

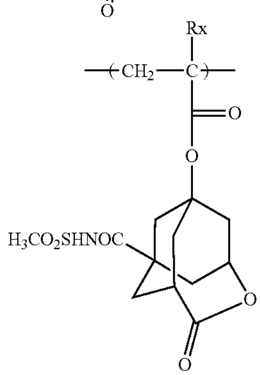

The alicyclic hydrocarbon-based acid-decomposable resin for use in the present invention preferably contains a repeating unit containing an organic group having a polar group, more preferably a repeating unit having an alicyclic hydrocarbon structure substituted by a polar group. By virtue of this repeating unit, the adhesion to substrate and the affinity for developer are enhanced. The alicyclic hydrocarbon structure of the polar group-substituted alicyclic hydrocarbon structure is preferably an adamantyl group, a diamantyl group or a norbornane group. The polar group is preferably a hydroxyl group or a cyano group.

The polar group-substituted alicyclic hydrocarbon structure is preferably a partial structure represented by any one of the following formulae (VIIa) to (VIId):

(VIIa)

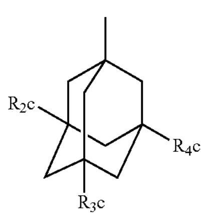

(VIIb)

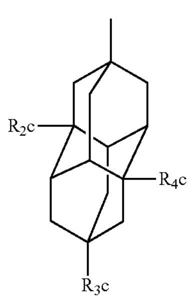

-continued (VIIc)

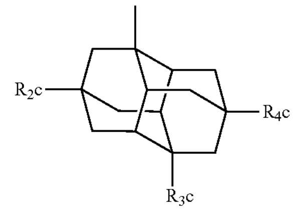

(VIId)

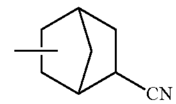

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred.

In formula (VIIa), it is more preferred that two members out of $R_{2c}$ to $R_{4c}$ are a hydroxyl group and the remaining is a hydrogen atom.

The repeating unit having a group represented by any one of formulae (VIIa) to (VIId) includes a repeating unit where at least one of $R_{13}'$ to $R_{16}'$ in formula (II-AB1) or (II-AB2) has a group represented by formula (VII) (for example, $R_5$ of —$COOR_5$ is a group represented by any one of formulae (VIIa) to (VIId)), and repeating units represented by the following formulae (AIIa) to (AIId):

(AIIa)

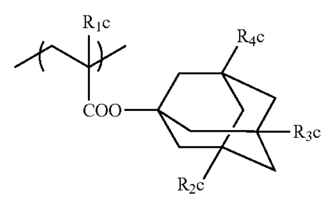

(AIIb)

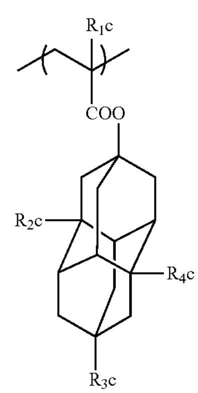

-continued (AIIc)

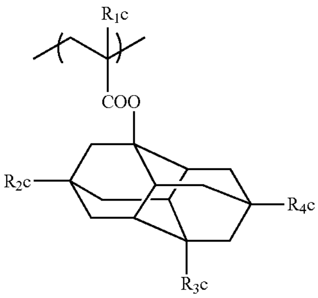

(AIId)

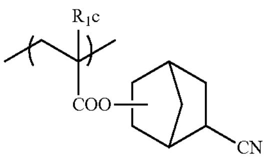

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

Specific examples of the repeating unit having a structure represented by any one of formulae (AIIa) to (AIId) are set forth below, but the present invention is not limited thereto.

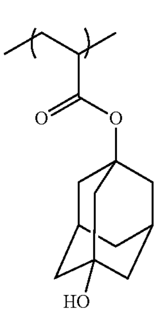

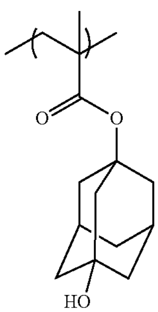

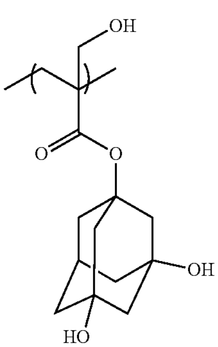

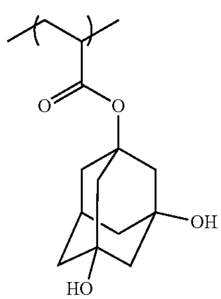

-continued

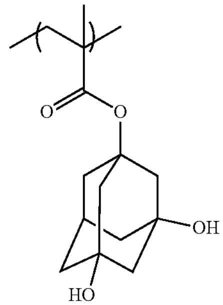

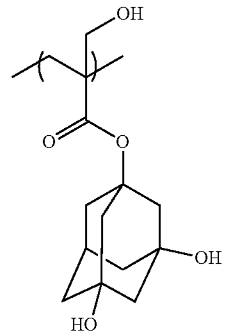

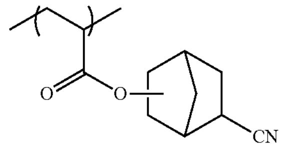

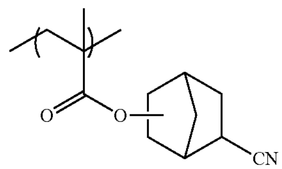

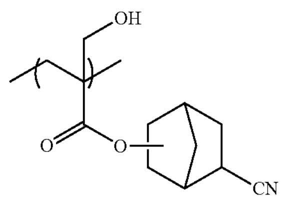

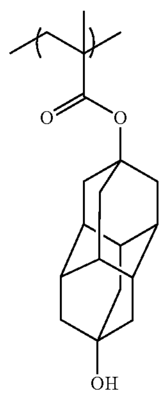

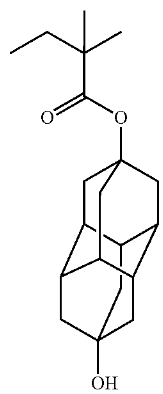

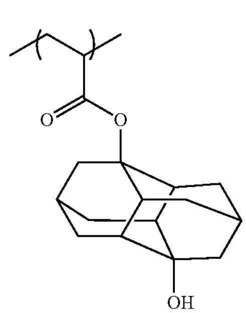

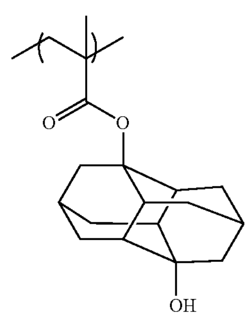

The alicyclic hydrocarbon-based acid-decomposable resin for use in the present invention may contain a repeating unit represented by the following formula (VIII):

(VIII)

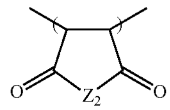

In formula (VIII), $Z_2$ represents —O— or —N($R_{41}$)—. $R_{41}$ represents a hydrogen atom, a hydroxyl group, an alkyl group or —$OSO_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

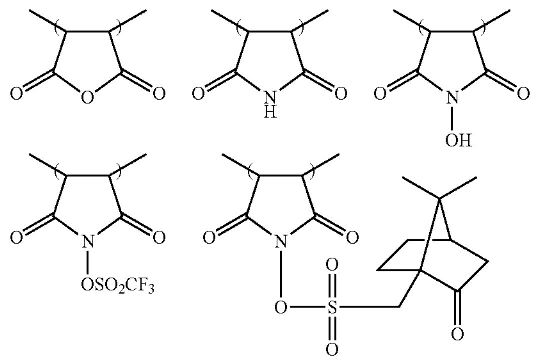

The alicyclic hydrocarbon-based acid-decomposable resin for use in the present invention preferably contains a repeating unit having an alkali-soluble group, more preferably a repeating unit having a carboxyl group. By virtue of containing this repeating unit, the resolution increases in the usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where a carboxyl group is introduced into the terminal of the polymer chain by using a polymerization initiator or chain transfer agent having an alkali-soluble group at the polymerization, all are preferred. The linking group may have a monocyclic or polycyclic hydrocarbon structure. A repeating unit by an acrylic acid or a methacrylic acid is more preferred.

The alicyclic hydrocarbon-based acid-decomposable resin for use in the present invention may further contain a repeating unit having from 1 to 3 groups represented by formula (F1). By virtue of this repeating unit, the performance in terms of line edge roughness is enhanced.

(F1)

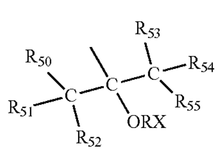

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The organic group represented by Rx is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following, formula (F2):

(F2)

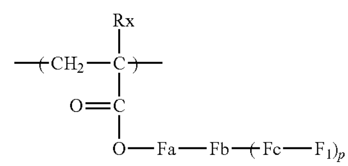

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group and is preferably a single bond.

Fb represents a monocyclic or polycyclic hydrocarbon group.

Fc represents a single bond or a linear or branched alkylene group and is preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a group represented by formula (F1) are set forth below, but the present invention is not limited thereto.

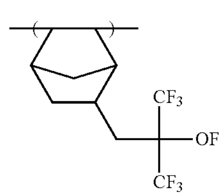

-continued

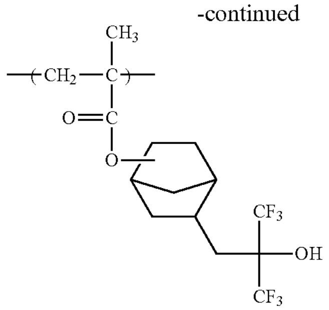

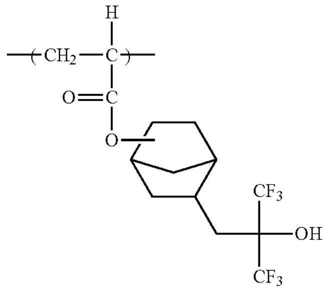

The alicyclic hydrocarbon-based acid-decomposable resin for use in the present invention may further contain a repeating unit having an alicyclic hydrocarbon structure and not exhibiting acid decomposability. By virtue of this repeating unit, the dissolving out of low molecular components from the resist film to the immersion liquid at the immersion exposure can be reduced. Examples of this repeating unit include 1-adamantyl(meth)acrylate, tricyclodecanyl(meth) acrylate and cyclohexyl(meth)acrylate.

The alicyclic hydrocarbon-based acid-decomposable resin for use in the present invention may contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in coating solvent, (2) film-forming property (glass transition point), (3) solubility in positive or negative developer, (4) film loss (selection of hydrophilic, hydrophobic or alkali-soluble group), (5) adhesion of unexposed area to substrate, (6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably a resin containing a (meth)acrylate repeating unit having a structure represented by any one of formulae (pI) to (pV), and (2) a resin containing a repeating unit represented by formula (II-AB) (main chain type).

The resin of (2) further includes:

(3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the acid-decomposable resin, the content of the repeating unit having a lactone ring is preferably from 10 to 70 mol %, more preferably from 20 to 60 mol %, still more preferably from 25 to 40 mol %, based on all repeating structural units.

In the acid-decomposable resin, the content of the repeating unit having a polar group-containing organic group is preferably from 1 to 40 mol %, more preferably from 5 to 30 mol %, still more preferably from 5 to 20 mol %, based on all repeating structural units.

The content of the repeating structural unit based on the monomer as the further copolymerization component in the resin can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the positive resist composition of the present invention for exposure with ArF, the resin preferably has no aromatic group in view of transparency to ArF light.

The alicyclic hydrocarbon-based acid-decomposable resin for use in the present invention is preferably a resin where all repeating units are composed of a (meth)acrylate-based repeating unit. In this case, the repeating units may be all a methacrylate-based repeating unit, all an acrylate-based repeating unit, or all a mixture of methacrylate-based repeating unit/acrylate-based repeating unit, but the content of the acrylate-based repeating unit is preferably 50 mol % or less based on all repeating units.

The alicyclic hydrocarbon-based acid-decomposable resin is preferably a copolymer having three kinds of repeating unit, that is, a (meth)acrylate-based repeating unit having a lactone ring, a (meth)acrylate-based repeating unit having an organic group substituted by either one of a hydroxyl group and a cyano group, and a (meth)acrylate-based repeating unit having an acid-decomposable group.

The copolymer is preferably a ternary copolymerization polymer comprising from 20 to 50 mol % of the repeating unit having an alicyclic hydrocarbon-containing partial structure represented by any one of formulae (pI) to (pV), from 20 to 50 mol % of the repeating unit having a lactone structure and from 5 to 30 mol % of the repeating unit having a polar group-substituted alicyclic hydrocarbon structure, or a quaternary copolymerization polymer further comprising from 0 to 20 mol % of other repeating units.

In particular, the resin is preferably a ternary copolymerization polymer comprising from 20 to 50 mol % of an acid-decomposable group-containing repeating unit represented by any one of the following formulae (ARA-1) to (ARA-7), from 20 to 50 mol % of a lactone group-containing repeating unit represented by any one of the following formulae (ARL-1) to (ARL-6), and from 5 to 30 mol % of a repeating unit having a polar group-substituted alicyclic hydrocarbon structure represented by any one of the following formulae (ARH-1) to (ARH-3), or a quaternary copolymerization polymer further comprising from. 5 to 20 mol % of a repeating unit containing a carboxyl group or a structure represented by formula (F1) and a repeating unit having an alicyclic hydrocarbon structure and not exhibiting acid decomposability.

(In the formulae, $Rxy_1$ represents a hydrogen atom or a methyl group, $Rxa_1$ and $Rxb_1$ each independently represents a methyl group or an ethyl group, and $Rxc_1$ represents a hydrogen atom or a methyl group).

ARA-1

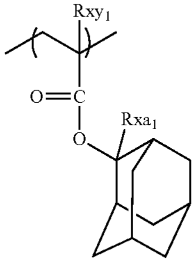

-continued

ARA-2

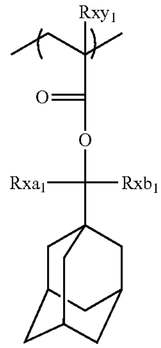

ARA-3

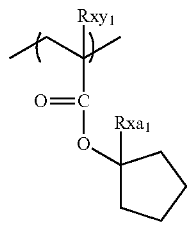

ARA-4

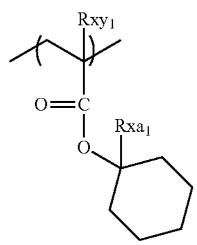

ARA-5

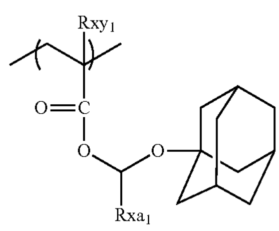

ARA-6

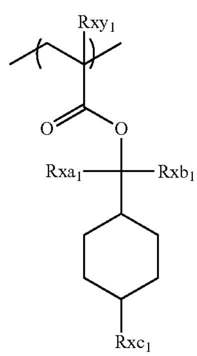

-continued

ARA-7

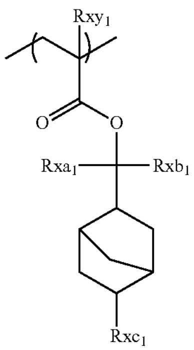

ARL-1

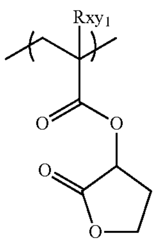

ARL-2

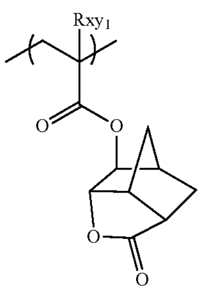

ARL-3

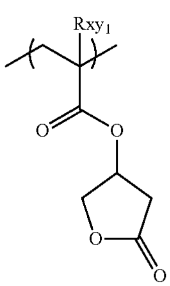

ARL-4

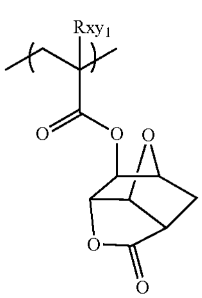

-continued

ARL-5

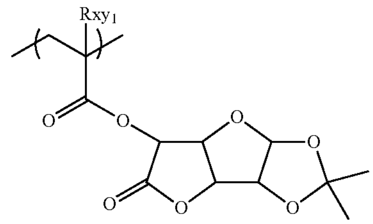

ARL-6

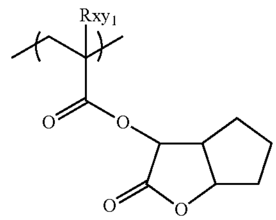

ARH-1

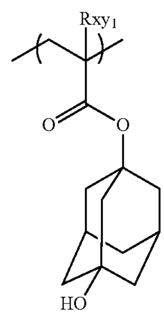

ARH-2

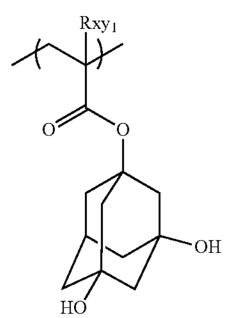

ARH-3

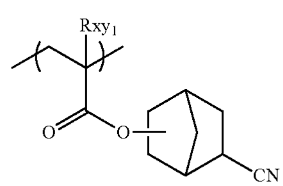

In the case of irradiating the acid-decomposable resin (A) with KrF excimer laser light, electron beam, X-ray or high energy beam at a wavelength of 50 nm or less (e.g., EUV), the acid-decomposable resin preferably contains a hydroxystyrene-based repeating unit such as repeating unit comprising hydroxystyrene. The resin is more preferably a resin containing a hydroxystyrene-based repeating unit and a repeating unit having an acid-decomposable group (hereinafter sometimes referred to as a "hydroxystyrene-based acid-decomposable resin"). As for the repeating unit having an acid-decomposable group, a hydroxystyrene-based repeating unit protected by an acid-dissociatable group, and an acid-decomposable tertiary alkyl(meth)acrylate-based repeating unit are preferred.

The hydroxystyrene-based repeating unit protected by an acid-dissociatable group is preferably a repeating unit comprising 1-alkoxyethoxystyrene, tert-butylcarbonyloxystyrene or the like. The alkyl group in the acid-decomposable tertiary alkyl(meth)acrylate-based repeating unit includes a chain alkyl and a monocyclic or polycyclic cycloalkyl group. The acid-decomposable tertiary alkyl(meth)acrylate-based repeating unit is preferably a repeating unit comprising a tert-butyl(meth)acrylate, a 2-alkyl-2-adamantyl(meth)acrylate, a 2-(1-adamantyl)-2-propyl(meth)acrylate, a 1-alkyl-1-cyclohexyl(meth)acrylate, a 1-alkyl-1-cyclopentyl(meth)acrylate or the like.

Specific examples of the hydroxystyrene-based acid-decomposable resin are set forth below, but the present invention is not limited thereto.

(R-1)

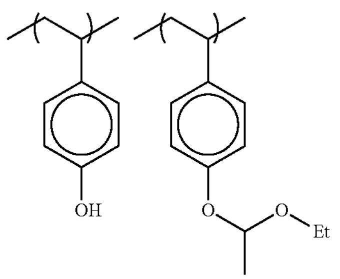

(R-2)

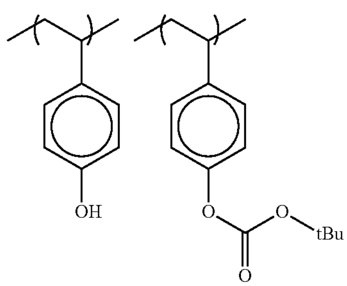

(R-3)

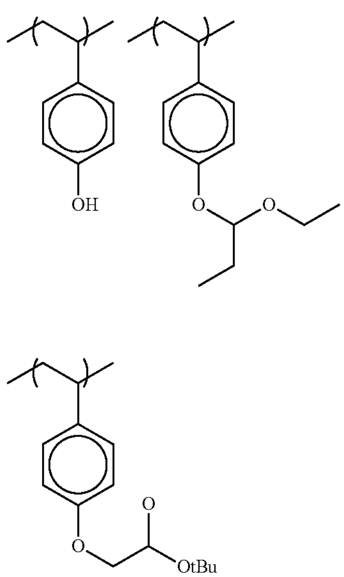

-continued (R-4)

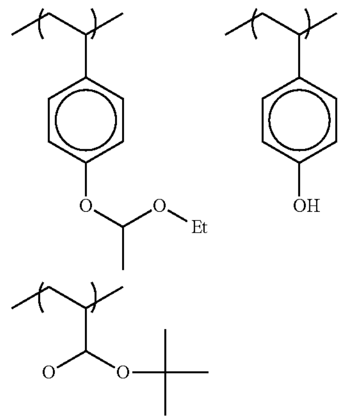

(R-5)

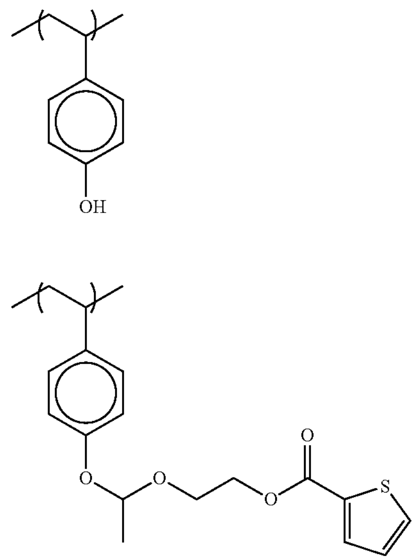

(R-6)

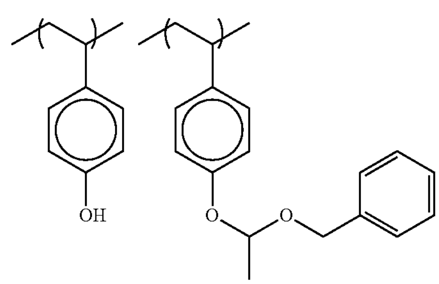

(R-7)

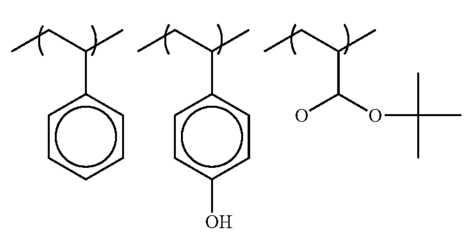

-continued
(R-8)
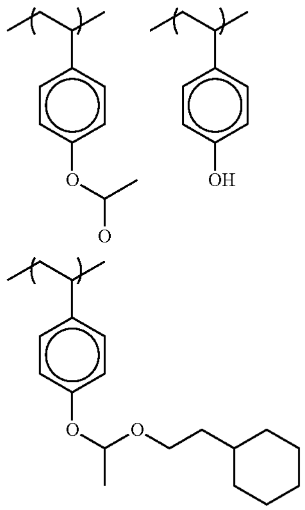
(R-9)
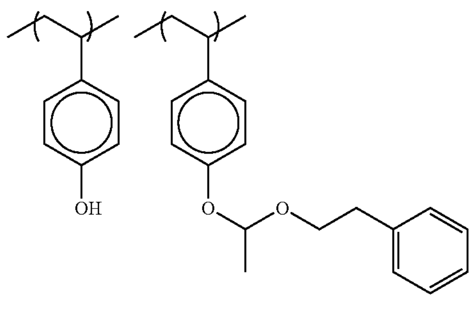
(R-10)
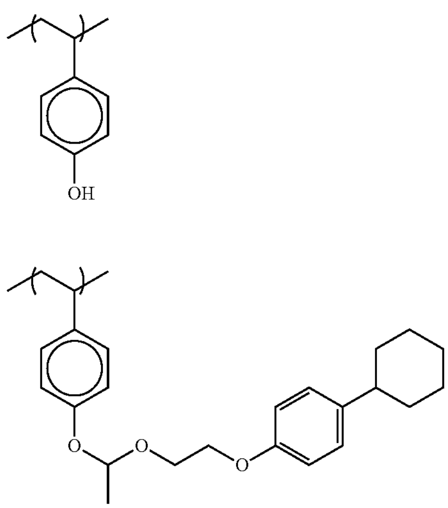
(R-11)
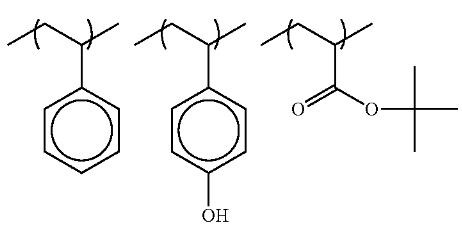
-continued
(R12)
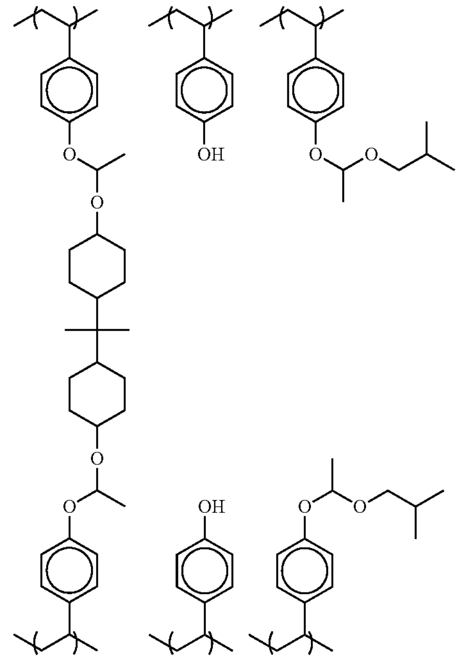
(R-13)
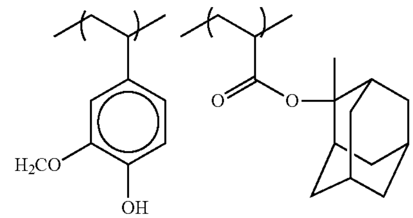
(R-14)
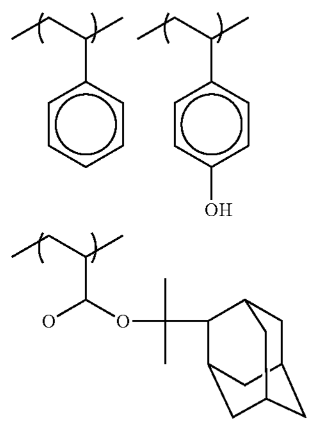
(R-15)
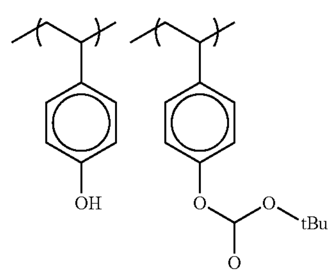

-continued

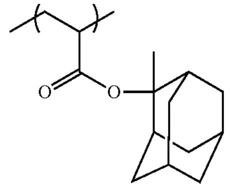

(R-16)

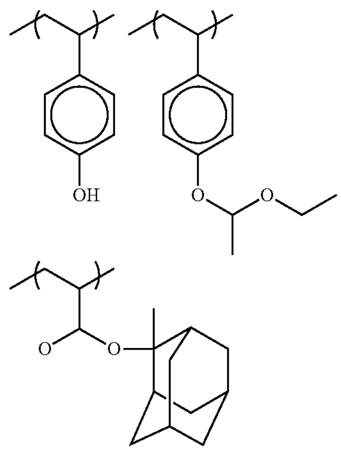

(R-17)

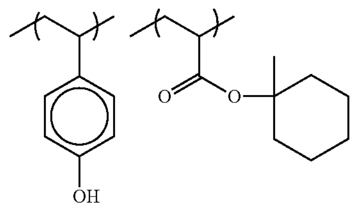

In these specific examples, tBu indicates a tert-butyl group.

The content of the acid-decomposable group is expressed by B/(B+S) using the number (B) of acid-decomposable groups in the hydroxystyrene-based acid-decomposable resin and the number (S) of alkali-soluble groups not protected by a group which leaves under the action of an acid. The content is preferably from 0.01 to 0.7, more preferably from 0.05 to 0.50, still more preferably from 0.05 to 0.40.

The acid-decomposable resin (A) for use in the present invention can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the resist composition of the present invention. By the use of this solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The purification may be performed by the same method as that for the resin (C) described later, and a normal method, for example, a liquid-liquid extraction method of applying water washing or combining an appropriate solvent to remove residual monomers or oligomer components, a purification method in a solution sate, such as ultrafiltration of removing by extraction only polymers having a molecular weight lower than a specific molecular weight, a reprecipitation method of adding dropwise the resin solution in a bad solvent to solidify the resin in the bad solvent and thereby remove residual monomers or the like, or a purification method in a solid state, such as washing of the resin slurry with, a bad solvent after separation by filtration, may be applied.

The weight average molecular weight of the acid-decomposable resin (A) for use in the present invention is preferably from 1,000 to 200,000, more preferably from 3,000 to 20,000, and most preferably from 5,000 to 15,000, in terms of polystyrene by the GPC method. When the weight average molecular weight is from 1,000 to 200,000, the heat resistance, dry etching resistance and developability can be prevented from deterioration and also, the deterioration in the film-forming property due to high viscosity can be prevented.

Another preferred embodiment of the weight average molecular weight of the acid-decomposable resin (A) for use in the present invention is from 3,000 to 9,500 in terms of polystyrene by the GPC method. When the weight average molecular weight is from 3,000 to 9,500, particularly the resist residue (hereinafter sometimes referred to as "scum") is reduced and a better pattern can be formed.

The dispersity (molecular weight distribution) is usually from 1 to 5, preferably from 1 to 3, more preferably from 1.2 to 3.0, still more preferably from 1.2 to 2.0. As the dispersity is smaller, the resolution and resist profile are more excellent, the side wall of the resist pattern is smoother, and the property in terms of roughness is more improved.

in the positive resist composition of the present invention, the amount of all acid-decomposable resin (A) for use in the present invention blended in the entire composition is preferably from 50 to 99.9 mass %, more preferably from 60 to 99.0 mass %, based on the entire solid content.

In the present invention, one resin may be used or a plurality of resins may be used in combination.

The acid-decomposable resin (A) for use in the present invention preferably contains no fluorine or silicon atom in view of compatibility with the resin (D).

(B) Compound Capable of Generating an Acid upon Irradiation with Actinic Rays or Radiation The positive resist composition of the present invention contains a compound capable of generating an acid upon irradiation with actinic rays or radiation (sometimes referred to as a "photoacid generator" or "component (B)").

The photoacid generator which can be used may be appropriately selected from a photoinitiator for photocationic polymerization, a photoinitiator for photoradical polymerization, a photo-decoloring agent for coloring matters, a photo-discoloring agent, a known compound used for microresist or the like and capable of generating an acid upon irradiation with actinic rays or radiation, and a mixture thereof.

Examples thereof include a diazonium salt, a phosphonium salt, a sulfonium salt, an iodonium salt, an imidosulfonate, an oxime sulfonate a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with actinic rays or radiation, preferred are the compounds represented by the following formulae (ZI), (ZII) and (ZIII):

ZI

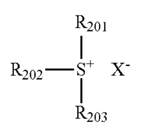

ZII

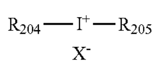

ZIII

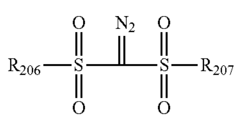

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae:

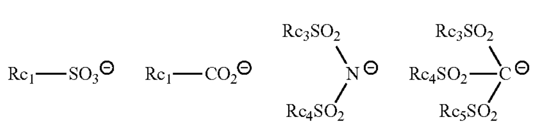

In the formulae, $Rc_1$ represents an organic group.

The organic group of $Rc_1$ includes an organic group having a carbon number of 1 to 30, and preferred examples thereof include an alkyl group which may be substituted, an aryl group, and a group where a plurality of these groups are connected through a single bond or a linking group such as —O—, —$CO_2$—, —S—, —$SO_3$— and —$SO_2N(Rd_1)$-. $Rd_1$ represents a hydrogen atom or an alkyl group.

$Rc_3$, $Rc_4$ and $Rc_5$ each independently represents an organic group. Preferred organic groups of $Rc_3$, $Rc_4$ and $Rc_5$ are the same as preferred organic groups in $Rc_1$. The organic group is most preferably a perfluoroalkyl group having a carbon number of 1 to 4.

$Rc_3$ and $Rc_4$ may combine to form a ring. The group formed after $Rc_3$ and $Rc_4$ are combined includes an alkylene group and an arylene group, and a perfluoroalkylene group having a carbon number of 2 to 4 is preferred.

The organic group of $Rc_1$ and $Rc_3$ to $Rc_5$ is particularly preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light increases and the sensitivity is enhanced. Also, when $Rc_3$ and $Rc_4$ are combined to form a ring, the acidity of the acid generated upon irradiation with light increases and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed after two members out of $R_{201}$ to $R_{203}$ are combined include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the ease where $R_{201}$ to $R_{203}$ are an aryl group, the substituent is preferably substituted at the p-position of the aryl group.

The compound (ZI-2) is described below. The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be,either linear or branched and includes a linear or branched alkyl group preferably having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

The cycloalkyl group as $R_{201}$ to $R_{203}$ includes a cycloalkyl group preferably having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

The linear, branched or cyclic 2-oxoalkyl group as $R_{201}$ to $R_{203}$ is preferably a group having >C═O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

(ZI-3)

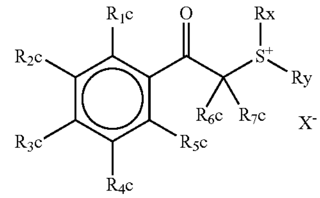

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure, and the ring structure may contain an oxygen atom, a sulfur atom, an ester bond or an amide bond. Examples of the group formed after any two or more members out of $R_{1c}$ to $R_{7c}$ or a pair of $R_x$ and $R_y$ are combined include a butylene group and a pentylene group.

$X^-$ represents a non-nucleophilic anion, and examples thereof are the same as those of the non-nucleophilic anion of $X^-$ in formula (ZI).

The alkyl group as $R_{1c}$ to $R_{7c}$ may be linear or branched and includes, for example, a linear or branched alkyl group having a carbon number of 1 to 20, preferably a linear or branched alkyl group having a carbon number of 1 to 12 (for example, a methyl group, an ethyl group, a linear or branched propyl group, a linear or branched butyl group, and a linear or branched pentyl group).

The cycloalkyl group as $R_{1c}$ to $R_{7c}$ includes a cycloalkyl group preferably having a carbon number of 3 to 8 (e.g., cyclopentyl, cyclohexyl).

The alkoxy group as $R_{1c}$ to $R_{5c}$ may be linear, branched or cyclic and includes, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, and a linear or branched pentoxy group), and a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of this construction, the solubility in a solvent is more enhanced and generation of particles during storage is suppressed.

The alkyl group as $R_x$ and $R_y$ is the same as the alkyl group of $R_{1c}$ to $R_{7c}$. The alkyl group as $R_x$ and $R_y$ is preferably a linear or branched 2-oxoalkyl group or an alkoxycarbonylmethyl group.

The cycloalkyl group as $R_x$ and $R_y$ is the same as the cycloalkyl group of $R_{1c}$ to $R_{7c}$. The cycloalkyl group as $R_x$ to $R_y$ is preferably a cyclic 2-oxoalkyl group.

The linear, branched or cyclic 2-oxoalkyl group includes a group having >C═O at the 2-position of the alkyl group or cycloalkyl group as $R_{1c}$ to $R_{7c}$.

The alkoxy group in the alkoxycarbonylmethyl group is the same as the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group of $R_{204}$ to $R_{207}$ may be linear or branched and includes a linear or branched alkyl group preferably having a carbon number of 1 to 10 (e.g., methyl, ethyl, propyl, butyl, pentyl).

The cycloalkyl group of $R_{204}$ to $R_{207}$ includes a cycloalkyl group preferably having a carbon number of 3 to 10 (e.g., cyclopentyl, cyclohexyl, norbornyl).

$R_{204}$ to $R_{207}$ each may have a substituent. Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and is the same as the non-nucleophilic anion of $X^-$ in formula (ZI).

Out of the compounds capable of generating an acid upon irradiation with actinic rays or radiation, preferred compounds further include the compounds represented by the following formulae (ZIV), (ZV) and (ZVI):

$$Ar_3—SO_2—SO_2—Ar_4 \quad \text{ZIV}$$

ZV

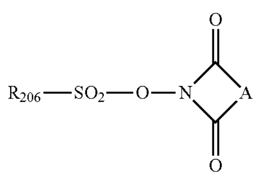

ZVI

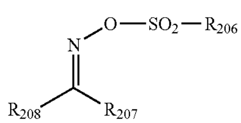

In formulae (ZIV) to (ZVI), $Ar_3$ and $Ar_4$ each independently represents an aryl group.

$R_{206}$ represents an alkyl group or an aryl group.

$R_{207}$ and $R_{208}$ each independently represents an alkyl group, an aryl group or an electron-withdrawing group. $R_{207}$ is preferably an aryl group.

$R_{208}$ is preferably an electron-withdrawing group, more preferably a cyano group or a fluoroalkyl group.

A represents an alkylene group, an alkenylene group or an arylene group.

The compound capable of generating an acid upon irradiation with actinic rays or radiation is preferably a compound represented by any one of formulae (ZI) to (ZIII).

The compound (B) is preferably a compound capable of generating a fluorine atom-containing aliphatic sulfonic acid or fluorine atom-containing benzenesulfonic acid upon irradiation with actinic rays or radiation.

The compound (B) preferably has a triphenylsulfonium structure.

The compound (B) is preferably a triphenylsulfonium salt compound having a fluorine-unsubstituted alkyl or cycloalkyl group in the cation moiety.

Particularly preferred examples out of the compounds capable of generating an acid upon irradiation with actinic rays or radiation are set forth below.

(z1)

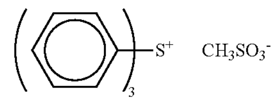

(z2)

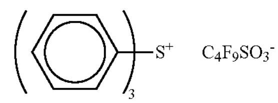

(z3)

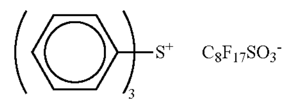

(z4)

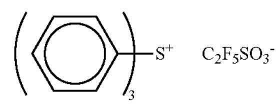

(z5)

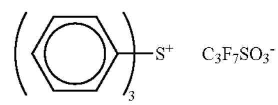

(z6)

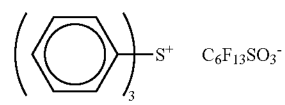

(z7)

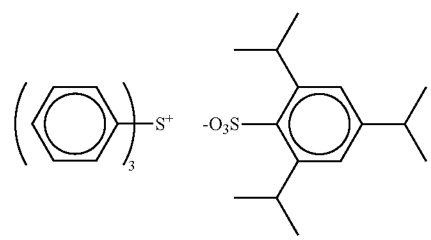

(z8)

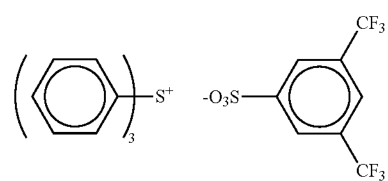

(z9)

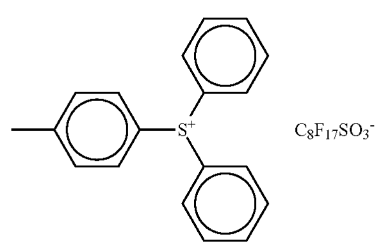

(z10)

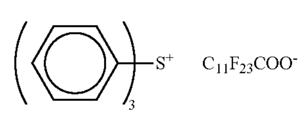

-continued
(z11)
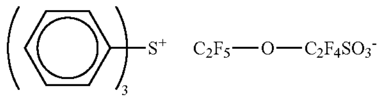
(z12)
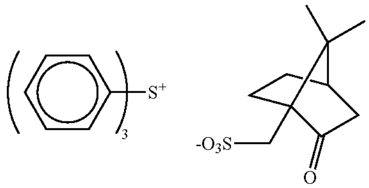
(z13)
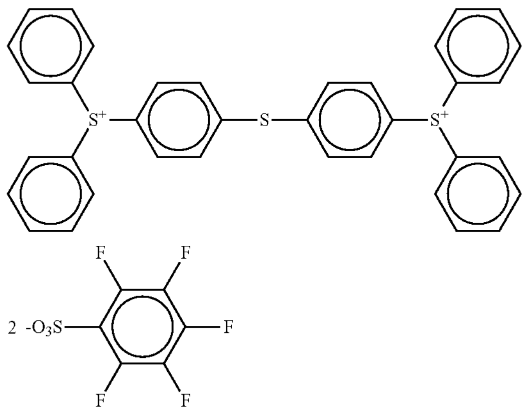
(z14)
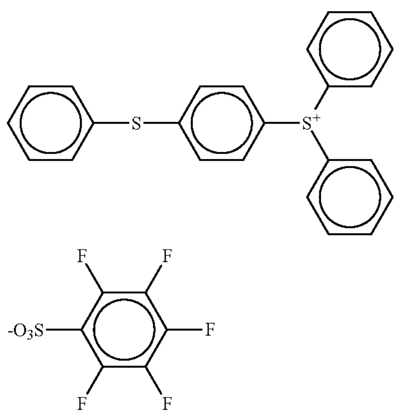
(z15)
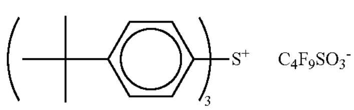
(z16)
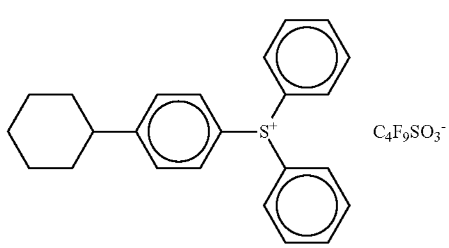
-continued
(z17)
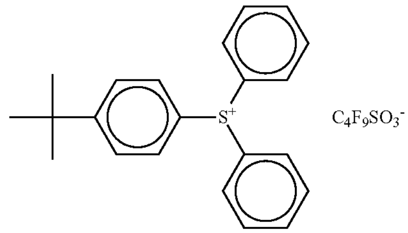
(z18)
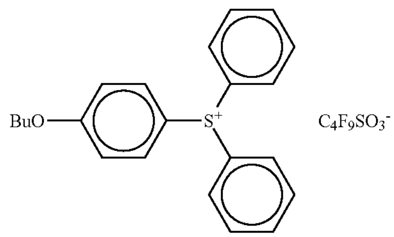
(z19)
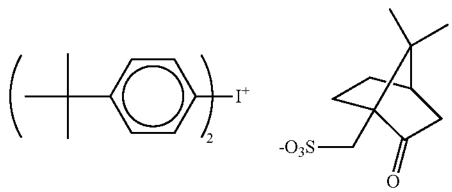
(z20)
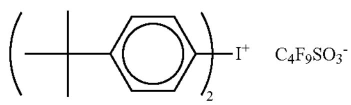
(z21)
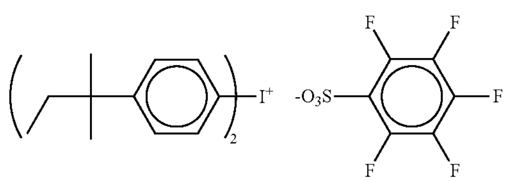
(z22)
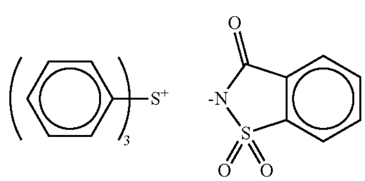
(z23)
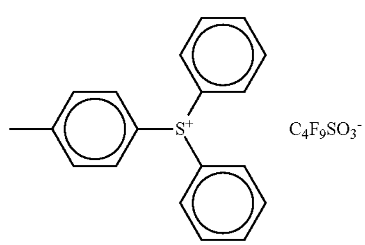
(z24)
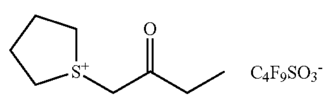

-continued
(z25)
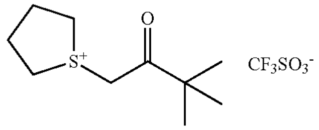
(z26)
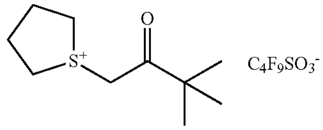
(z27)
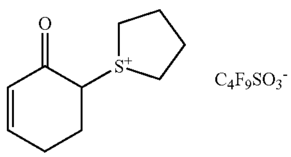
(z28)
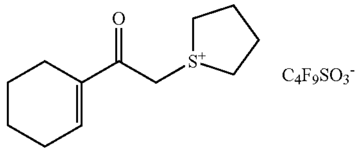
(z29)
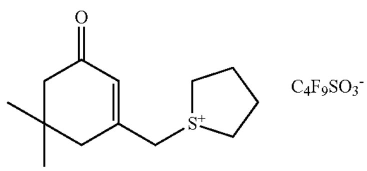
(z30)
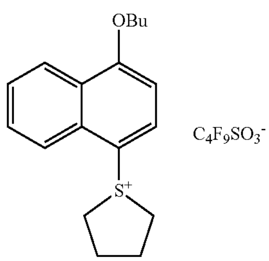
(z31)
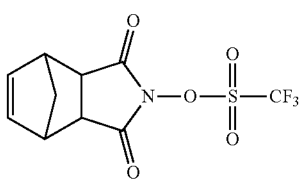
(z32)
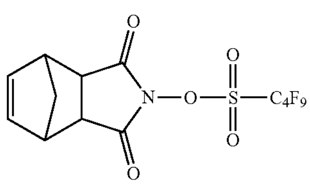
(z33)
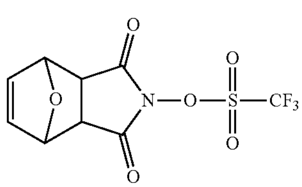
-continued
(z34)
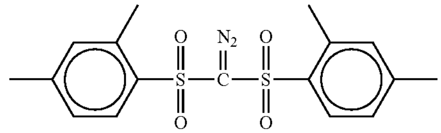
(z35)
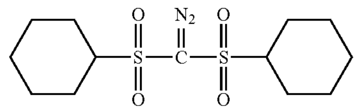
(z36)
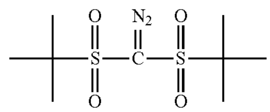
(z37)
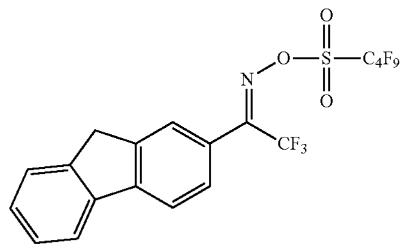
(z38)
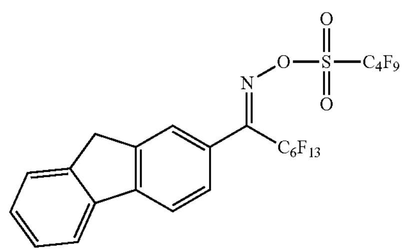
(z39)
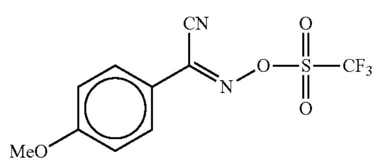
(z40)
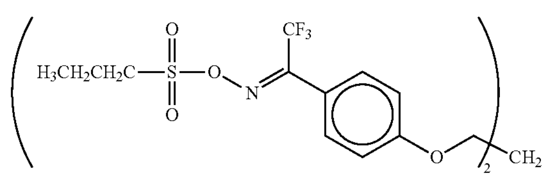
(z41)
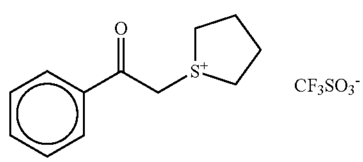
(z42)
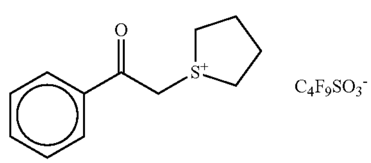

-continued
(z43)
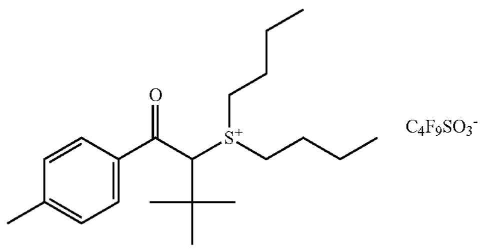
(z44)
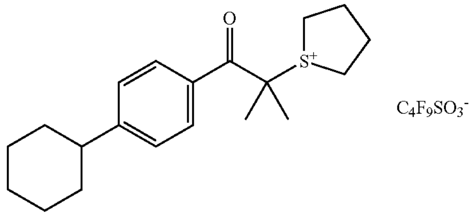
(z45)
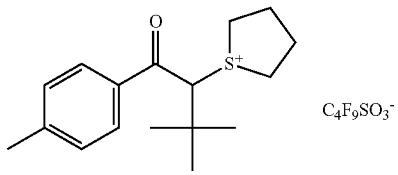
(z46)
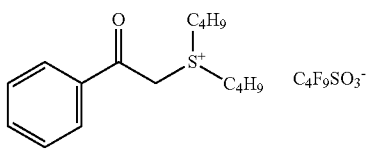
(z47)
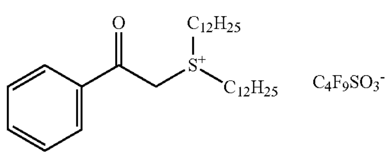
(z48)
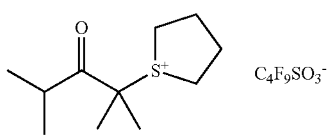
(z49)
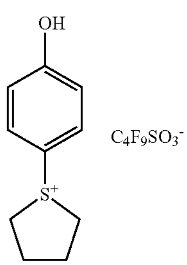
(z50)
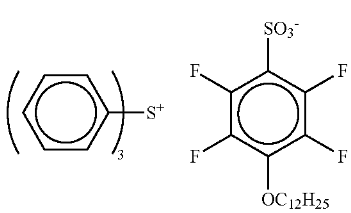
-continued
(z51)
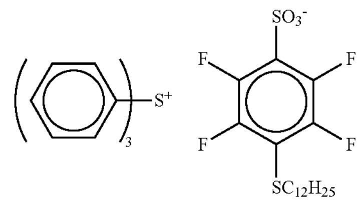
(z52)
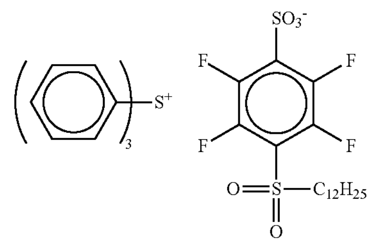
(z53)
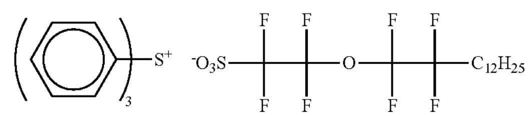
(z54)
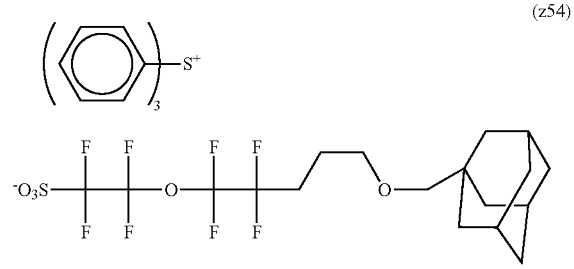
(z55)
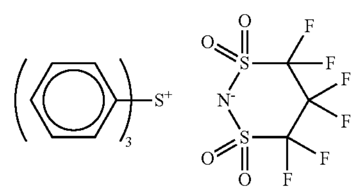
(z56)
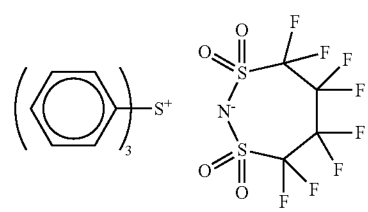
(z57)
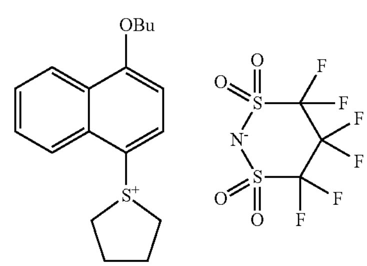

-continued
(z58)
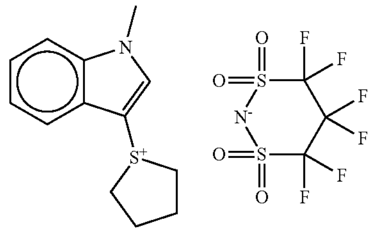
(z59)
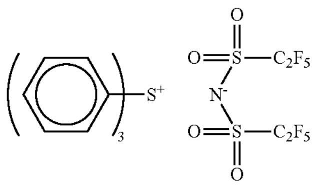
(z60)
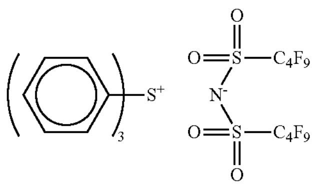
(z61)
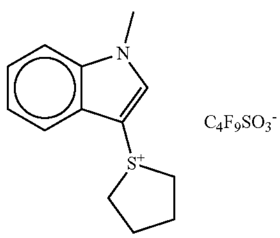
(z62)
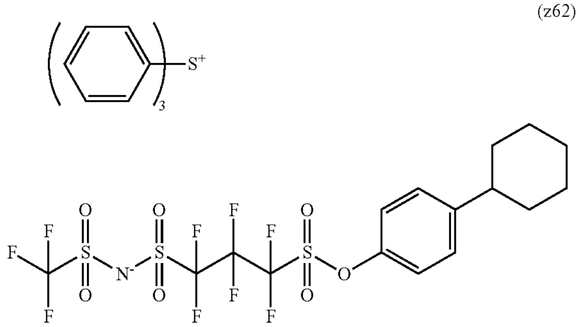
(z63)
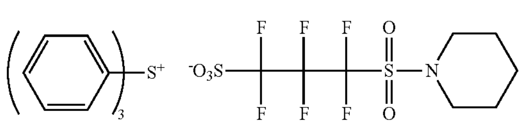
(z64)
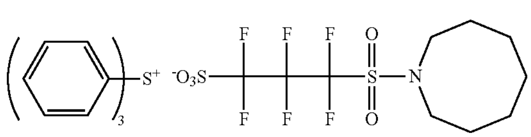
(z65)
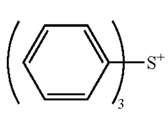
-continued
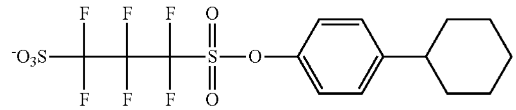
(z66)
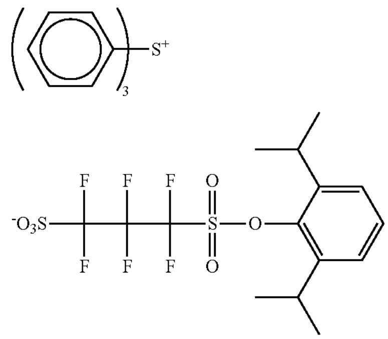
(z67)
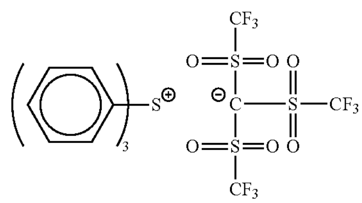
(z68)
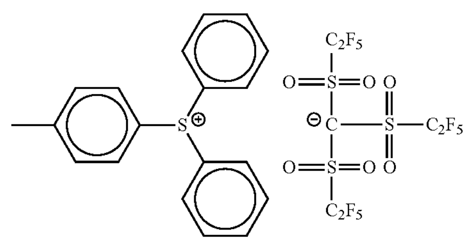
(z69)
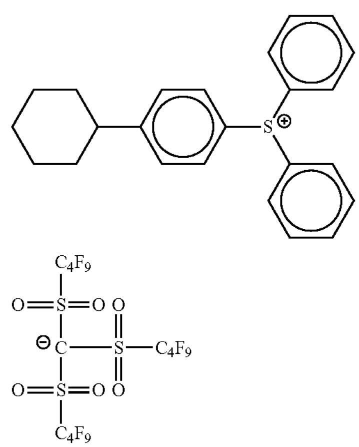
(z70)
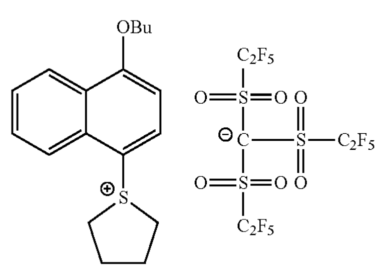

(z71)
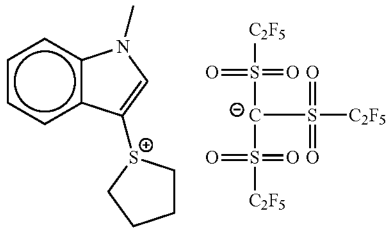
(z72)
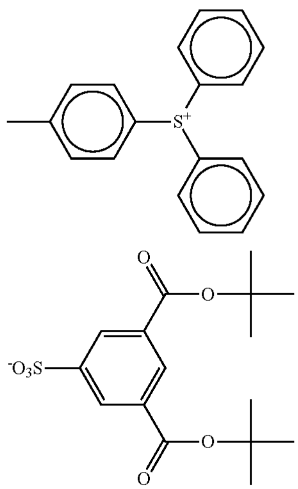
(z73)
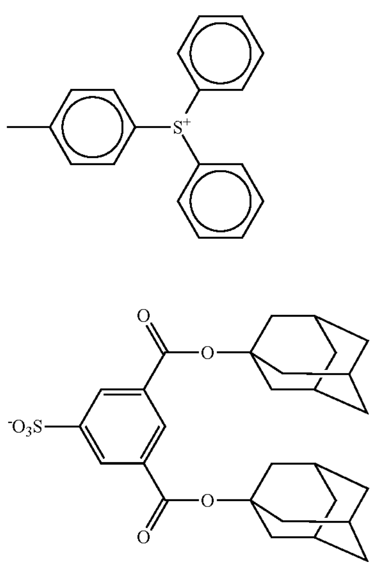
(z74)
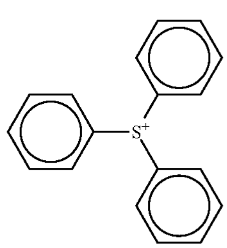
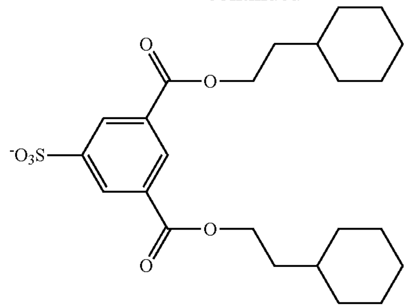
(z75)
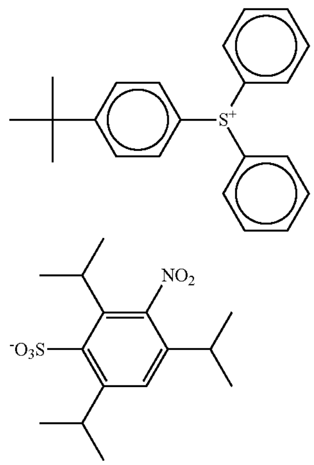
(z76)
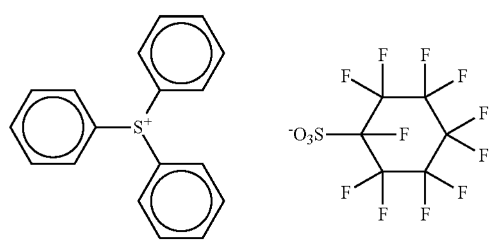
(z77)
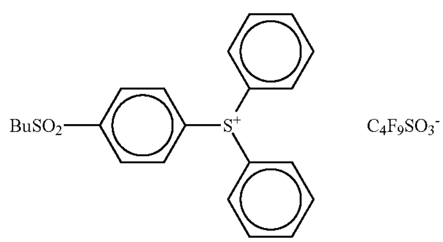
(z78)
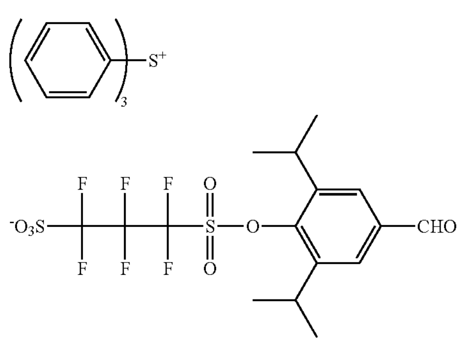
One of these photoacid generators may be used alone, or two or more species thereof may be used in combination. In the case of using two or more species in combination, compounds capable of generating two kinds of organic acids differing in the total atom number except for hydrogen atom by 2 or more are preferably combined.

The content of the photoacid generator is preferably from 0.1 to 20 mass %, more preferably from 0.5 to 10 mass %, still more preferably from 1 to 7 mass %, based on the entire solid content of the positive resist composition.

(C) Solvent

Examples of the solvent which can be used for dissolving respective components described above to prepare a positive resist composition include an organic solvent such as alkylene glycol monoalkyl ether carboxylate, alkylene glycol monoalkyl ether, alkyl lactate, alkyl alkoxypropionate, cyclic lactone having a carbon number of 4 to 10, monoketone compound having a carbon number of 4 to 10 which may contain a ring, alkylene carbonate, alkyl alkoxyacetate and allyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone having a carbon number of 4 to 10 include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound having a carbon number of 4 to 10 which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used is a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more species thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more species including propylene glycol monomethyl acetate.

(D) Resin having at least either a Fluorine Atom or a Silicon Atom

The positive resist composition of the present invention preferably contains (D) a resin having at least either a fluorine atom or a silicon atom.

In the resin (D), the fluorine atom or silicon atom may be present in the main chain of the resin or may be substituted to the side chain.

The resin (D) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have another substituent.

The fluorine atom-containing cycloalkyl group is a monocyclic or polycyclic cycloalkyl group with at least one hydrogen atom being substituted by a fluorine atom and may further have another substituent.

The fluorine atom-containing aryl group is an aryl group (e.g., phenyl, naphthyl) with at least one hydrogen atom being substituted by a fluorine atom and may further have another substituent.

Specific examples of the fluorine atom-containing alkyl group, fluorine atom-containing cycloalkyl group and fluorine atom-containing aryl group are set forth below, but the present invention is not limited thereto.

(F2)

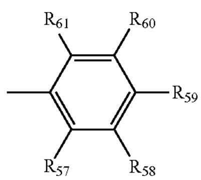

(F3)

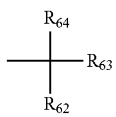

(F4)

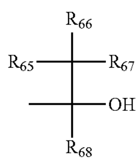

In formulae (F2) to (F4), $R_{57}$ to $R_{63}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoroethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The resin (D) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

(CS-1)

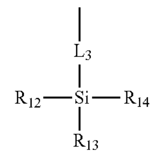

(CS-2)

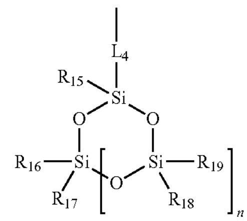

(CS-3)

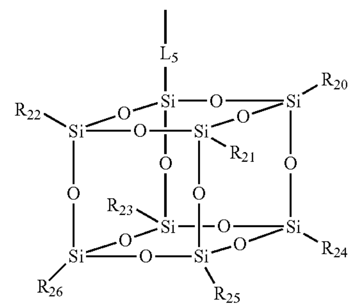

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each represents a single bond or a divalent linking group. The divalent linking group is a sole group or a combination of two or more groups selected from the group consisting of an alkylene group, a phenyl group, an ether group, a thioether group, a carbonyl group, an ester group, an amide group, a urethane group and a urea group. n represents an integer of 1 to 5.

The resin (D) is preferably a resin containing at least one member selected from the group consisting of repeating units represented by the following formulae (C-I) to (C-V):

(C-I)

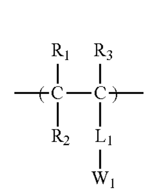

(C-II)

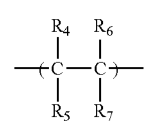

(C-III)

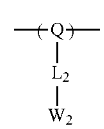

-continued (C-IV)

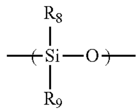

(C-V)

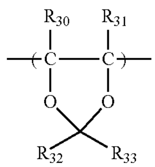

In formulae (C-I) to (C-V), $R_1$ to $R_3$ each independently represents a hydrogen atom, a fluorine atom, a linear or branched alkyl group having a carbon number of 1 to 4, or a linear or branched fluorinated alkyl group having a carbon number of 1 to 4.

$W_1$ and $W_2$ each represents an organic group having at least either a fluorine atom or a silicon atom.

$R_4$ to $R_7$ each independently represents a hydrogen atom, a fluorine atom, a linear or branched alkyl group having a carbon number of 1 to 4, or a linear or branched fluorinated alkyl group having a carbon number of 1 to 4, provided that at least one of $R_4$ to $R_7$ represents a fluorine atom. $R_4$ and $R_5$, or $R_6$ and $R_7$ may form a ring.

$R_8$ represents a hydrogen atom or a linear or branched alkyl group having a carbon number of 1 to 4.

$R_9$ represents a linear or branched alkyl group having a carbon number of 1 to 4, or a linear or branched fluorinated alkyl group having a carbon number of 1 to 4.

$L_1$ and $L_2$ each represents a single bond or a divalent linking group and is the same as $L_3$ to $L_5$ above.

Q represents a monocyclic or polycyclic aliphatic group, that is, an atomic group for forming an alicyclic structure, including the two bonded carbon atoms (C—C).

$R_{30}$ and $R_{31}$ each independently represents a hydrogen or fluorine atom.

$R_{32}$ and $R_{33}$ each independently represents an alkyl group, a cycloalkyl group, a fluorinated alkyl group or a fluorinated cycloalkyl group.

Here, the repeating unit represented by formula (C-V) has at least one fluorine atom in at least one member out of $R_{30}$, $R_{31}$, $R_{32}$ and $R_{33}$.

The resin (D) preferably has a repeating unit represented by formula (C-I), more preferably a repeating unit represented by any one of the following formulae (C-Ia) to (C-Id):

(C-Ia)

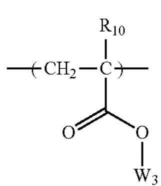

(C-Ib)

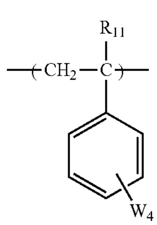

-continued (C-Ic)

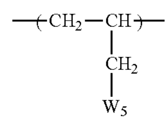

(C-Id)

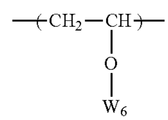

In formulae (C-Ia) to (C-Id), $R_{10}$ and $R_{11}$ each represents a hydrogen atom, a fluorine atom, a linear or branched alkyl group having a carbon number of 1 to 4, or a linear or branched fluorinated alkyl group having a carbon number of 1 to 4.

$W_3$ to $W_6$ each represents an organic group having one or more of at least either a fluorine atom or a silicon atom.

When $W_1$ to $W_6$ are an organic group having a fluorine atom, the organic group is preferably a fluorinated linear or branched alkyl or cycloalkyl group having a carbon number of 1 to 20, or a fluorinated linear, branched or cyclic alkyl ether group having a carbon number of 1 to 20.

Examples of the fluorinated alkyl group of $W_1$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-tert-butyl group, a perfluoroisopentyl group, a perfluorooctyl group and a perfluoro(trimethyl)hexyl group.

When $W_1$ to $W_6$ are an organic group having a silicon atom, the organic group preferably has an alkylsilyl structure or a cyclic siloxane structure. Specific examples thereof include the groups represented by formulae (CS-1) to (CS-3).

Specific examples of the repeating unit represented by formula (C-I) are set forth below. X represents a hydrogen atom, —$CH_3$, —F or —$CF_3$.

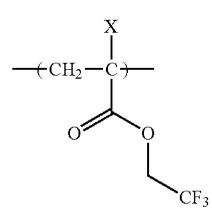

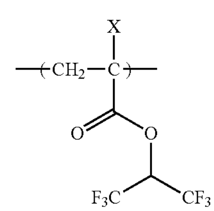

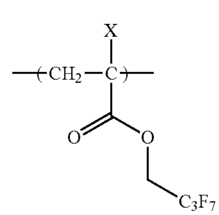

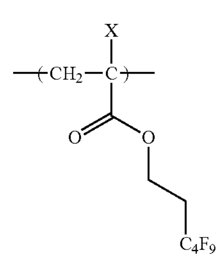

-continued
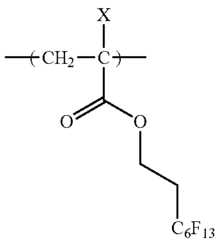
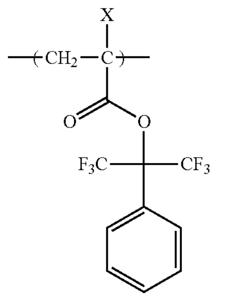
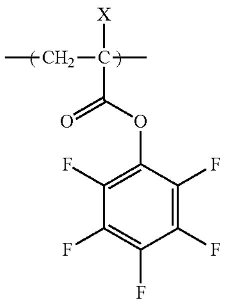
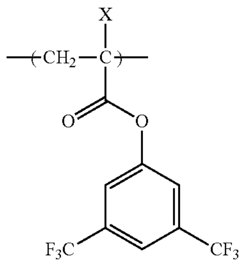
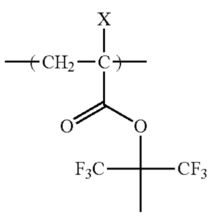
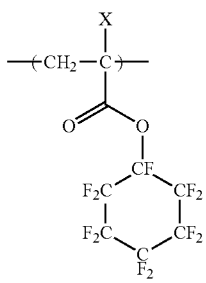
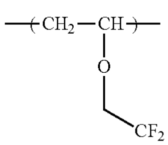
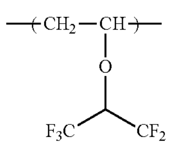
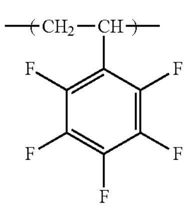
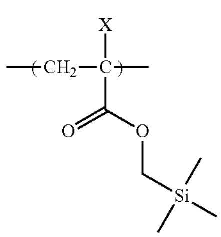
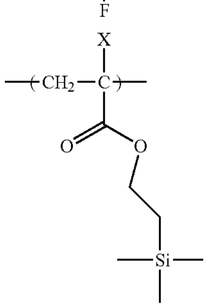
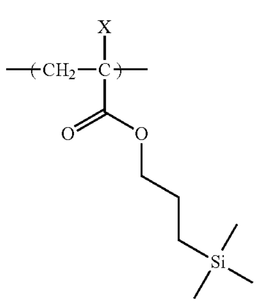
-continued
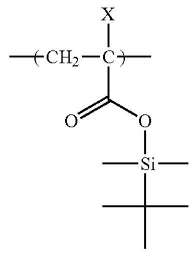
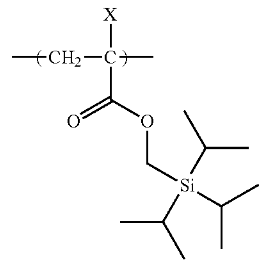
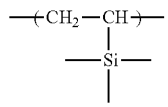
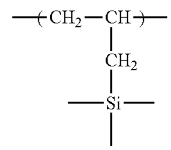
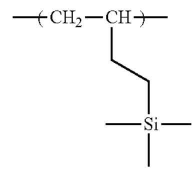
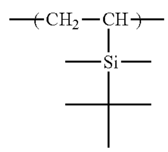
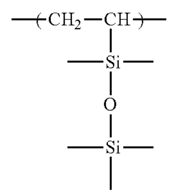
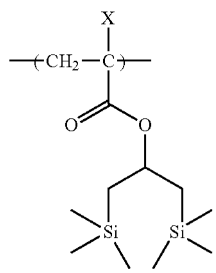
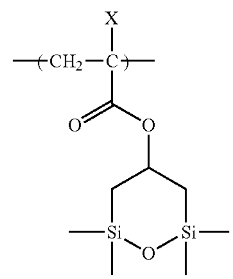
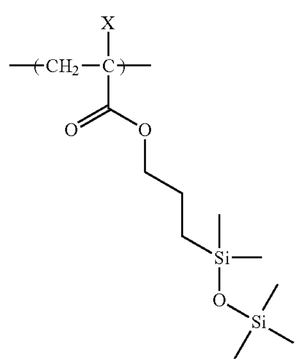
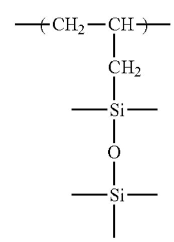
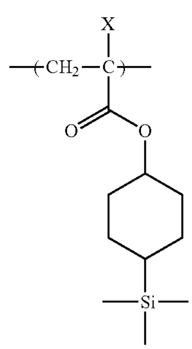
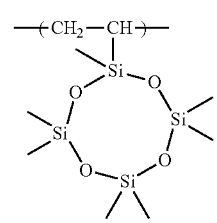

-continued

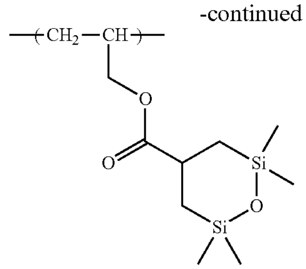

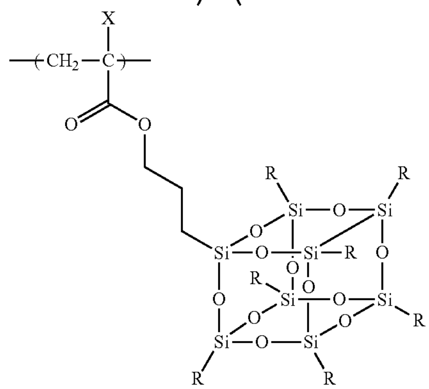

R = $CH_3$, $C_2H_5$, $C_3H_7$, $C_4H_9$

The resin (D) is preferably any one resin selected from the following (D-1) to (D-6):

(D-1) a resin containing (a) a repeating unit having a fluoroalkyl group (preferably having a carbon number of 1 to 4), more preferably containing only the repeating unit (a), (D-2) a resin containing (b) a repeating unit having a trialkylsilyl group or a cyclic siloxane structure, more preferably containing only the repeating unit (b), (D-3) a resin containing (a) a repeating unit having a fluoroalkyl group (preferably having a carbon number of 1 to 4) and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymerization resin of the repeating unit (a) and the repeating unit (c), (D-4) a resin containing (b) a repeating unit having a trialkylsilyl group or a cyclic siloxane structure and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymerization resin of the repeating unit (b) and the repeating unit (c), (D-5) a resin containing (a) a repeating unit having a fluoroalkyl group (preferably having a carbon number of 1 to 4) and (b) a repeating unit having a trialkylsilyl group or a cyclic siloxane structure, more preferably a copolymerization resin of the repeating unit (a) and the repeating unit (b), and (D-6) a resin containing (a) a repeating unit having a fluoroalkyl group (preferably having a carbon number of 1 to 4), (b) a repeating unit having a trialkylsilyl group or a cyclic siloxane structure, and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymerization resin of the repeating unit (a), the repeating unit (b) and the repeating unit (c).

As for the repeating unit (c) having a branched alkyl group, a cycloalkyl group, a branched alkenyl group, a cycloalkenyl group or an aryl group in the resins (D-3), (D-4) and (D-6), an appropriate functional group can be introduced considering the hydrophilicity/hydrophobicity, interaction and the like, but in view of followability of immersion liquid or receding contact angle, a functional group having no polar group is preferred.

In the resins (D-3), (D-4) and (D-6), the content of the repeating unit (a) having a fluoroalkyl group and/or the repeating unit (b) having a trialkylsilyl group or a cyclic siloxane structure is preferably from 20 to 99 mol %.

Incidentally, the receding contact angle is a contact angle measured when a contact line recedes on the liquid droplet-substrate interface, and is generally known to be useful in simulating the mobility of a liquid droplet in the dynamic state. In a simple manner, the receding contact angle can he defined as a contact angle created by the liquid droplet interface on receding when a liquid droplet ejected from a needle tip is landed on a substrate and then the liquid droplet is again sucked into the needle. The receding contact angle can be generally measured by a contact angle measuring method called an expansion/contraction method.

In the immersion exposure step, the immersion liquid needs to move on a wafer following the movement of an exposure head when scanning the wafer at a high speed and forming an exposure pattern. Therefore, the contact angle of the immersion liquid in a dynamic state with the resist film is important and the resist is required to have a performance of allowing a liquid droplet to follow the high-speed scanning of an exposure head without remaining.

The resin (D) is preferably a resin having a repeating unit represented by the following formula (Ia):

(Ia)

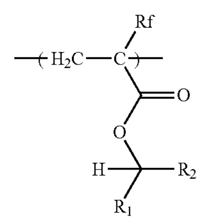

In formula (Ia), Rf represents a fluorine atom or an alkyl group with at least one hydrogen atom being substituted by a fluorine atom.

$R_1$ represents an alkyl group.

$R_2$ represents a hydrogen atom or an alkyl group.

In formula (Ia), the alkyl group with at least one hydrogen atom being substituted by a fluorine atom of Rf is preferably an alkyl group having a carbon number of 1 to 3, more preferably a trifluoromethyl group.

The alkyl group of $R_1$ is preferably a linear or branched alkyl group having a carbon number of 3 to 10, more preferably a branched alkyl group having a carbon number of 3 to 10.

$R_2$ is preferably a linear or branched alkyl group having a carbon number of 1 to 10, more preferably a linear or branched alkyl group having a carbon number of 3 to 10.

Specific examples of the repeating unit represented by formula (Ia) are set forth below, but the present invention is not limited thereto.

X=F or $CF_3$

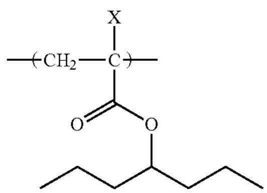

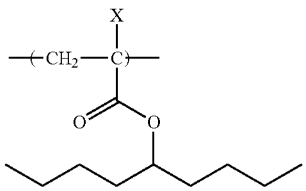

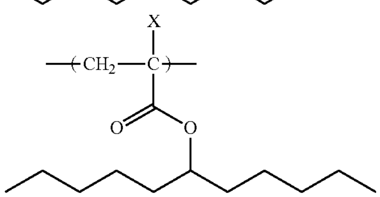

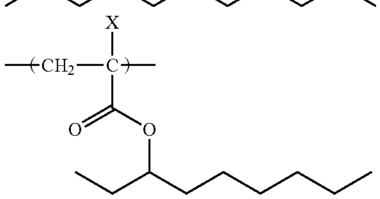

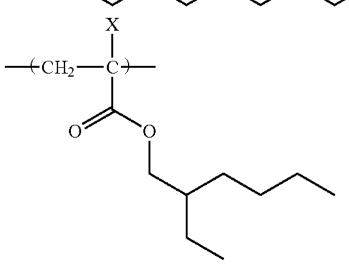

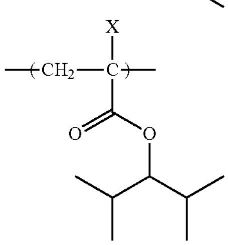

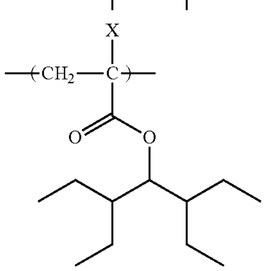

-continued

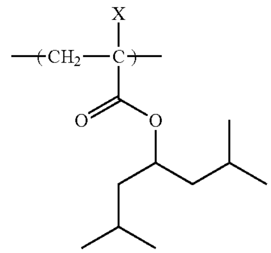

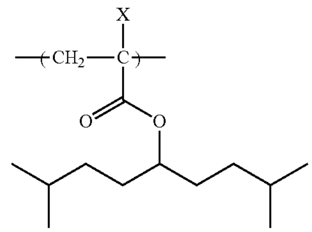

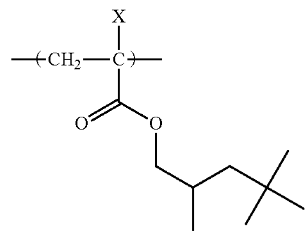

The repeating unit represented by formula (Ia) can be formed by polymerizing a compound represented by the following formula (I):

(I)

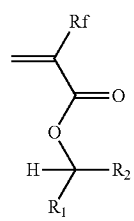

In formula (I), Rf represents a fluorine atom or an alkyl group with at least one hydrogen atom being substituted by a fluorine atom.

$R_1$ represents an alkyl group.

$R_2$ represents a hydrogen atom or an alkyl group.

Rf, $R_1$ and $R_2$ in formula (I) have the same meanings as Rf, $R_1$ and $R_2$ in formula (Ia).

The compound represented by formula (I) is a novel compound.

As for the compound represented by formula (I), a commercially available product or a compound synthesized may be used. In the case of synthesizing the compound, this can be attained by converting a 2-trifluoromethyl methacrylic acid into an acid chloride and then esterifying the acid chloride.

The resin (D) containing a repeating unit represented by formula (Ia) preferably further contains a repeating unit represented by the following formula (III):

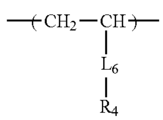

(III)

In formula (III), $R_4$ represents an alkyl group, a cycloalkyl group, an alkenyl group, a cycloalkenyl group, a trialkylsilyl group or a group having a cyclic siloxane structure.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The trialkylsilyl group is preferably a trialkylsilyl group having a carbon number of 3 to 20.

The group having a cyclic siloxane structure is preferably a group containing a cyclic siloxane structure having a carbon number of 3 to 20.

The divalent linking group of $L_6$ is preferably an alkylene group (preferably having a carbon number of 1 to 5) or an oxy group.

Specific examples of the resin (D) having a repeating unit represented by formula (Ia) are set forth below, but the present invention is not limited thereto.

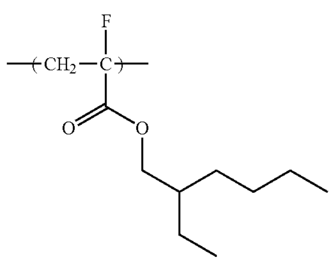

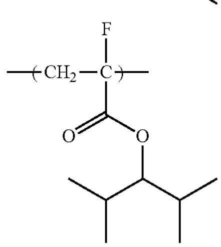

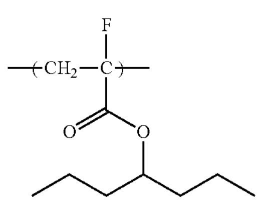

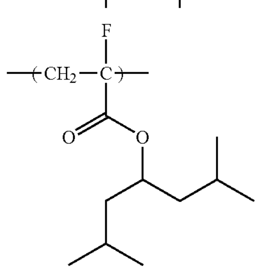

-continued

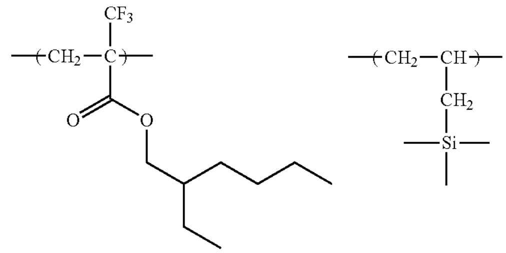

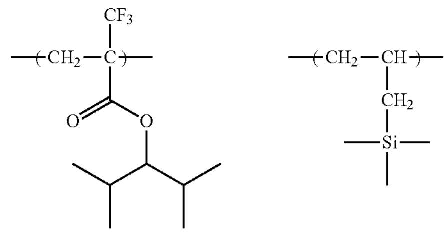

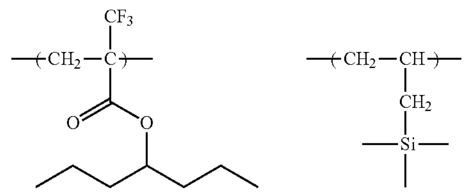

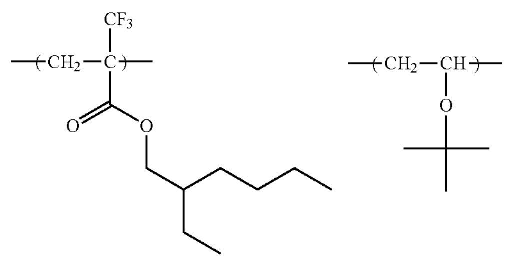

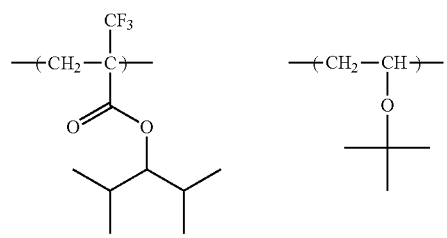

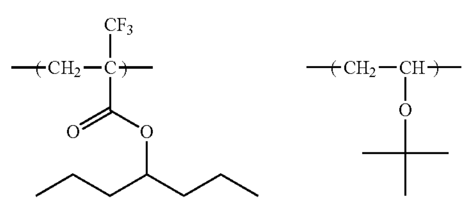

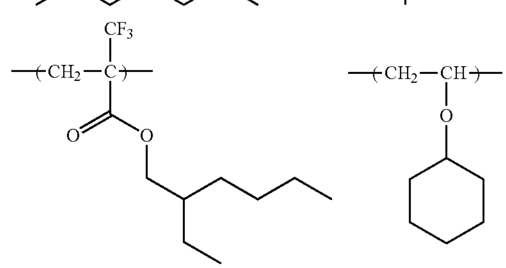

-continued
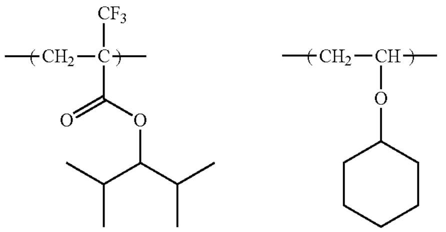
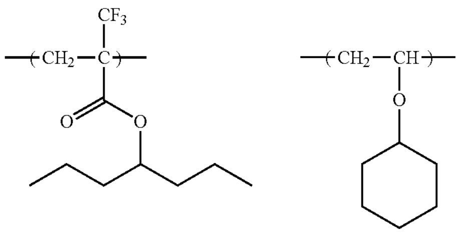
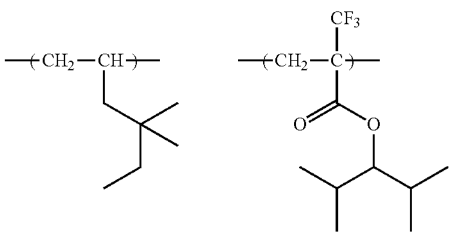
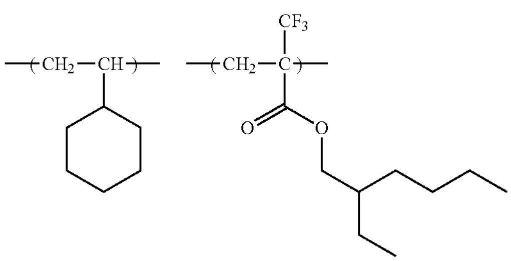
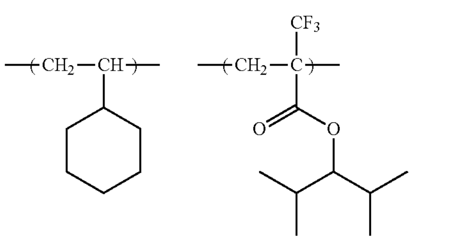
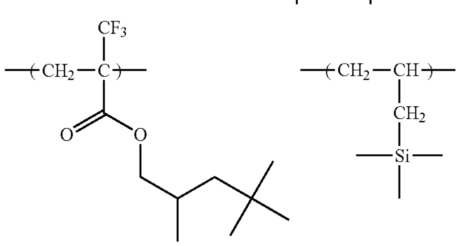
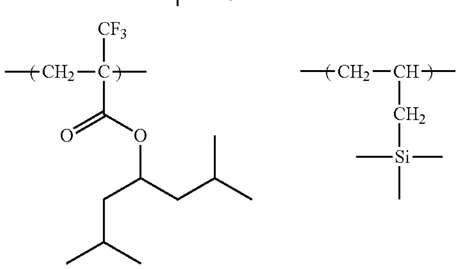
-continued
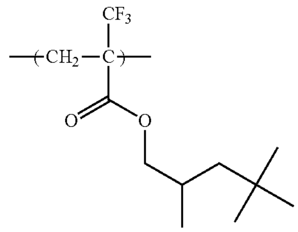
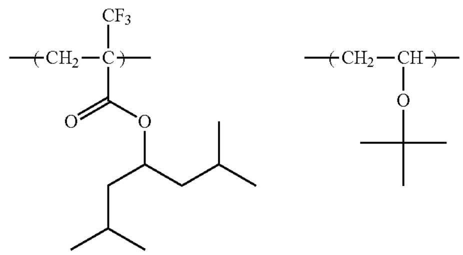
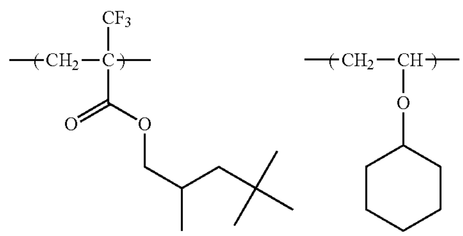
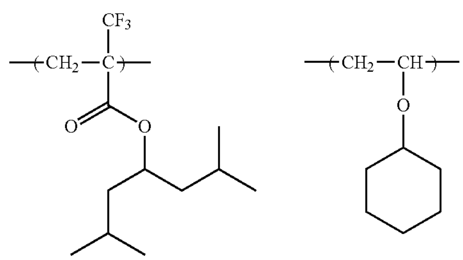
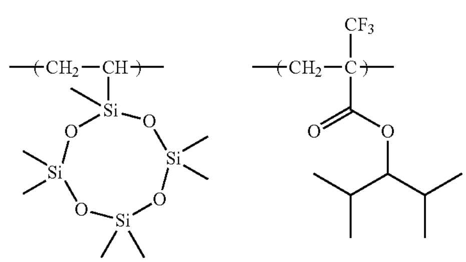
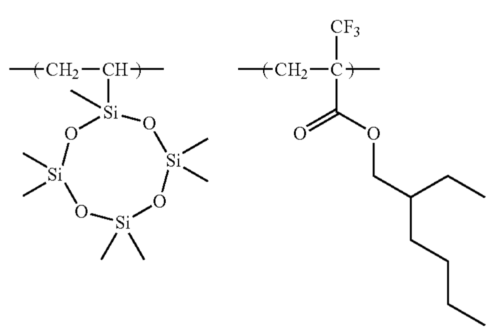

-continued

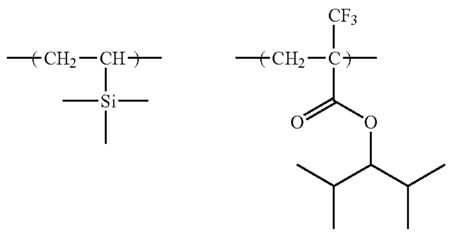

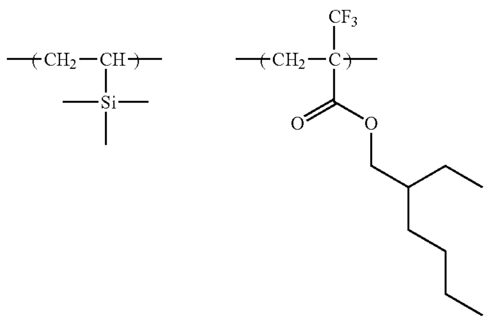

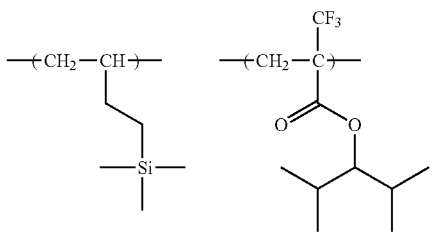

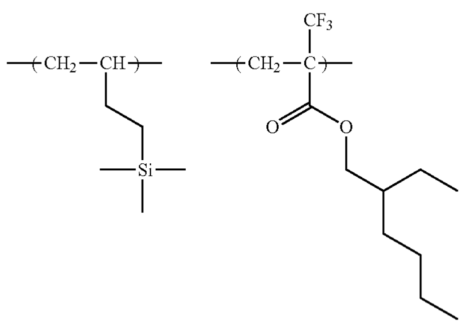

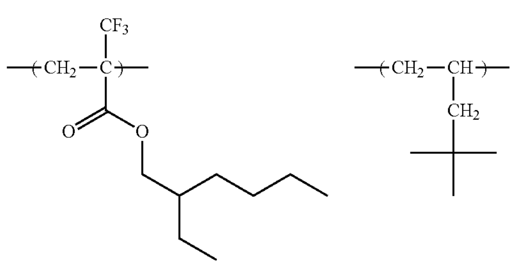

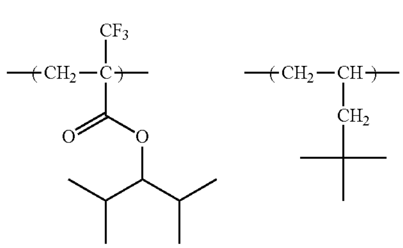

-continued

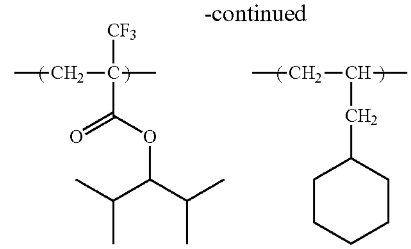

The resin (D) is preferably a resin containing a repeating unit represented by the following formula (II) and a repeating unit represented by the following formula (III):

(II)

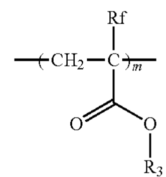

(III)

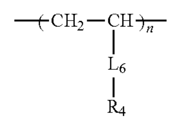

In formulae (II) and (III), Rf represents a fluorine atom or an alkyl group with at least one hydrogen atom being substituted by a fluorine atom.

$R_3$ represents an alkyl group, a cycloalkyl group, an alkenyl group, a cycloalkenyl group, or a group formed after two or more members thereof are combined.

$R_4$ represents an alkyl group, a cycloalkyl group, an alkenyl group, a cycloalkenyl group, a trialkylsilyl group, a group having a cyclic siloxane structure, or a group formed after two or more members thereof are combined.

In the alkyl group, cycloalkyl group, alkenyl group, cycloalkenyl group and trialkylsilyl group of $R_3$ and $R_4$, a functional group can be introduced but in view of followability of immersion liquid, a functional group not having a polar group is preferred, and an unsubstituted functional group is more preferred.

$L_6$ represents a single bond or a divalent linking group.

$0<m<100$.

$0<n<100$.

In formula (II), Rf has the same meaning as Rf in formula (Ia).

The alkyl group of $R_3$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$L_6$ is preferably a single bond, a methylene group, an ethylene group or an ether group.

m=30 to 70 and n=30 to 70 are preferred, and m=40 to 60 and n=40 to 60 are more preferred.

Specific examples of the resin (D) containing a repeating unit represented by formula (II) and a repeating unit represented by formula (III) are set forth below, but the present invention is not limited thereto.

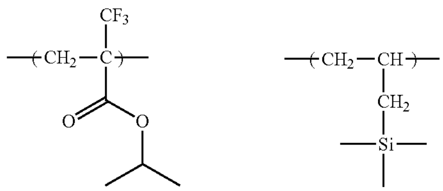
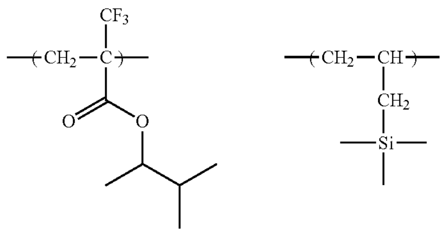
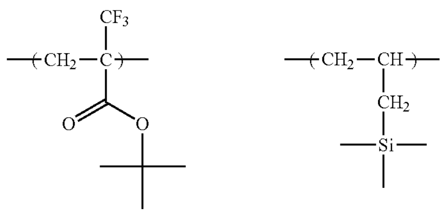
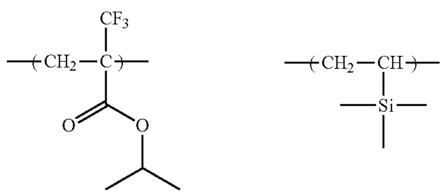
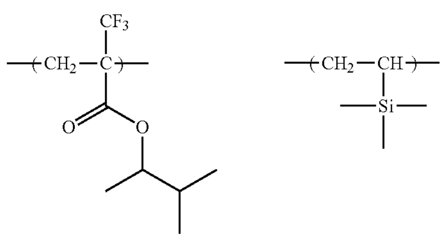
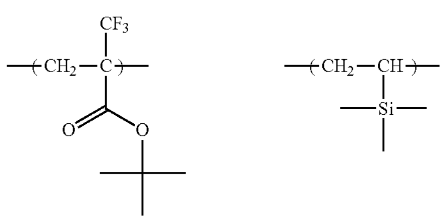
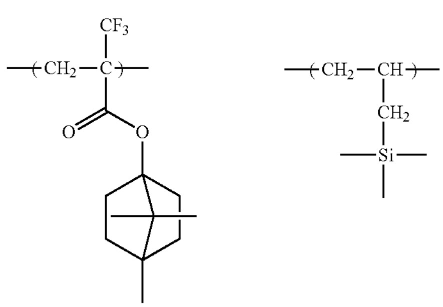
-continued
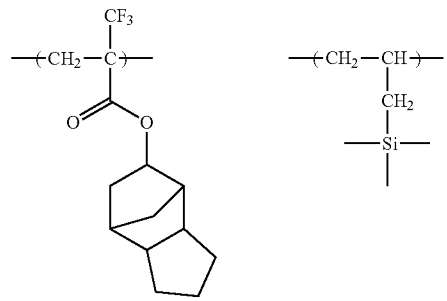
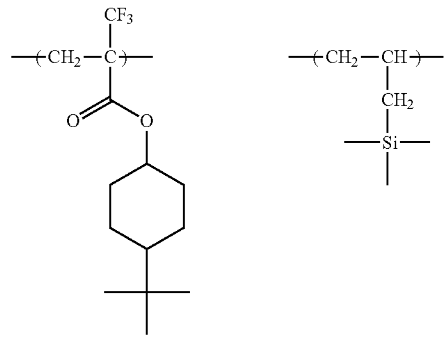
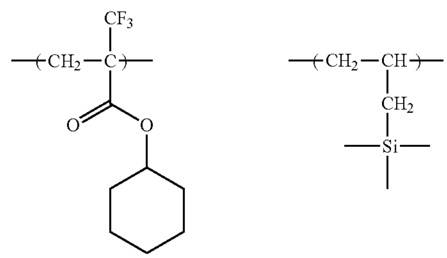
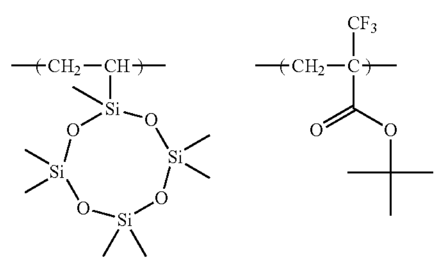
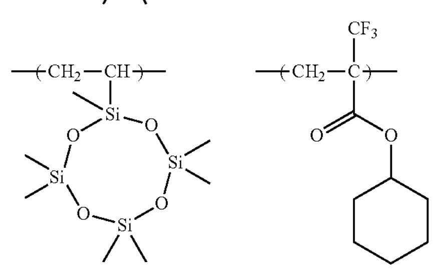
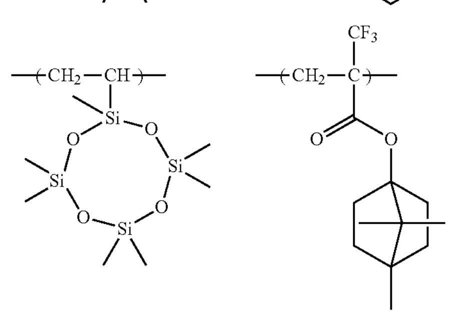

-continued

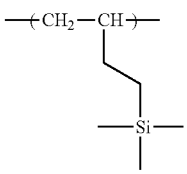

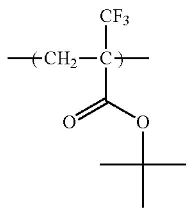

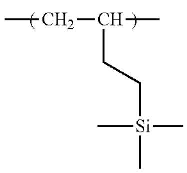

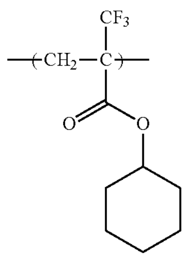

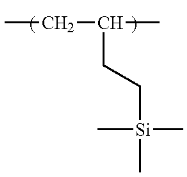

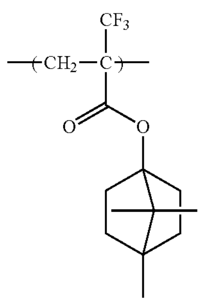

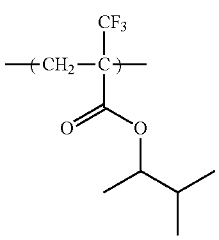

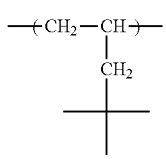

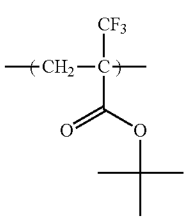

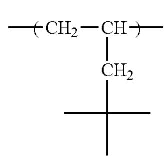

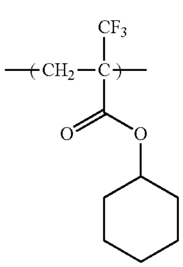

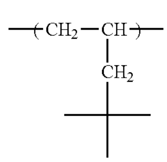

-continued

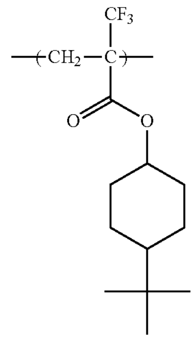

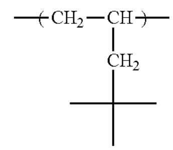

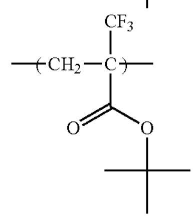

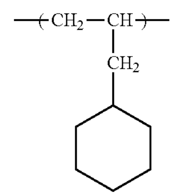

The resin (D) may contain a repeating unit represented by the following formula (VIII):

(VIII)

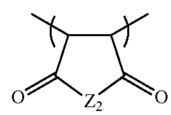

In formula (VIII), $Z_2$ represents —O— or —N($R_{41}$)—. $R_{41}$ represents a hydrogen atom, an alkyl group or —$OSO_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

The resin (D) is preferably solid at ordinary temperature (25° C.). Furthermore, the glass transition temperature (Tg) is preferably from 50 to 200° C., more preferably from 80 to 160° C.

When the resin is solid at 25° C., this means that the melting point is 25° C. or more.

The glass transition temperature (Tg) can be measured by a scanning calorimeter (Differential Scanning Calorimeter). For example, after once elevating the temperature of the sample and then cooling it, the value by which the specific volume is changed when the temperature of the sample is again elevated at 5° C./min is analyzed, whereby the glass transition temperature can be measured.

The resin (D) is preferably stable to an acid and insoluble in an alkali developer.

In view of followability of immersion liquid, the resin (D) preferably contains none of (x) an alkali-soluble group, (y) a group which decomposes under the action of an alkali (alkali developer) to increase the solubility in an alkali developer, and (z) a group which decomposes under the action of an acid to increase the solubility in a developer.

In the resin (D), the total amount of repeating units having an alkali-soluble group or a group of which solubility in a developer increases under the action of an acid or alkali is preferably 20 mol % or less, more preferably from 0 to 10 mol %, still more preferably from 0 to 5 mol %, based on all repeating units constituting the resin (D).

Also, unlike a surfactant generally used for resists, the resin (D) does not have an ionic bond or a hydrophilic group such as (poly(oxyalkylene)) group. If the resin (D) contains a hydrophilic polar group, followability of immersion water tends to decrease. Therefore, it is more preferred to not contain a polar group selected from a hydroxyl group, alkylene glycols and a sulfone group. Furthermore, an ether group bonded to the carbon atom of the main chain through a linking group is preferably not contained because the hydrophilicity increases and the followability of immersion liquid deteriorates. On the other hand, an ether group bonded directly to the carbon atom of the main chain as in formula (III) sometimes express activity as a hydrophobic group and is preferred.

Examples of the alkali-soluble group (x) include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl)methylene group or a tris(alkylsulfonyl)methylene group.

Examples of the group (y) which decomposes under the action of an alkali (alkali developer) to increase the solubility in an alkali developer include a lactone group, an ester group, a sulfonamide group, an acid anhydride and an acid imide group.

Examples of the group (z) which decomposes under the action of an acid to increase the solubility in a developer include the same groups as those of the acid-decomposable group in the acid-decomposable resin (A).

However, the repeating unit represented by the following formula (pA-C) is not or scarcely decomposed under the action of an acid as compared with the acid-decomposable group of the resin (A) and is regarded as substantially non-acid-decomposable.

(pA-c)

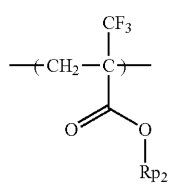

In formula (pA-c), $Rp_2$ represents a hydrocarbon group having a tertiary carbon atom bonded to the oxygen atom in the formula.

In the case where the resin (D) contains a silicon atom, the silicon atom content is preferably from 2 to 50 mass %, more preferably from 2 to 30 mass %, based on the molecular weight of the resin (D). Also, the silicon atom-containing repeating unit preferably occupies from 10 to 100 mass %, more preferably from 20 to 100 mass %, in the resin (D).

In the case where the resin (D) contains a fluorine atom, the fluorine atom content is preferably from 5 to 80 mass %, more preferably from 10 to 80 mass %, based on the molecular weight of the resin (D). Also, the fluorine atom-containing repeating unit preferably occupies from 10 to 100 mass %, more preferably from 30 to 100 mass %, in the resin (D).

The standard polystyrene-reduced weight average molecular of the resin (D) is preferably from 1,000 to 100,000, more preferably from 1,000 to 50,000, still more preferably from 2,000 to 15,000, yet still more preferably from 3,000 to 15,000.

The residual monomer amount in the resin (D) is preferably from 0 to 10 mass %, more preferably from 0 to 5 mass %, still more preferably from 0 to 1 mass %. Also, in view of the resolution, resist profile, and side wall, roughness or the like of the resist pattern, the molecular weight distribution (Mw/Mn, also called dispersity) is preferably from 1 to 5, more preferably from 1 to 3, still more preferably from 1 to 1.5.

The amount added of the resin (D) in the positive resist composition is preferably from 0.1 to 20 mass %, more preferably from 0.1 to 10 mass %, still more preferably from 0.1 to 5 mass %, still even more preferably from 0.2 to 3.0 mass %, yet still even more preferably from 0.3 to 2.0 mass %, based on the entire solid content of the resist composition.

Similarly to the acid-decomposable resin (A), it is preferred that, as a matter of course, the resin (D) has less impurities such as metal and also, the content of the residual monomer or oligomer component is not more than a specific value, for example, 0.1 mass % by HPLC. When these conditions are satisfied, not only the resist can be improved in the sensitivity, resolution, process stability, pattern profile and the like but also a resist free from foreign matters in liquid or change in the sensitivity and the like with the lapse of time can be obtained.

As for the resin (D), various commercially available products may be used or the resin may be synthesize by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). A chain transfer agent may also be used, if desired. The reaction concentration is usually from 5 to 50 mass %, preferably from 20 to 50 mass %, more preferably from 30 to 50 mass %, and the reaction temperature is usually from 10 to 150° C., preferably from 30 to 120° C., more preferably from 60 to 100° C.

After the completion of reaction, the reactant is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers having a molecular weight lower than a specific molecular weight; a reprecipitation method of adding dropwise the resin solution in a bad solvent to solidify the resin in the had solvent and thereby remove residual monomers or the like; and a purification method in a solid state, such as washing of the resin slurry with a bad solvent after separation by filtration. For example, the resin is precipitated as a solid through contact with a solvent in which the resin is sparingly soluble or insoluble (bad solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a bad solvent to the polymer, and the solvent used may be appropriately selected according to the kind of the polymer from, for example, a hydrocarbon (e.g., an aliphatic hydrocarbon such as pentane, hexane, heptane and octane; an alicyclic hydrocarbon such as cyclohexane and methyl-cyclohexane; an aromatic hydrocarbon such as benzene, toluene and xylene), a halogenated hydrocarbon (e.g., a halogenated aliphatic hydrocarbon such as methylene chloride, chloroform and carbon tetrachloride; a halogenated aromatic hydrocarbon such as chlorobenzene and dichlorobenzene), a nitro compound (e.g., nitromethane, nitroethane), a nitrile (e.g., acetonitrile, benzonitrile), an ether (e.g., a chain ether such as diethyl ether, diisopropyl ether and dimethoxyethane; a cyclic ether such as tetrahydrofuran and dioxane), a ketone (e.g., acetone, methyl ethyl ketone, diisobutyl ketone), an ester (e,g., ethyl acetate, butyl acetate), a carbonate (e.g., dimethyl carbonate, diethyl carbonate, ethylene carbonate, propylene carbonate), an alcohol (e.g., methanol, ethanol, propanol, isopropyl alcohol, butanol), a carboxylic acid (e.g., acetic acid), water, and a mixed solvent containing such a solvent. Among these, the precipitation or reprecipitation solvent is preferably a solvent containing at least an alcohol (particularly methanol or the like) or water. In such a solvent containing at least a hydrocarbon, the ratio of the alcohol (particularly methanol or the like) to other solvents (for example, an ester such as ethyl acetate, and ethers such as tetrahydrofuran) is approximately, for example, the former/the latter (volume ratio, at 25° C.)=from 10/90 to 99/1, preferably the former/the latter (volume ratio, at 25° C.)=from 30/70 to 98/2, more preferably the former/the latter (volume ratio, at 25° C.)=from 50/50 to 97/3.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The nozzle bore diameter at the time of feeding the polymer solution into a precipitation or reprecipitation solvent (bad solvent) is preferably 4 mmϕ or less (for example, from 0.2 to 4 mmϕ), and the feeding rate (dropping rate) of the polymer solution into the bad solvent is, for example, in terms of the linear velocity, from 0.1 to 10 m/sec, preferably from 0.3 to 5 m/sec.

The precipitation or reprecipitation operation is preferably performed under stirring. Examples of the stirring blade which can be used for the stirring include a disc turbine, a fan turbine (including paddle), a curved vane turbine, a feathering turbine, a Pfaudler type, a bull margin type, an angled vane fan turbine, a propeller, a multistage type, an anchor type (or horseshoe type), a gate type, a double ribbon type and a screw type. The stirring is preferably further performed for 10 minutes or more, more preferably 20 minutes or more, after the completion of feeding of the polymer solution. If the stirring time is short, the monomer content in the polymer particle may not be sufficiently reduced. The mixing and stirring of the polymer solution and the had solvent may also be performed using a line mixer instead of the stirring blade.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank according to a known method such as batch system and continuous system.

The precipitated or reprecipitated particulate polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble.

More specifically, there may be used a method comprising, after the completion of radical polymerization reaction, precipitating a resin by bringing the polymer into contact with a solvent in which the polymer is sparingly soluble or insoluble (step a), separating the resin from the solution (step h), anew dissolving the resin in a solvent to prepare a resin solution A (step c), precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As for the solvent used at the preparation of the resin solution A, the same solvent as the solvent for dissolving the monomer at the polymerization reaction may be used, and the solvent may be the same as or different from the solvent used at the polymerization reaction.

(E) Basic Compound

The positive resist composition of the present invention preferably comprises (E) a basic compound for reducing the change of performance in aging from exposure until heating.

Preferred examples of the basic compound include compounds having a structure represented by any one of the following formulae (A) to (E):

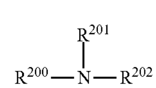

(A)

-continued (B)

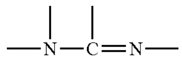

(C)

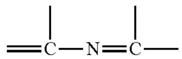

(D)

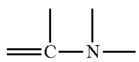

(E)

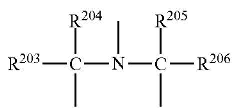

In formulae (A) to (E), $R^{200}$, $R^{201}$ and $R^{202}$, which may be the same or different, each represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$, which may be the same or different, each represents an alkyl group having a carbon number of 1 to 20.

The alkyl group in these formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure is converted into a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

Other examples include an amine compound having a phenoxy group, and an ammonium salt compound having a phenoxy group.

As for the amine compound, a primary, secondary or tertiary amine compound can be used, and an amine compound where at least one alkyl group is bonded to the nitrogen atom is preferred. The amine compound is preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($—CH_2CH_2O—$) and an oxypropylene group ($—CH(CH_3)CH_2O—$ or $—CH_2CH_2CH_2O—$) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkyl sulfonate having a carbon number of 1 to 20 and an aryl sulfonate. The alkyl group of the alkyl sulfonate may have a substituent, and examples of the substituent include fluorine, chlorine, bromine, an alkoxy group, an acyl group and an aryl group. Specific examples of the alkyl sulfonate include methanesulfonate, ethanesulfonate, butanesulfonte, hexanesulfonate, octanesulfonate, benzylsulfonate, trifluoromethanesulfonate, pentafluoroethanesulfonte and nonafluorobutanesulfonate. The aryl group of the aryl sulfonate includes a benzene ring, a naphthalene ring and an anthracene ring. The benzene ring, naphthalene ring and anthracene ring may have a substituent and as for the substituent, a linear or branched alkyl group having a carbon number of 1 to 6 and a cycloalkyl group having a carbon number of 3 to 6 are preferred. Specific examples of the linear or branched alkyl group and the cycloalkyl group include methyl, ethyl, n-propyl, isopropyl, n-butyl, butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution position of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The amine compound having a phenoxy group can be obtained by reacting a primary or secondary amine having a phenoxy group with a haloalkyl ether under heating, adding an aqueous solution of strong base such as sodium hydroxide, potassium hydroxide and tetraalkylammonium, and performing extraction with an organic solvent such as ethyl acetate and chloroform, or by reacting a primary or secondary amine with a haloalkyl ether having a phenoxy group at the terminal under heating, adding an aqueous solution of strong base such as sodium hydroxide, potassium hydroxide and tetraalkylammonium, and performing extraction with an organic solvent such as ethyl acetate and chloroform.

One of these basic compounds is used alone, or two or more species thereof are used in combination.

The amount of the basic compound used is usually from 0.001 to 10 mass %, preferably from 0.01 to 5 mass %, based on the solid content of the positive resist composition.

The ratio of the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern in aging after exposure until heat treatment. The acid generator/basic compound (by mol) is more preferably from 5.0 to 200, still more preferably from 7.0 to 150.

(F) Surfactant

The positive resist composition of the present invention preferably further comprises (F) a surfactant, more preferably any one fluorine-containing and/or silicon-containing surfactant (a fluorine-containing surfactant, a silicon-containing surfactant or a surfactant containing both a fluorine atom and a silicon atom) or two or more species thereof.

When the positive resist composition of the present invention contains the surfactant (F), a resist pattern with good sensitivity, resolution and adhesion as well as less development defects can be obtained when an exposure light source of 250 nm or less, particularly 220 nm or less, is used.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megafac F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); Eftop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204D, 208G, 218G, 230G, 204D, 208D, 212D, 218 and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megafac F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or several species thereof may be used in combination.

The amount of the surfactant (F) used is preferably from 0.01 to 10 mass %, more preferably from 0.1 to 5 mass %, based on the entire amount of the positive resist composition (excluding the solvent).

(G) Onium Carboxylate

The positive resist composition of the present invention may comprise (G) an onium carboxylate. Examples of the onium carboxylate include sulfonium carboxylate, iodonium carboxylate and ammonium carboxylate. In particular, the onium carboxylate (G) is preferably an iodonium salt or a sulfonium salt. Furthermore, the carboxylate residue of the onium carboxylate (H) for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of the carboxylic acid with the alkyl group being partially or entirely fluorine-substituted. The alkyl chain may contain an oxygen atom. By virtue of such a construction, the transparency to light of 220 nm or less is ensured, the sensitivity and resolution are enhanced, and the defocus latitude depended on line pitch and the exposure margin are improved.

Examples of the anion of a fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluoro-tridecanoic acid, perfluorocyclohexanecarboxylic acid and 2,2-bistrifluoromethylpropionic acid.

These onium carboxylates (G) can be synthesized by reacting a sulfonium, iodonium or ammonium hydroxide and a carboxylic acid with silver oxide in an appropriate solvent.

The content of the onium carboxylate (G) in the composition is generally from 0.1 to 20 mass %, preferably from 0.5 to 10 mass %, more preferably from 1 to 7 mass %, based on the entire solid content of the composition.

(H) Other Additives

The positive resist composition of the present invention may further contain, for example, a dye, a plasticizer, a photosensitizer, a light absorbent, an alkali-soluble resin, a dissolution inhibitor and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

In the pattern forming method of the present invention, the step of forming a film on a substrate by using a resin composition of which solubility in a positive developer increases and solubility in a negative developer decreases upon irradiation with actinic rays or radiation, the step of exposing the film, the step of heating (baking, also called PEB (post exposure bake)) the film, and the step of effecting positive development of the film may be performed by generally known methods.

The exposure device for use in the present invention is not limited in the light source wavelength, but, for example, a KrF excimer laser wavelength (248 nm), an ArF excimer laser wavelength (193 nm), an $F_2$ excimer laser wavelength (157 nm) and an EUV light (13.5 nm) can be applied.

In the step of performing exposure of the present invention, an immersion exposure method can be applied.

The immersion exposure method is a technique for enhancing the resolving power, and according to this technique, exposure is performed by filling a high refractive-index liquid (hereinafter sometimes referred to as an "immersion liquid") between the projection lens and the sample.

As for the "effect of immersion", assuming that $NA_0=\sin\theta$, the resolving power and focal depth when immersed can be expressed by the following formulae:

$$(\text{Resolving power})=k_1\cdot(\lambda_0/n)/NA_0$$

$$(\text{Focal depth})=\pm k_2\cdot(\lambda_0/n)/NA_0^2$$

wherein $\lambda_0$ is the wavelength of exposure light in air, n is the refractive index of the immersion liquid based on air, and $\theta$ is the convergence half-angle of beam.

That is, the effect of immersion is equal to use of an exposure wavelength of 1/n. In other words, when the projection optical system has the same NA, the focal depth can be made n times larger by the immersion. This is effective for all pattern profiles and can be combined with super-resolution techniques under study at present, such as phase-shift method and modified illumination method.

In the case of performing immersion exposure, a step of washing the film surface with an aqueous chemical solution may be performed (1) after the film is formed on a substrate and exposed and/or (2) after the step of exposing the film through an immersion liquid but before the step of heating the film.

The immersion liquid is preferably a liquid transparent to light at the exposure wavelength and having a small temperature coefficient of refractive index as much as possible so as to minimize the distortion of an optical image projected on the film. Particularly, when the exposure light source is an ArF excimer laser (wavelength: 193 nm), water is preferably used in view of easy availability and easy handleability, in addition to the above-described aspects.

In the case of using water, an additive (liquid) capable of decreasing the surface tension of water and increasing the surface activity may be added in a small ratio. This additive is preferably an additive which does not dissolve the resist layer on a wafer and at the same time, gives only a negligible effect on the optical coat at the undersurface of the lens element.

Such an additive is preferably, for example, an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a circuit board of liquid crystal, thermal head or the like or in the lithography process of other photo applications can be used. If desired, an organic antireflection film may be formed between the resist film and the substrate.

As for the organic antireflection film, organic films comprising a light absorbent and a polymer material all can be used. For example, a commercially available organic antireflection film such as DUV-30 Series and DUV-40 Series produced by Brewer Science, Inc., AR-2, AR-3 and AR-5 produced by Shipley Co., Ltd., and ARC Series (e.g., ARC29A) produced by Nissan Chemical Industries, Ltd. may be used. Furthermore, an inorganic antireflection film can also be used as the antireflection film. For example, an antireflection film such as titanium, titanium dioxide, titanium nitride, chromium oxide, carbon and amorphous silicon may be used.

At the time of performing positive development, an alkali developer is preferably used.

The alkali developer which can he used when performing positive development is, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethyl-amine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkaline aqueous solution may be used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38% tetramethylammonium hydroxide solution is preferred.

As for the rinsing solution in the rinsing treatment performed after positive development, pure water is used, and the pure water may be used after adding thereto a surfactant in an appropriate amount.

At the time of performing negative development, an organic developer containing an organic solvent is preferably used.

As for the organic developer which can be used when performing negative development, a polar solvent such as ketone-based solvent, ester-based solvent, alcohol-based solvent, amide-based solvent and ether-based solvent, and a hydrocarbon-based solvent can be used.

In the present invention, the ketone-based solvent indicates a solvent having a ketone group within the molecule, the ester-based solvent indicates a solvent having an ester group within the molecule, the alcohol-based solvent indicates a solvent having an alcoholic hydroxyl group within the molecule, the amide-based solvent indicates a solvent having an amide group within the molecule, and the ether-based solvent indicates a solvent having an ether bond within the molecule. Some of these solvents have a plurality of kinds of the functional groups described above within one molecule and in this case, the solvent comes under all solvent species corresponding to the functional groups contained in the solvent. For example, diethylene glycol monomethyl ether comes under both an alcohol-based solvent and an ether-based solvent in the classification above. The hydrocarbon-based solvent indicates a hydrocarbon solvent having no substituent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate and γ-butyrolactone.

Examples of the ester-based solvent include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As for the ester-based solvent, a solvent represented by formula (1) described later or a solvent represented by formula (2) described later is preferred, a solvent represented by formula (1) is more preferred, an alkyl acetate is still more preferred, and butyl acetate is most preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; a glycol-based solvent such as ethylene glycol, diethylene glycol and triethylene glycol; and a hydroxyl group-containing glycol ether-based solvent such as ethylene glycol monomethyl ether, propylene glycol monomethyl ether, ethylene glycol, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these, a glycol ether-based solvent is preferred.

Examples of the ether-based solvent include, in addition to the hydroxyl group-containing glycol ether-based solvents above, a hydroxyl group-free glycol ether-based solvent such as propylene glycol dimethyl ether, propylene glycol diethyl ether, diethylene glycol dimethyl ether and diethylene glycol diethyl ether; dioxane; tetrahydrofuran; anisole; perfluoro-2-butyltetrahydrofuran; and 1,4-dioxane. A glycol ether-based solvent is preferably used.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, an aliphatic hydrocarbon-based solvent such as pentane, hexane, octane, decane, 2,2,4-trimethylpentane, 2,2,3-trimethylhexane, perfluorohexane and perfluoroheptane, and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethybenzene, trimethylbenzene, ethyldimethylbenzene and dipropylbenzene. Among these, an aromatic hydrocarbon-based solvent is preferred.

A plurality of these solvents may be mixed, or the solvent may be mixed with a solvent other than those described above or water and used.

As for the developer which can be used when performing negative development, a solvent represented by the following formula (1) is preferably used.

(1)

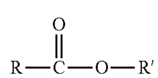

In formula (1), R and R' each independently represents a hydrogen atom, an alkyl group, a cycloalkyl group, an alkoxyl group, an alkoxycarbonyl group, a carboxyl group, a hydroxyl group, a cyano group or a halogen atom, and R and R' may combine with each other to form a ring. R and R' each is preferably a hydrogen atom or an alkyl group, and the alkyl group of R and R' may be substituted by a hydroxyl group, a carbonyl group, a cyano group or the like.

Examples of the solvent represented by formula (1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate and ethyl 2-hydroxypropionate.

Above all, in the solvent represented by formula (1), R and R' each is preferably an unsubstituted alkyl group, more preferably an alkyl acetate, still more preferably butyl acetate.

The solvent represented by formula (1) may be used in combination with one or more other solvents. In this case, the solvent used in combination is not particularly limited as long as it can be mixed with the solvent represented by formula (1) without causing separation, and the solvents represented by formula (1) may be used in combination with each other or the solvent represented by formula (1) may he used by mixing it with a solvent selected from other ester-based, ketone-based, alcohol-based, amide-based, ether-based and hydrocarbon-based solvents. As for the solvent used in combination, one or more species may be used but from the standpoint of obtaining a stable performance, one species is preferably used. In the case where one species of the solvent used in combination is mixed and used, the mixing ratio between the solvent represented by formula (1) and the solvent used in combination is usually from 20:80 to 99:1, preferably from 50:50 to 97:3, more preferably from 60:40 to 95:5, and most preferably from 60:40 to 90:10.

As for the developer which can be used when performing negative development, a solvent represented by the following formula (2) is preferably used.

(2)

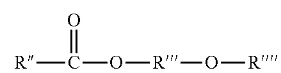

In formula (2), R" and R"" each independently represents a hydrogen atom, an alkyl group, a cycloalkyl group, an alkoxyl group, an alkoxycarbonyl group, a carboxyl group, a hydroxyl group, a cyano group or a halogen atom, and R" and R"" may combine with each other to form a ring. R" and R"" each is preferably a hydrogen atom or an alkyl group.

R''' represents an alkylene group or a cycloalkylene group. R''' is preferably a hydrogen atom or an alkyl group.

The alkyl group of R", R''' and R"" may be substituted by a hydroxyl group, a carbonyl group, a cyano group or the like.

In formula (2), the alkylene group of R''' may have an ether bond in the alkylene chain.

Examples of the solvent represented by formula (2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate.

The solvent represented by formula (2) may be used in combination with one or more other solvents. In this case, the solvent used in combination is not particularly limited as long as it can be mixed with the solvent represented by formula (2) without causing separation, and the solvents represented by formula (2) may be used in combination with each other or the solvent represented by formula (2) may be used by mixing it with a solvent selected from other ester-based, ketone-based, alcohol-based, amide-based, ether-based and hydrocarbon-based solvents. As for the solvent used in combination, one or more species may be used but from the standpoint of obtaining a stable performance, one species is preferably used. In the case where one species of the solvent used in combination is mixed and used, the mixing ratio between the solvent represented by formula (2) and the solvent used in combination is usually from 20:80 to 99:1, preferably from 50:50 to 97:3, more preferably from 60:40 to 95:5, and most preferably from 60:40 to 90:10.

In view of cost saving of the solvent used for development, the solvent used at the negative development is preferably an organic solvent not containing a halogen atom. The content of the halogen atom-free solvent occupying in the total weight of all solvents used at the negative development is usually 60 mass % or more, preferably 80 mass % or more, more preferably 90 mass % or more, still more preferably 97 mass % or more.

The boiling point of the solvent used at the negative development is preferably from 50° C. to less than 250° C.

The ignition point of the solvent used at the negative development is preferably 200° C. or more.

In the developer usable at the negative development, a surfactant can be added in an appropriate amount, if desired.

The surfactant is not particularly limited but, for example, an ionic or nonionic fluorine-containing and/or silicon-containing surfactant can he used. Examples of such a fluorine-containing and/or silicon-containing surfactant include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. The surfactant is preferably a nonionic surfactant. The nonionic surfactant is not particularly limited, but a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the negative development method, for example, a method of dipping a substrate in a bath filled with the developer for a fixed time (dip method), a method of raising the developer on a substrate surface by the effect of a surface tension and keeping it still for a fixed time, thereby performing the development (puddle method), a method of spraying the developer on a substrate surface (spray method), and a method of continuously ejecting the developer on a substrate rotating at a constant speed while scanning the developer ejecting nozzle at a constant rate (dynamic dispense method) may be applied.

After the step of performing negative development, a step of stopping the development by the replacement with another solvent may be practiced.

A step of washing the resist film with a rinsing solution containing an organic solvent is preferably provided after the step of performing negative development.

In the washing step after negative development, a rinsing solution containing at least one kind of a solvent selected from a hydrocarbon-based solvent, a ketone-based solvent, an ester-based solvent, an alcohol-based solvent, an amide-based solvent and an ether-based solvent may be usually used.

In the present invention, the hydrocarbon-based solvent indicates a hydrocarbon solvent having no substituent, the ketone-based solvent indicates a solvent having a ketone group within the molecule, the ester-based solvent indicates a solvent having an ester group within the molecule, the alcohol-based solvent indicates a solvent having an alcoholic hydroxyl group within the molecule, the amide-based solvent indicates a solvent having an amide group within the molecule, and the ether-based solvent indicates a solvent having an ether bond within the molecule. Some of these solvents have a plurality of kinds of the functional groups described above within one molecule and in this case, the solvent comes under all solvent species corresponding to the functional groups contained in the solvent. For example, diethylene glycol monomethyl ether comes under both an alcohol-based solvent and an ether-based solvent in the classification above.

For example, there may be used a ketone-based solvent such as 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone and propylene carbonate; and an ester-based solvent such as methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol, propylene glycol, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

The rinsing solution containing an organic solvent preferably uses at least one kind of a solvent selected from a hydrocarbon-based solvent, a ketone-based solvent, an ester-based solvent, an alcohol-based solvent and an amide-based solvent. The rinsing solution may use, more preferably, at least one kind of a solvent selected from an alcohol-based solvent and an ester-based solvent. The rinsing solution is most preferably a rinsing solution containing a monohydric alcohol having a carbon number of 6 to 8. The monohydric alcohol having a carbon number of 6 to 8, which is contained in the rinsing solution used in the washing step after negative development, includes a linear, branched or cyclic monohydric alcohol, and specific examples of the monohydric alcohol which can be used include a 1-hexanol, 1-heptanol, 1-octanol, 2-hexanol, 2-heptanol, 2-octanol, 3-hexanol, 3-heptanol, 3-octanol, 4-octanol and benzyl alcohol, with 1-hexanol, 2-heptanol and 2-hexanol being preferred, and 1-hexanol and 2-hexanol being more preferred.

A plurality of these solvents may be mixed, or the solvent may be mixed with an organic solvent other than those described above and used.

The solvent may be mixed with water, and the water content in the rinsing solution is usually 30 mass % or less, preferably 10 mass % or less, more preferably 5 mass % or less, and most preferably 3 mass % or less: By setting the water content to 30 mass % or less, good. development characteristics can be obtained.

In the rinsing solution, a surfactant can be added in an appropriate amount, if desired.

The surfactant is not particularly limited but, for example, an ionic or nonionic fluorine-containing and/or silicon-containing surfactant can be used.

The amount of the surfactant used is usually from 0.001 to 5 mass %, preferably from 0.005 to 2 mass %, more preferably from 0.01 to 0.5 mass %, based on the entire amount of the developer.

In the step of washing the resist film with a rinsing solution, the resist after negative development is washed using the above-described organic solvent-containing rinsing solution. The washing treatment method is not particularly limited but, for example, a method of continuously ejecting the rinsing solution on a substrate rotating at a constant speed (rotary coating method), a method of dipping a substrate in a bath filled with the rinsing solution for a fixed time (dip method), and a method of spraying the rinsing solution of a substrate surface (spray method) may be applied.

Also, a treatment of removing the developer or rinsing solution adhering on the pattern by using a supercritical fluid may be performed after the development or rinsing treatment.

Furthermore, after the development, the rinsing or the treatment with a supercritical fluid, a heat treatment may be performed for removing the solvent remaining in the pattern. The heating temperature is not particularly limited as long as a good resist pattern is obtained, and the heating temperature is usually from 40 to 160° C. The heat treatment may be performed a plurality of times.

EXAMPLES

The present invention is described in greater detail below by referring to Examples, but the present invention should not be construed as being limited thereto.

Example 1

An organic antireflection film, ARC29A (produced by Nissan Chemical Industries, Ltd.), was coated on a silicon wafer by a spin coater and baked at 205° C. for 60 seconds to form a 78-nm antireflection film, and a commercially available product, FAiRS-9101A12 (an ArF positive resist composition, produced by FUJIFILM Electronic Materials Co., Ltd.), was coated thereon and baked at 100° C. for 60 seconds to form a 150-nm resist film. The obtained wafer was subjected to pattern exposure at 25 [mJ/cm$^2$] by using an ArF excimer laser scanner (NA: 0.75). Thereafter, the resist film was heated at 120° C. for 60 seconds, developed with butyl acetate (negative developer) for 30 seconds (negative development), and rinsed with decane fir 30 seconds to obtain a resist pattern having a pitch of 200 nm and a line width of 100 nm.

Synthesis Example 1

Synthesis of Resin (A1)

Under a nitrogen stream, 8.4 g of methyl isobutyl ketone was charged into a three-neck flask and heated at 80° C. Thereto, a solution obtained by dissolving 9.4 g of 2-cyclohexylpropan-2-yl methacrylate, 4.7 g of 3-hydroxy-1-adamantyl methacrylate, 6.8 g of β-methacryloyloxy-γ-butyrolactone and azobisisobutyronitrile corresponding to 6 mol % based on the entire monomer amount, in 75.3 g of methyl isobutyl ketone was added dropwise over 6 hours. After the completion of dropwise addition, the reaction was further allowed to proceed at 80° C. for 2 hours. The resulting reaction solution was left standing to cool and then, poured in 720 ml of heptane/80 ml of ethyl acetate, and the powder precipitated was collected by filtration and dried, as a result, 18.3 g of Resin (A1) was obtained. The weight average molecular weight of the obtained resin was 9,300 and the dispersity (Mw/Mn) was 1.98.

(Resin A1)

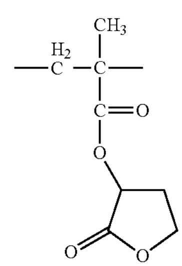

40

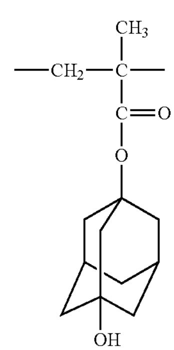

20

-continued

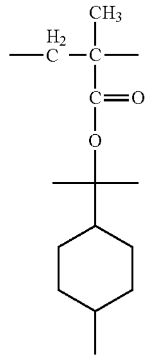

Mw = 9300 Mw/Mn = 1.98

Positive Resist Composition (A):

A solution having a solid content concentration of 5.8 mass % obtained by dissolving the components shown below in a mixed solvent of polyethylene glycol monomethyl ether acetate/polyethylene glycol monomethyl ether (60:40) was filtered through a 0.1-μm polyethylene filter to prepare Positive Resist Composition (A).

Resin (A1): 1.83 g, triphenylsulfonium nonaflate: 69.6 mg, diphenylaniline: 8.7 mg, and PF6320 (fluorine-containing surfactant produced by OMNOVA): 1.7 mg.

Positive Resist Composition (B):

Positive Resist Composition (B) was prepared using Resin (A2) shown below in place of Resin (A1).

(Resin A2)

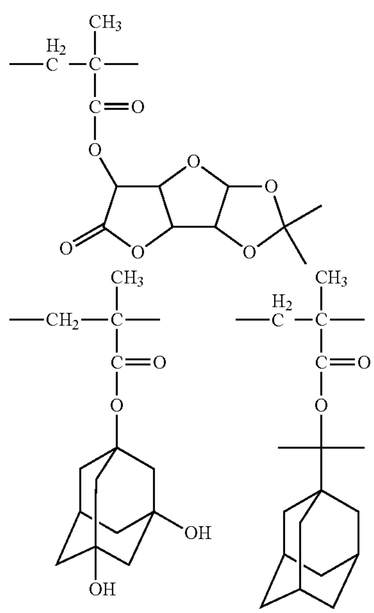

Weight average molecular weight: 8,000

Dispersity: 1.81

Molar ratio: 40/20/40

Positive Resist Composition (C):

Positive Resist Composition (C) was prepared using Resin (B) shown below in place of Resin (A1).

(Resin B)

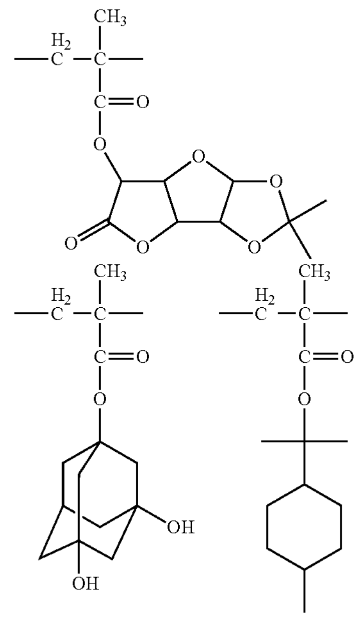

Weight average molecular weight: 9,500

Dispersity: 1.85

Molar ratio: 40/20/40

Positive Resist Composition (D):

Positive Resist Composition (D) was prepared using Resin (C) shown below in place of Resin (A1).

(Resin C)

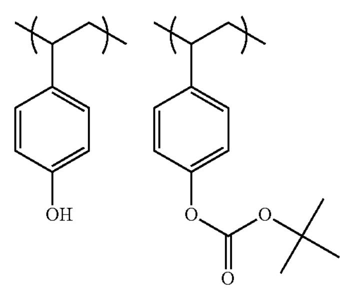

Weight average molecular weight: 8,000

Dispersity: 1.80

Molar ratio: 50/50

Example 2

An organic antireflection film, ARC29A (produced by Nissan Chemical Industries, Ltd.), was coated on a silicon wafer and baked at 205° C. for 60 seconds to form a 78-nm antireflection film, and Positive Resist Composition (B) prepared above was coated thereon by a spin coater and baked at 100° C. for 60 seconds to form a 150-nm resist film. The obtained wafer was subjected to pattern exposure using an ArF excimer laser scanner (NA: 0.75). Thereafter, the resist film was heated at 120° C. for 60 seconds, developed with an aqueous tetramethylammonium hydroxide solution (2.38 mass %) (positive developer) for 30 seconds (positive development), and rinsed with pure water for 30 seconds to obtain a pattern having a pitch of 1,000 nm and a line width of 750 nm. Furthermore, the resist film was developed with a 2:3 (by mass) solution of butyl acetate/2-hexanol (negative developer) for 30 seconds (negative development) to obtain a 250-nm (1:1) resist pattern.

Example 3

Figure 11:
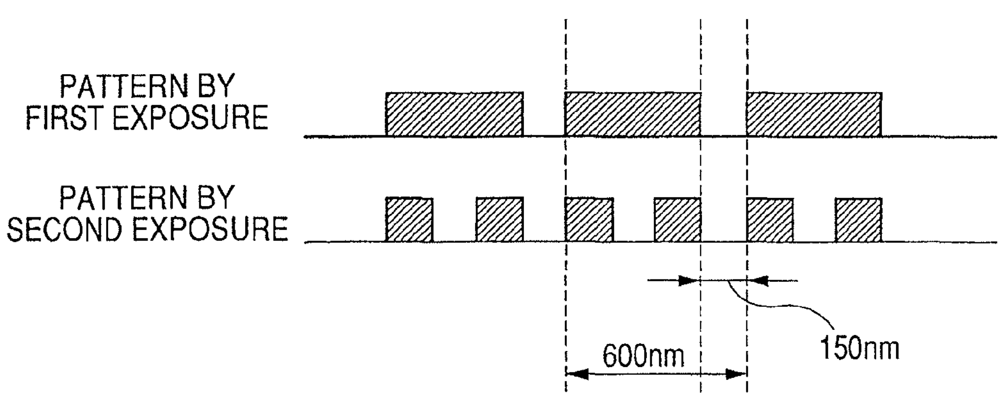
FIG. 11 represents a schematic view showing the state of forming a pattern by two exposure processes.

An organic antireflection film, ARC29A (produced by Nissan Chemical Industries, Ltd.), was coated on a silicon wafer and baked at 205° C. for 60 seconds to form a 78-nm antireflection film, and Positive Resist Composition (A) prepared above was coated thereon by a spin coater and baked at 100° C. for 60 seconds to form a 150-nm resist film. The obtained wafer was subjected to pattern exposure at 20 [mJ/cm$^2$] by using an ArF excimer laser scanner (NA: 0.75). Thereafter, the resist film was heated at 130° C. for 60 seconds, developed with an aqueous tetramethylammonium hydroxide solution (2.38 mass %) (positive developer) for 30 seconds (positive development, and rinsed with pure water for 30 seconds to obtain a pattern having, as shown in FIG. 11, a pitch of 600 nm and a line width of 450 nm. Furthermore, the resist film was subjected to second exposure at 56 [mJ/cm$^2$] through the same mask for pattern formation as used in the first exposure, heated at 120° C. for 60 seconds and developed with a 1:2 (by mass) solution of butyl acetate/2-hexanol (negative developer) for 30 seconds (negative development) to obtain a 150-nm (1:1) resist pattern.

Example 4

An organic antireflection film, ARC29A (produced by Nissan Chemical Industries, Ltd.), was coated on a silicon wafer and baked at 205° C. for 60 seconds to form a 78-nm antireflection film, and Positive Resist Composition (B) prepared above was coated thereon by a spin coater and baked at 100° C. for 60 seconds to form a 150-nm resist film. The obtained wafer was subjected to pattern exposure at 18 [mJ/cm$^2$] by using an ArF excimer laser scanner (NA: 0.75). Thereafter, the resist film was heated at 135° C. for 60 seconds, developed with a 2:3 (by mass) solution of butyl acetate/2-hexanol (negative developer) for 30 seconds (negative development) to obtain a pattern having a pitch of 600 nm and a line width of 450 nm. Furthermore, the resist film was subjected to second exposure at 45 [mJ/cm$^2$] through the same mask for pattern formation as used in the first exposure, heated at 90° C. for 60 seconds, developed with an aqueous tetramethylammonium hydroxide solution (2.38 mass %) (positive developer) for 30 seconds (positive development, and rinsed with pure water for 30 seconds to obtain a 150-nm (1:1) resist pattern.

Example 5

An organic antireflection film, ARC29A (produced by Nissan Chemical Industries, Ltd.), was coated on a silicon wafer and baked at 205° C. for 60 seconds to form a 78-nm antireflection film, and Positive Resist Composition (B) prepared above was coated thereon by a spin coater and baked at 100° C. for 60 seconds to form a 150-nm resist film. The obtained wafer was subjected to pattern exposure using an ArF excimer laser scanner (NA: 0.75). Thereafter, the resist film was heated at 120° C. for 60 seconds, developed with an aqueous tetramethylammonium hydroxide solution (2.38 mass %) for 30 seconds, and rinsed with pure water for 30 seconds to obtain a pattern having a pitch of 920 nm and a line width of 690 nm. Furthermore, the resist film was developed with a 2:3 (by mass) solution of butyl acetate/2-hexanol for 30 seconds and then rinsed with 2-hexanol for 30 seconds to obtain a 230-nm (1:) resist pattern.

Example 6

An organic antireflection film, ARC29A (produced by Nissan Chemical Industries, Ltd.), was coated on a silicon wafer and baked at 205° C. for 60 seconds to form a 78-nm antireflection film, and Positive Resist Composition (C) prepared above was coated thereon by a spin coater and baked at 100° C. for 60 seconds to form a 150-nm resist film. The obtained wafer was subjected to pattern exposure using an ArF excimer laser scanner (NA: 0.75). Thereafter, the resist film was heated at 120° C. for 60 seconds, developed with an aqueous tetramethylammonium hydroxide solution (2.38 mass %) for 30 seconds, and rinsed with pure water for 30 seconds to obtain a pattern having a pitch of 880 nm and a line width of 660 nm. Furthermore, the resist film was developed with a 2:3 (by mass) solution of butyl acetate/2-hexanol for 30 seconds and then rinsed with 2-hexanol for 30 seconds to obtain a 220-nm (1:1) resist pattern.

Example 7

An organic antireflection film, ARC29A (produced by Nissan Chemical Industries, Ltd.), was coated on a silicon wafer and baked at 205° C. for 60 seconds to form a 78-nm antireflection film, and Positive Resist Composition (A) prepared above was coated thereon by a spin coater and baked at 100° C. for 60 seconds to form a 150-nm resist film. The obtained wafer was subjected to pattern exposure at 20 [mJ/cm$^2$] by using an ArF excimer laser scanner (NA: 0.75). Thereafter, the resist film was heated at 130° C. for 60 seconds, developed with an aqueous tetramethylammonium hydroxide solution (2.38 mass %) for 30 seconds, and rinsed with pure water for 30 seconds to obtain a pattern having a pitch of 560 nm and a line width of 420 nm. Furthermore, the resist film was subjected to second exposure at 56 [mJ/cm$^2$] through the same mask for pattern formation as used in the first exposure, heated at 120° C. for 60 seconds, developed with butyl acetate for 30 seconds and then rinsed with 1-hexanol for 30 seconds to obtain a 140-nm (1:1) resist pattern.

Example 8

An organic antireflection film, ARC29A (produced by Nissan Chemical Industries, Ltd.), was coated on a silicon wafer and baked at 205° C. for 60 seconds to form a 78-nm antireflection film, and Positive Resist Composition (B) prepared above was coated thereon by a spin coater and baked at 100° C. for 60 seconds to form a 150-nm resist film. The obtained wafer was subjected to pattern exposure at 18 [mJ/cm$^2$] by using an ArF excimer laser scanner (NA: 0.75). Thereafter, the resist film was heated at 135° C. for 60 seconds, developed with a 2:3 (by mass) solution of butyl acetate/2-hexanol for 30 seconds, and rinsed with 2-hexanol for 30 seconds to obtain a pattern having a pitch of 560 nm and a line width of 420 nm. Furthermore, the resist film was subjected to second exposure at 45 [mJ/cm$^2$] through the same mask for pattern formation as used in the first exposure, heated at 90° C. for 60 seconds, developed with an aqueous tetramethylammonium hydroxide solution (2.38 mass %) for 30 seconds, and rinsed with pure water for 30 seconds to obtain a 140-nm (1:1) resist pattern.

Example 9

An organic antireflection film, ARC29A (produced by Nissan Chemical Industries, Ltd.), was coated on a silicon wafer and baked at 205° C. for 60 seconds to form a 78-nm antireflection film, and Positive Resist Composition (B) prepared above was coated thereon by a spin coater and baked at 100° C. for 60 seconds to form a 150-nm resist film. The obtained wafer was subjected to pattern exposure using an ArF excimer laser scanner (NA: 0.75). Thereafter, the resist film was heated at 120° C. for 60 seconds and developed with a 2:3 (by mass) solution of butyl acetate/2-hexanol for 30 seconds to obtain a pattern having a pitch of 1,000 nm and a line width of 750 nm. Furthermore, the resist film was developed with an aqueous tetramethylammonium hydroxide solution (2.38 mass %) for 30 seconds, and rinsed with pure water for 30 seconds to obtain a 250-nm (1:1) resist pattern.

Example 10

An organic antireflection film, ARC29A (produced by Nissan Chemical Industries, Ltd.), was coated on a silicon wafer and baked at 205° C. for 60 seconds to form a 78-nm antireflection film, and Positive Resist Composition (B) prepared above was coated thereon by a spin coater and baked at 100° C. for 60 seconds to form a 150-nm resist film. The obtained wafer was subjected to pattern exposure using a ArF excimer laser scanner (NA: 0.75). Thereafter, the resist film was heated at 120° C. for 60 seconds, developed with an aqueous tetramethylammonium hydroxide solution (2.38 mass %) for 30 seconds and rinsed with pure water for 30 seconds to obtain a pattern having a pitch of 1,200 nm and a line width of 900 nm. Furthermore, the resist film was developed with a 2:3 (by mass) solution of butyl acetate/2-hexanol for 30 seconds to obtain a 300-nm (1:1) resist pattern.

Example 11

An organic antireflection film, ARC29A (produced by Nissan Chemical Industries, Ltd.), was coated on a silicon wafer and baked at 205° C. for 60 seconds to form a 78-nm antireflection film, and Positive Resist Composition (D) prepared above was coated thereon. by a spin coater and baked at 100° C. for 60 seconds to form a 150-nm resist film. The obtained wafer was subjected to pattern exposure using a ArF excimer laser scanner (NA: 0.75). Thereafter, the resist film was heated at 120° C. for 60 seconds, developed with an aqueous tetramethylammonium hydroxide solution (2.38 mass %) for 30 seconds and rinsed with pure water for 30 seconds to obtain a pattern having a pitch of 1,280 nm and a line width of 960 nm. Furthermore, the resist film was developed with a 2:3 (by mass) solution of butyl acetate/2-hexanol for 30 seconds to obtain a 320-nm (1:1) resist pattern.

Example 12

An organic antireflection film, ARC29A (produced by Nissan Chemical Industries, Ltd.), was coated on a silicon wafer and baked at 205° C. for 60 seconds to form a 78-nm antireflection film, and a commercially available product, FAiRS-9101A12 (an ArF positive resist composition, produced by FUJIFILM Electronic Materials Co., Ltd.), was coated thereon by a spin coater and baked at 100° C. for 60 seconds to form a 150-nm resist film. The obtained wafer was subjected to pattern exposure at 25 [mJ/cm$^2$] by using an ArF excimer laser scanner (NA: 0.75). Thereafter, the resist film was heated at 120° C. for 60 seconds, developed with butyl acetate (negative developer) for 30 seconds (negative development) and rinsed with 1-hexanol for 30 seconds to obtain a pattern having a pitch of 180 nm and a line width of 90 nm.

Structures of Resins (E) to (R) used in Examples 13 to 26 are shown below.

(E)

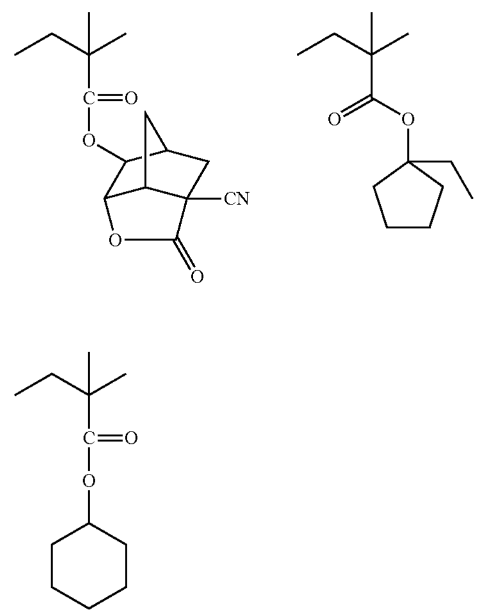

(F0

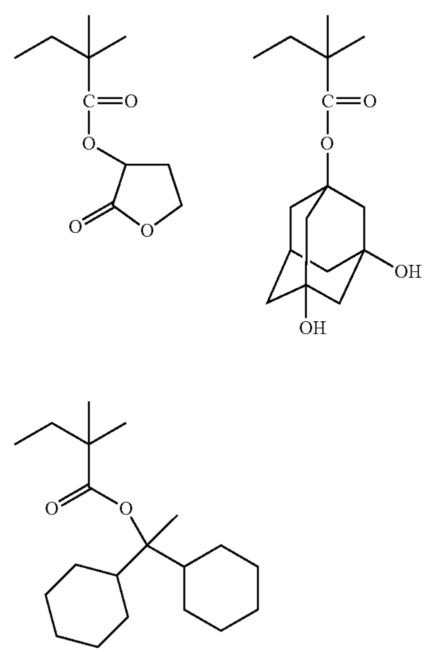

-continued
(G)
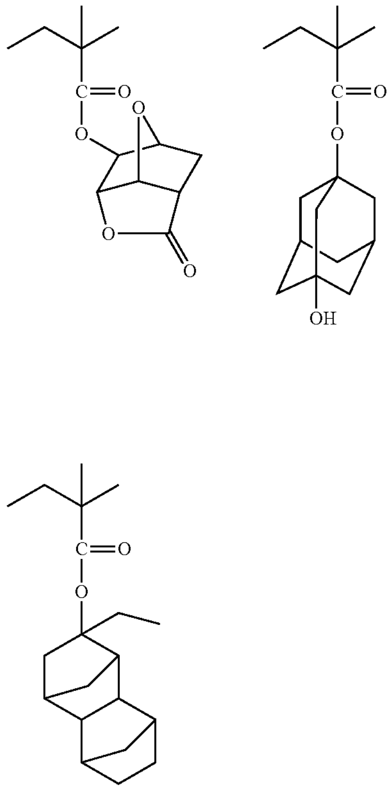
(H)
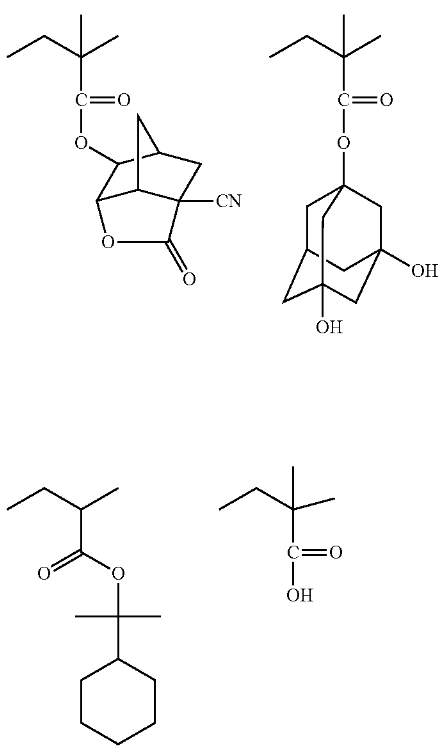
-continued
(I)
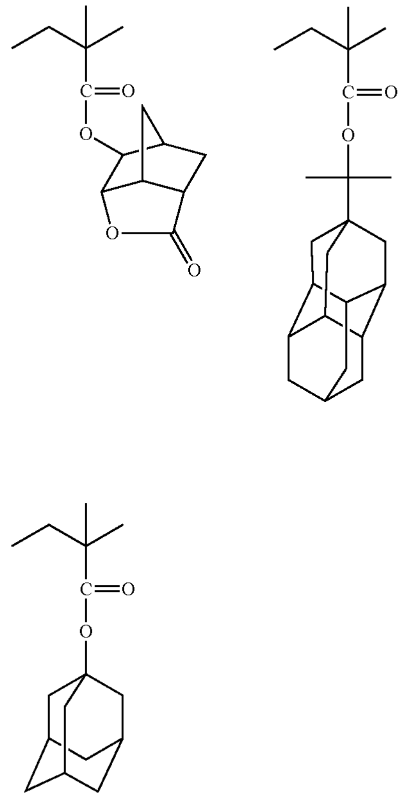
(J)
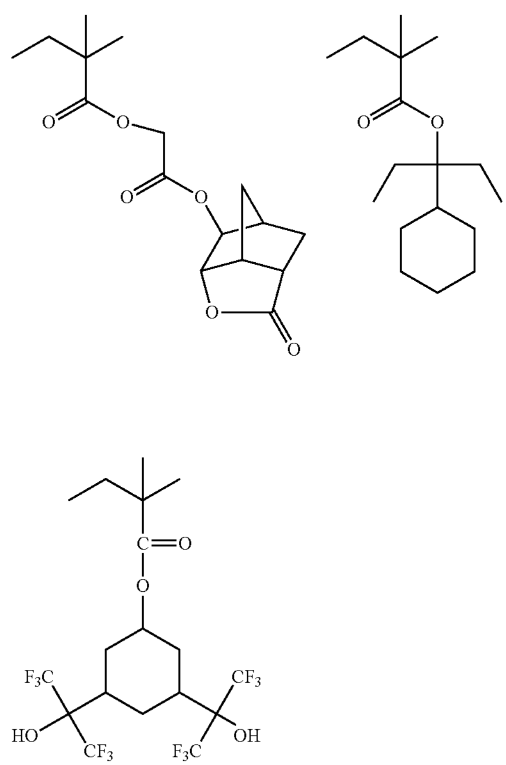

-continued
(K)
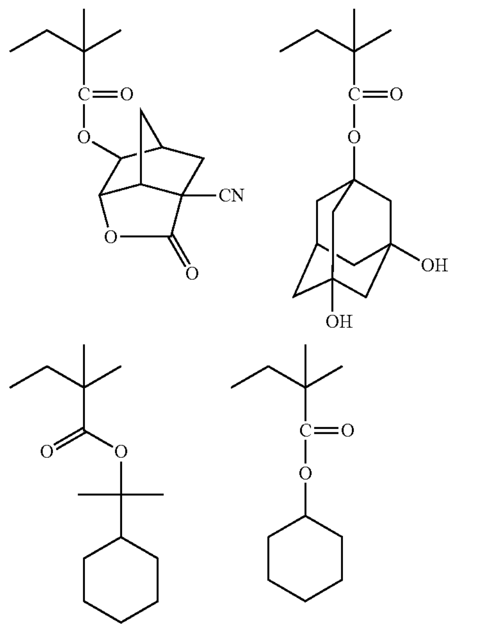
(L)
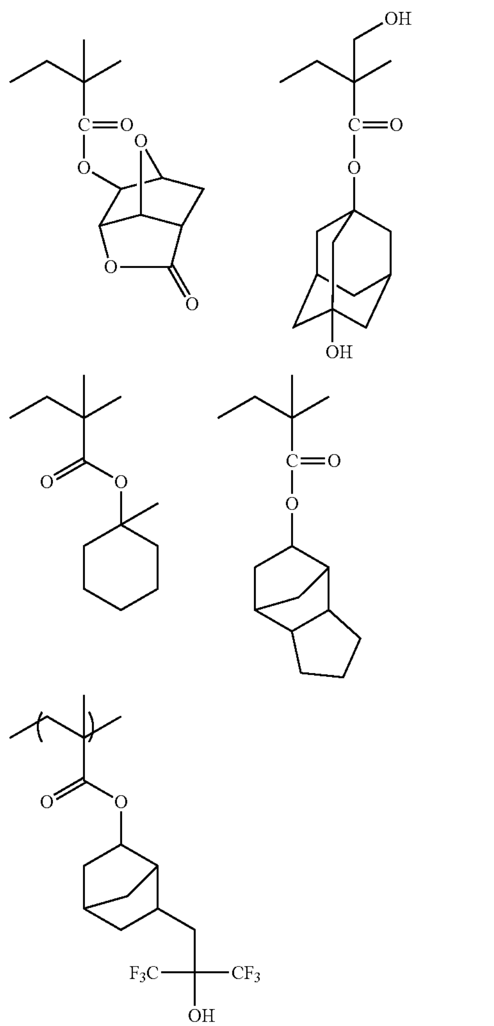
-continued
(M)
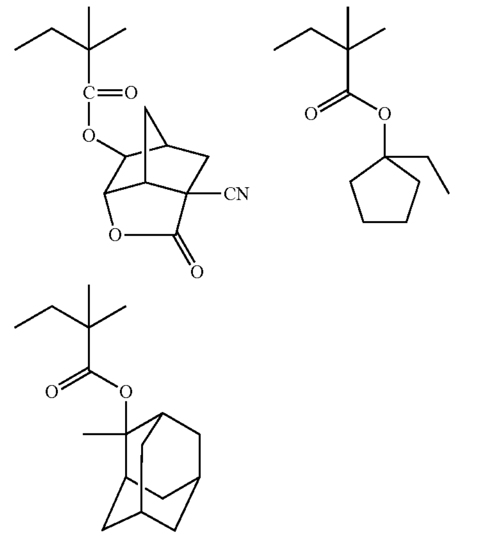
(N)
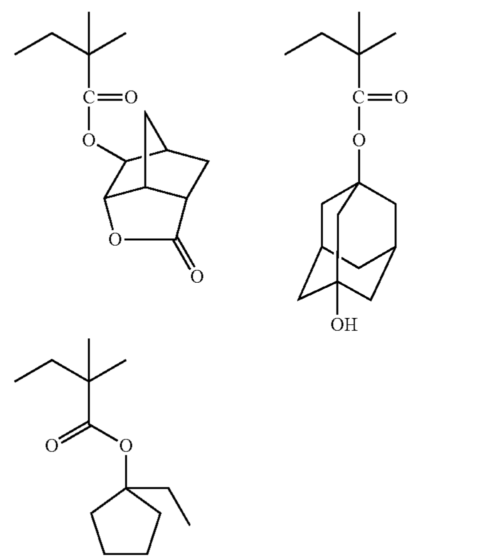
(O)
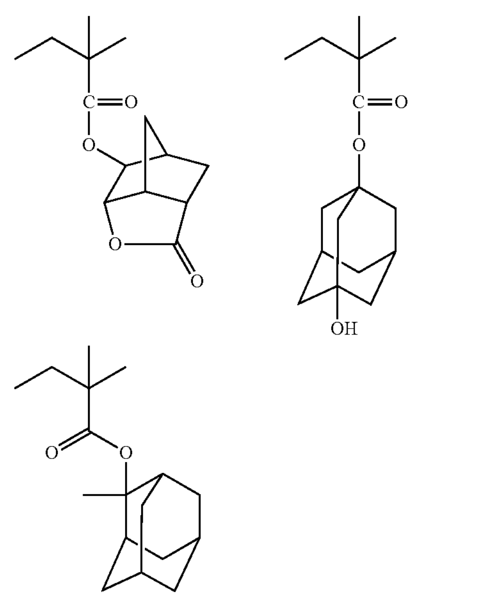

-continued (P)

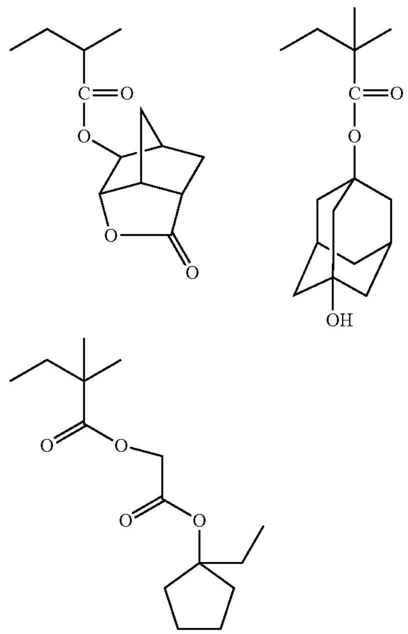

(Q)

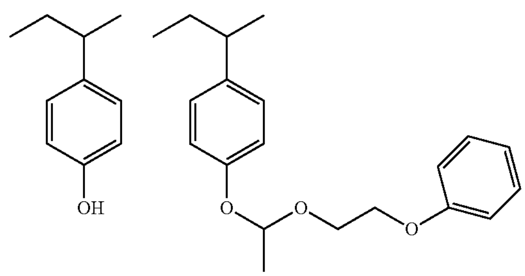

-continued (R)

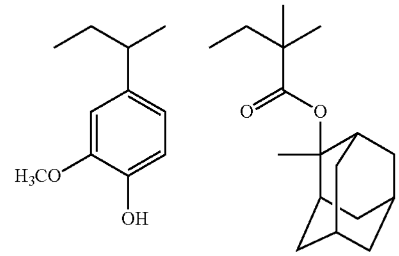

The compositional ratio (molar ratio, corresponding to repeating units from the left), weight average molecular weight and dispersity of each of Resins (E) to (R) are shown in Table 1 below.

TABLE 1

| Resin | Compositional Ratio | Weight Average Molecular Weight | Dispersity |
|---|---|---|---|
| E | 50:40:10 | 10,000 | 1.52 |
| F | 30:20:50 | 12,500 | 1.61 |
| G | 40:10:50 | 14,300 | 1.75 |
| H | 40:15:35:10 | 11,100 | 1.64 |
| I | 60:30:10 | 9,200 | 1.58 |
| J | 30:50:20 | 7.600 | 1.44 |
| K | 40:10:40:10 | 8,300 | 1.82 |
| L | 40:15:35:5:5 | 7,200 | 1.77 |
| M | 60:20:20 | 6,000 | 1.71 |
| N | 40:15:45 | 5,000 | 1.69 |
| O | 30:30:40 | 18,000 | 2.23 |
| P | 40:5:55 | 9,000 | 1.7 |
| Q | 50:50 | 8,000 | 1.22 |
| R | 50:50 | 5,500 | 1.41 |

Positive Resist Compositions (E) to (R):

Positive Resist Compositions (E) to (R) were prepared by filtering respective solutions according to the formulation shown in Table 2 below through a 0.1 μm polyethylene filter.

TABLE 2

| Positive Resist Composition | Resin (1.83 g) | Acid Generator | Amount Added | Basic Compound | Amount Added | Solvent | Ratio by Mass | Concentration of Solid Contents | Surfactant | Amount Added |
|---|---|---|---|---|---|---|---|---|---|---|
| E | E | PAG-1 | 130 mg | N,N-dibutylaniline | 10.5 mg | PGMEA/PGME | 60/40 | 3.0 wt % | W-1 | 1.7 mg |
| F | F | z61/ PAG-2 | 70.0 mg/ 52.0 mg | diazabicyclo-[4.3.0]nonene | 4.3 mg | PGMEA/PGME | 60/40 | 4.3 wt % | W-2 | 3.4 mg |
| G | G | z2 | 80 mg | tris(methoxy-ethoxy)ethylamine | 6.3 mg | PGMEA/cyclo-hexanone | 40/60 | 4.0 wt % | W-3 | 5.1 mg |
| H | H | z63 | 52.1 mg | E-1 | 13.5 mg | PGMEA/PGME | 60/40 | 8.0 wt % | W-4 | 0.8 mg |
| I | I | PAG-3/ z2 | 32.5 mg/ 41.2 mg | triethanolamine | 3.5 mg | PGMEA/PGME | 80/20 | 6.2 wt % | W-4 | 0.07 mg |
| J | J | z20/ PAG-4 | 31.5 mg/ 51.3 mg | N-phenyldi-ethanolamine/N,N-dibutylaniline | 4.2 mg/ 4.2 mg | PGMEA/PGME | 20/80 | 5.5 wt % | W-1 | 17 mg |
| K | K | PAG-5 | 65.0 mg | N-cyanoethylaniline | 5.5 mg | PGME | — | 5.2 wt % | W-2 | 1.7 mg |
| L | L | z8/z42 | 89.5 mg/ 11 mg | 4-dimethyl-aminopyridine | 6.3 mg | γ-butyrolactone | — | 6.6 wt % | W-3 | 1.7 mg |
| M | M | PAG-6 | 118.2 mg | N-(2-cyanoethyl)-N-ethylaniline | 10.1 mg | cyclohexanone | — | 5.8 wt % | W-4 | 8.2 mg |
| N | N | PAG-7/ z2 | 50.3 mg/ 30.3 mg | 2-phenylbenz-imidazole | 8.3 mg | PGMEA/cyclo-hexanone | 80/20 | 5.8 wt % | W-4 | 1.2 mg |
| O | O | PAG-8 | 130 mg | dicyclohexyl-methylamine/2,6-diisopropylaniline | 2.1 mg/ 6.5 mg | ethyl lactate | — | 5.8 wt % | W-4 | 3.2 mg |
| P | P | PAG-9 | 100.2 mg | tetrabutylammonium hydroxide | 12.0 mg | PGMEA/ propylene carbonate | 95/5 | 5.8 wt % | W-4 | 0.8 mg |

TABLE 2-continued

| Positive Resist Composition | Resin (1.83 g) | Acid Generator | Amount Added | Basic Compound | Amount Added | Solvent | Ratio by Mass | Concentration of Solid Contents | Surfactant | Amount Added |
|---|---|---|---|---|---|---|---|---|---|---|
| Q | Q | PAG-10 | 145 mg | 2,6-diisopropylaniline | 6.1 mg | PGMEA/PGME | 60/40 | 3.7 wt % | W-4 | 1.2 mg |
| R | R | z7 | 300 mg | trioctylamine | 11.5 mg | PGMEA/PGME | 80/20 | 2.5 wt % | W-1 | 1.2 mg |

Abbreviations in the Table indicate the followings.

[Acid Generator]

PAG-1

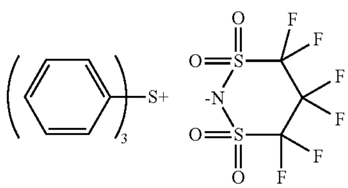

PAG-2

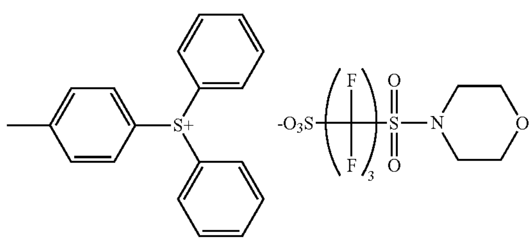

PAG-3

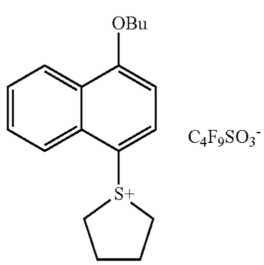

PAG-4

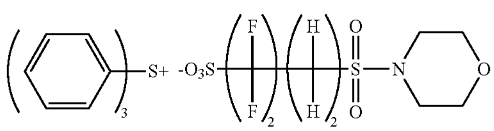

PAG-5

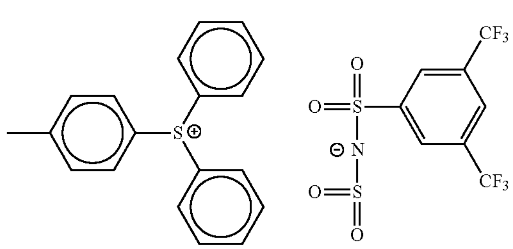

-continued

PAG-6

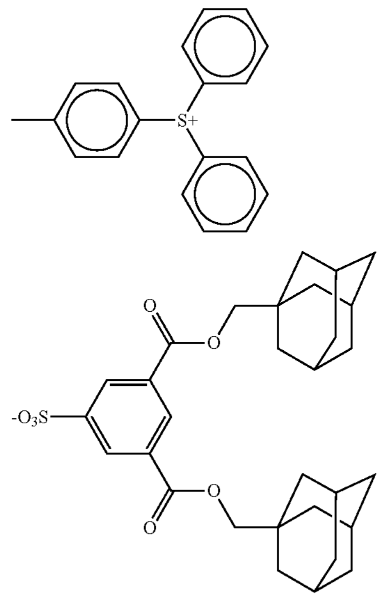

PAG-7

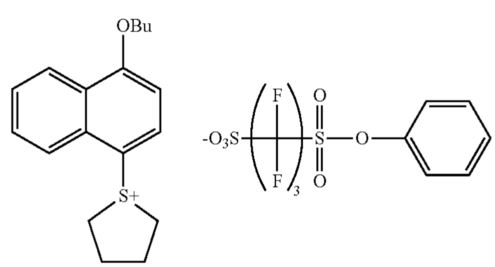

PAG-8

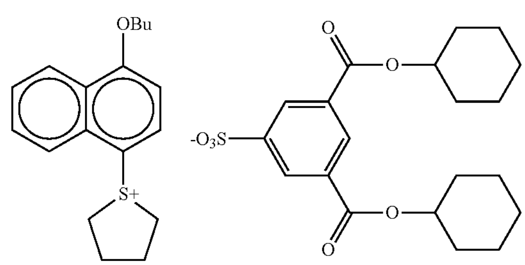

PAG-9

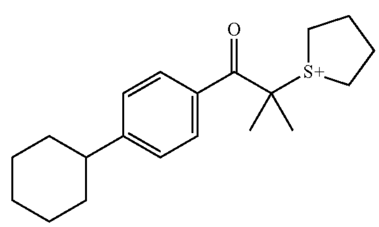

-continued

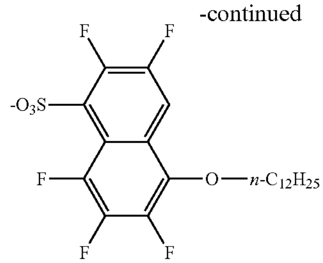

PAG-10

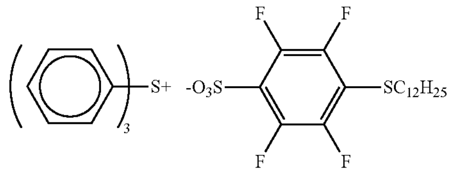

E-1

[Basic Compound]

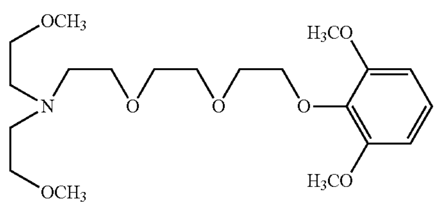

[Solvent]

PGMEA: propylene glycol monomethyl ether acetate

PGME: propylene glycol monomethyl ether

[Surfactant]

W-1: Megafac F-176 (produced by Dainippon Ink & Chemicals, Inc.) (fluorine-containing surfactant)

W-2: Megafac R08 (produced by Dainippon Ink & Chemicals, Inc.) (fluorine- and silicon-containing surfactant)

W-3: Polysiloxane Polymer KP-341 (produced by Shin-Etsu Chemical Co., Ltd.) (silicon-containing surfactant)

W-4: PF6320 (produced by OMNOVA) (fluorine-containing surfactant)

Example 13

An organic antireflection film, ARC29A (produced by Nissan Chemical Industries, Ltd.), was coated on a silicon wafer and baked at 205° C. for 60 seconds to foil a 78-nm antireflection film, and Positive Resist Composition (E) prepared was coated thereon by a spin coater and baked at 90° C. for 80 seconds to form a 80-nm resist film. The obtained wafer was subjected to exposure at 18 [mJ/cm$^2$] through a mask for pattern formation by using PAS5500/1250i equipped with a lens of NA=0.85, produced by ASML, as an ArF excimer laser scanner. Thereafter, the resist film was heated at 120° C. for 60 seconds, developed with butyl acetate (negative developer) for 30 seconds (negative development), and rinsed with 1-hexanol for 30 seconds to obtain a pattern having a pitch of 320 nm and a line width of 240 nm. Furthermore, the resist film was developed with an aqueous tetramethylammonium hydroxide solution (0.05 mass %) (positive developer) for 30 seconds (positive development) and then rinsed with pure water for 30 seconds, whereby a resist pattern (1:1) of 80 nm was obtained.

Example 14

An organic antireflection film, ARC29A (produced by Nissan Chemical Industries, Ltd.), was coated on a silicon wafer and baked at 205° C. for 60 seconds to form a 78-nm antireflection film, and Positive Resist Composition (F) prepared was coated thereon by a spin coater and baked at 120° C. for 60 seconds to form a 120-nm resist film. The obtained wafer was subjected to pattern exposure at 25 [mJ/cm$^2$] through a mask for pattern formation by using an ArF excimer laser scanner (NA: 0.75). Thereafter, the resist film was heated at 120° C. for 60 seconds, developed with methyl isobutyl ketone (negative developer) for 30 seconds (negative development), and rinsed with 2-heptanol for 30 seconds to obtain a pattern having a pitch of 200 nm and a line width of 120 nm.

Example 15

An organic antireflection film, ARC29A (produced by Nissan Chemical Industries, Ltd.), was coated on a silicon wafer and baked at 205° C. for 60 seconds to form a 78-nm antireflection film, and Positive Resist Composition (0) prepared was coated thereon by a spin coater and baked at 110° C. for 60 seconds to form a 100-nm resist film. The obtained wafer was subjected to pattern exposure at 25 [mJ/cm$^2$] through a mask for pattern formation by using an ArF excimer laser scanner (NA: 0.75). Thereafter, the resist film was heated at 100° C. for 80 seconds, developed with ethyl lactate (negative developer) for 30 seconds (negative development), and rinsed with 2-heptanol for 60 seconds to obtain a pattern having a pitch of 200 nm and a line width of 120 nm.

Example 16

An organic antireflection film, ARC29A (produced by Nissan Chemical Industries, Ltd.), was coated on a silicon wafer and baked at 205° C. for 60 seconds to form a 78-nm antireflection film, and Positive Resist Composition (H) prepared was coated thereon by a spin coater and baked at 105° C. for 60 seconds to form a 220-nm resist film. The obtained wafer was subjected to pattern exposure at 25 [mJ/cm$^2$] through a mask for pattern formation by using an ArF excimer laser scanner (NA: 0.75). Thereafter, the resist film was heated at 90° C. for 60 seconds, developed with a 1:1 (by mass) solution of butyl acetate/2-hexanone (negative developer) for 30 seconds (negative development), and rinsed with decane for 30 seconds to obtain a pattern having a pitch of 200 nm and a line width of 100 nm.

Example 17

An organic antireflection film, ARC29A (produced by Nissan Chemical Industries, Ltd.), was coated on a silicon wafer and baked at 205° C. for 60 seconds to form a 78-nm antireflection film, and Positive Resist Composition (I) prepared was coated thereon by a spin coater and baked at 95° C. for 60 seconds to form a 150-nm resist film. The obtained wafer was subjected to pattern exposure at 25 [mJ/cm$^2$] through a mask for pattern formation by using an ArF excimer laser scanner (NA: 0.75). Thereafter, the resist film was heated at 110° C. for 60 seconds, developed with a 7:3 (by mass) solution of butyl acetate/dihexyl ether (negative developer) for 30 seconds (negative development), and rinsed with 1-hexanol for 30 seconds to obtain a pattern having a pitch of 240 nm and a line width of 100 nm.

Example 18

An organic antireflection film, ARC29A (produced by Nissan Chemical Industries, Ltd.), was coated on a silicon wafer and baked at 205° C. for 60 seconds to form a 78-nm antireflection film, and Positive Resist Composition (J) prepared was coated thereon by a spin coater and baked at 100° C. for 60 seconds to form a 150-nm resist film. The obtained wafer was subjected to pattern exposure at 25 [mJ/cm$^2$] through a mask for pattern formation by using an ArF excimer laser scanner (NA: 0.75). Thereafter, the resist film was heated at 105° C. for 60 seconds, developed with methyl ethyl ketone (negative developer) for 30 seconds (negative development), and rinsed with 1-hexanol for 30 seconds to obtain a pattern having a pitch of 260 nm and a line width of 130 nm.

Example 19

An organic antireflection film, ARC29A (produced by Nissan Chemical Industries, Ltd.), was coated on a silicon wafer and baked at 205° C. for 60 seconds to form a 78-nm antireflection film, and Positive Resist Composition (K) prepared was coated thereon by a spin coater and baked at 100° C. for 60 seconds to form a 150-nm resist film. The obtained wafer was subjected to pattern exposure at 25 [mJ/cm$^2$] through a mask for pattern formation by using an ArF excimer laser scanner (NA: 0.75). Thereafter, the resist film was heated at 120° C. for 60 seconds, developed with ethyl-3-ethoxypropionate (negative developer) for 30 seconds (negative development), and rinsed with 1-hexanol for 30 seconds to obtain a pattern having a pitch of 240 nm and a line width of 120 nm.

Example 20

An organic antireflection film, ARC29A (produced by Nissan Chemical Industries, Ltd.), was coated on a silicon wafer and baked at 205° C. for 60 seconds to form a 78-nm antireflection film, and Positive Resist Composition (L) prepared was coated thereon by a spin coater and baked at 100° C. for 60 seconds to form a 150-nm resist film. The obtained wafer was subjected to pattern exposure at 17 [mJ/cm$^2$] through a mask for pattern formation by using an ArF excimer laser scanner (NA: 0.75). Thereafter, the resist film was heated at 120° C. for 60 seconds, developed with a 95:5 (by mass) solution of isoamyl acetate/decane (negative developer) for 60 seconds (negative development), and rinsed with 1-hexanol for 15 seconds to obtain a pattern having a pitch of 400 nm and a line width of 300 nm. Furthermore, the resist film was subjected to second exposure at 3 [mJ/cm$^2$] without intervention of a mask for pattern formation, developed with an aqueous tetramethylammonium hydroxide solution (0.238 mass %) (positive developer) for 20 seconds (positive development), and rinsed with pure water for 30 seconds to obtain a resist pattern (1:1) of 100 nm.

Example 21

An organic antireflection film, ARC29A (produced by Nissan Chemical Industries, Ltd.), was coated on a silicon wafer and baked at 205° C. for 60 seconds to form a 78-nm antireflection film, and Positive Resist Composition (M) prepared was coated thereon by a spin coater and baked at 130° C. for 60 seconds to form a 150-nm resist film. The obtained wafer was subjected to pattern exposure at 25 [mJ/cm$^2$] through a mask for pattern formation by using an ArF excimer laser scanner (NA: 0.75). Thereafter, the resist film was heated at 100° C. for 60 seconds, developed with a 3:2 (by mass) solution of cyclohexanone/1-hexanol (negative developer) for 15 seconds (negative development), and rinsed with a 1:1 (by mass) solution of 2-heptanol/decane for 40 seconds to obtain a pattern having a pitch of 240 nm and a line width of 120 nm.

Example 22

An organic antireflection film, ARC29A (produced by Nissan Chemical Industries, Ltd.), was coated on a silicon wafer and baked at 205° C. for 60 seconds to form a 78-nm antireflection film, and Positive Resist Composition (N) prepared was coated thereon by a spin coater and baked at 105° C. for 60 seconds to form a 150-nm resist film. The obtained wafer was subjected to pattern exposure at 25 [mJ/cm$^2$] through a mask for pattern formation by using an ArF excimer laser scanner (NA: 0.75). Thereafter, the resist film was heated at 90° C. for 60 seconds, developed with a 1:3 (by mass) solution of diethylene glycol monoethyl ether acetate/methyl isobutyl ketone (negative developer) for 10 seconds (negative development), and rinsed with a 1:1 (by mass) solution of 1-hexanol/2-heptanol for 60 seconds to obtain a pattern having a pitch of 240 nm and a line width of 120 nm.

Example 23

An organic antireflection film, ARC29A (produced by Nissan Chemical Industries, Ltd.), was coated on a silicon wafer and baked at 205° C. for 60 seconds to form a 78-nm antireflection film, and Positive Resist Composition (O) prepared was coated thereon by a spin coater and baked at 120° C. for 60 seconds to form a 150-nm resist film. The obtained wafer was subjected to pattern exposure at 25 [mJ/cm$^2$] through a mask for pattern formation by using an ArF excimer laser scanner (NA: 0.75). Thereafter, the resist film was heated at 110° C. for 60 seconds, developed with a 95:5 (by mass) solution of amyl acetate/isopropanol (negative developer) for 30 seconds (negative development), and rinsed with 1-hexanol for 30 seconds to obtain a pattern having a pitch of 200 nm and a line width of 100 nm.

Example 24

An organic antireflection film, ARC29A (produced by Nissan Chemical Industries, Ltd.), was coated on a silicon wafer and baked at 205° C. for 60 seconds to form a 78-nm antireflection film, and Positive Resist Composition (P) prepared was coated thereon by a spin coater and baked at 90° C. for 60 seconds to form a 150-nm resist film. The obtained wafer was subjected to pattern exposure at 17 [mJ/cm$^2$] through a mask for pattern formation by using an ArF excimer laser scanner (NA: 0.75). Thereafter, the resist film was heated at 120° C. for 60 seconds, developed with an aqueous tetramethylammonium hydroxide solution (0.238 mass %) (positive developer) for 30 seconds (positive development), and rinsed with pure water for 30 seconds to obtain a pattern having a pitch of 480 nm and a line width of 360 nm. Furthermore, the resist film was subjected to second exposure at 3 [mJ/cm$^2$] without intervention of a mask for pattern formation, developed with butyl acetate (negative developer) for 30 seconds (negative development), rinsed with 1-hexanol for 20 seconds, and then heated at 90° C. for 90 seconds to obtain a resist pattern (1:1) of 120 nm.

The dimensions of patterns formed in Examples 1 to 24 are shown in Table 3 below. A smaller value indicates higher performance.

After pattern formation, the top surface of line pattern and the space portion were observed using a length-measuring scanning electron microscope (S9380II, manufactured by Hitachi, Ltd.), and the pattern was rated A when the resist residue was not observed at all, rated B when scarcely observed, and rated C when slightly observed. The results are shown in Table 3.

The resist pattern profile was observed by a scanning electron microscope and rated B when the resist pattern at each resolved line width was partially lost or chipped from the middle or top of the pattern, and rated A when chipping was not observed. The results are shown in Table 3.

TABLE 3

| Example | Pattern | Residue | Chipping |
|---|---|---|---|
| 1 | 100 nm L/S | A | B |
| 2 | 250 nm L/S | B | B |
| 3 | 150 nm L/S | B | B |
| 4 | 150 nm L/S | B | A |
| 5 | 230 nm L/S | A | B |
| 6 | 220 nm L/S | A | B |
| 7 | 140 nm L/S | A | B |
| 8 | 140 nm L/S | A | A |
| 9 | 250 nm L/S | B | A |
| 10 | 300 nm L/S | B | B |
| 11 | 320 nm L/S | C | B |
| 12 | 90 nm L/S | A | B |
| 13 | 80 nm L/S | A | A |
| 14 | 120 nm L/S | B | B |
| 15 | 120 nm L/S | A | B |
| 16 | 100 nm L/S | A | B |
| 17 | 100 nm L/S | A | B |
| 18 | 130 nm L/S | B | B |
| 19 | 120 nm L/S | A | B |
| 20 | 100 nm L/S | A | B |
| 21 | 120 nm L/S | B | B |
| 22 | 120 nm L/S | B | B |
| 23 | 100 nm L/S | A | B |
| 24 | 120 nm L/S | A | B |

As apparent from these Examples, by virtue of the combination of negative development and positive resist composition of the present invention or the combination of positive development, negative development and positive resist composition of the present invention, a good pattern resolution performance is obtained and the problem of resist residue is overcome. Particularly, it is seen that when a resin having a monocyclic or polycyclic alicyclic hydrocarbon structure is used as the positive resist composition, a higher pattern resolution performance is obtained and the generation of residue is more suppressed.

Furthermore, it is revealed that when development is performed twice and the order of two development operations is such that negative development is performed first and positive development is next performed, chipping of the resist pattern can be suppressed.

Example 25

On a silicon wafer treated with hexamethyldisilazane, Positive Resist Composition (Q) was coated by a spin coater and baked at 90° C. for 60 seconds to form a 100-nm resist film. The obtained wafer was subjected to surface exposure using EUV light (wavelength: 13.5 nm) by changing the exposure dose in steps of 0.5 mJ in the range from 0 to 10.0 mJ and then heated at 120° C. for 60 seconds. Thereafter, the dissolution rate at each exposure dose was measured using butyl acetate (negative developer) to obtain a sensitivity curve. The exposure dose when the dissolution rate of the resist was saturated in this sensitivity curve was taken as the sensitivity and also, the dissolution contrast (γ value) was calculated from the gradient in the straight line part of the sensitivity curve. As the γ value is larger, the dissolution contrast is more excellent. The results obtained are shown in Table 4 below.

Example 26

On a silicon wafer treated with hexamethyldisilazane, Positive Resist Composition (R) was coated by a spin coater and baked at 1.00° C. for 60 seconds to form a 50-nm resist film. The obtained wafer was subjected to surface exposure using EUV light (wavelength: 13.5 nm) by changing the exposure dose in steps of 0.5 mJ in the range from 0 to 10.0 mJ and then heated at 100° C. for 60 seconds. Thereafter, the dissolution rate at each exposure dose was measured using butyl acetate (negative developer) to obtain a sensitivity curve. The exposure dose when the dissolution rate of the resist was saturated in this sensitivity curve was taken as the sensitivity and also, the dissolution contrast (γ value) was calculated from the gradient in the straight line part of the sensitivity curve. As the γ value is larger, the dissolution contrast is more excellent. The results obtained are shown in Table 4 below.

TABLE 4

| Example | Sensitivity | γ value |
|---|---|---|
| 25 | 5.4 mJ/cm$^2$ | 7.1 |
| 26 | 2.5 mJ/cm$^2$ | 10.3 |

As apparent from the results in Table 4, by virtue of the combination of negative development and positive resist composition of the present invention, good dissolution contrast and high sensitivity are obtained even in the characteristic evaluation by the irradiation with EUV light.

According to the present invention, a method of stably forming a high-precision fine pattern, a positive resist composition for multiple development used in the method, a developer for negative development used in the method, and a rinsing solution for negative development used in the method can be provided.

The entire disclosure of each and every foreign patent application from which the benefit of foreign priority has been claimed in the present application is incorporated herein by reference, as if fully set forth.

What is claimed is:

1. A pattern forming method, comprising:

coating a substrate with a resist composition capable of forming a resist film of which solubility in a positive developer which is an alkali developer increases and solubility in a negative developer containing an organic solvent decreases upon irradiation with actinic rays and or radiation, so as to form a resist film; and developing the resist film exposed with the negative developer containing an organic solvent, wherein the organic solvent in the negative developer contains a ketone-based solvent, the pattern forming method only includes negative development for developing the resist film exposed, and the resist composition contains a resin having an aromatic group.

2. The pattern forming method according to claim 1, further comprising:

exposing the resist film with an EUV light.

3. The pattern forming method according to claim 1, further comprising:

washing the resist film with a rinsing solution containing at least one selected from the group consisting of a hydrocarbon-based solvent, a ketone-based solvent, an ester-based solvent, an alcohol-based solvent and an amide-based solvent.

4. The pattern forming method according to claim 3, wherein the rinsing solution contains at least one selected from the group consisting of an aliphatic hydrocarbon-based solvent, a ketone-based solvent, an ester-based solvent, an alcohol-based solvent and an amide-based solvent.

5. The pattern forming method according to claim 1, wherein the organic solvent in the negative developer further contains one selected from the group consisting of a hydrocarbon-based solvent, an ester-based solvent, an alcohol-based solvent and an amide-based solvent.

6. The pattern forming method according to claim 1, wherein the organic solvent in the negative developer further contains an ester-based solvent.

7. The pattern forming method according to claim 1, wherein the ketone-based solvent contained in the negative developer is a cyclic ketone-based solvent.

8. A method of forming an electronic device, comprising the pattern forming method according to claim 1.

* * * * *